(12) United States Patent
Sexton et al.

(10) Patent No.: US 8,693,597 B2
(45) Date of Patent: Apr. 8, 2014

(54) SENSOR-BASED WIRELESS COMMUNICATION SYSTEMS USING COMPRESSIVE SAMPLING

(75) Inventors: Thomas Aloysius Sexton, Fort Worth, TX (US); Christopher Andrew DeVries, Ontario (CA)

(73) Assignee: BlackBerry Limited, Ontario ( * ) Notice: Subject to any disclaimer, the term of this patent is extended or adjusted under 35 U.S.C. 154(b) by 294 days.

(21) Appl. No.: 12/846,441

(22) Filed: Jul. 29, 2010

(65) Prior Publication Data

US 2010/0310011 A1 Dec. 9, 2010

Related U.S. Application Data

(63) Continuation-in-part of application No. 12/760,892, filed on Apr. 15, 2010, and a continuation-in-part of application No. 12/635,526, filed on Dec. 10, 2009.

(60) Provisional application No. 61/230,309, filed on Jul. 31, 2009, provisional application No. 61/169,596, filed on Apr. 15, 2009, provisional application No. 61/121,992, filed on Dec. 12, 2008.

(51) Int. Cl.
*H04L 25/08* (2006.01)

(52) U.S. Cl.
USPC ........... 375/346; 455/296; 370/343; 370/345; 370/464

(58) Field of Classification Search
USPC ................. 370/344–347, 464, 465, 468, 469; 375/316, 317, 346, 347, 350; 455/296
See application file for complete search history.

(56) References Cited

U.S. PATENT DOCUMENTS

| 8,379,485 B2 | 2/2013 | Cevher |
| 2002/0037060 A1 | 3/2002 | Kishi |
| 2004/0017225 A1* | 1/2004 | Draxelmayr ............... 327/94 |

(Continued)

FOREIGN PATENT DOCUMENTS

| JP | 2002076975 A | 3/2002 |
| WO | 2007050680 A2 | 5/2007 |

(Continued)

OTHER PUBLICATIONS

J.L. Paredes et al., Ultra-Wideband Compressed Sensing: Channel Estimation, IEEE Journal of Selected Topics in Signal Processing, vol. 1, No. 3, Oct. 2007.

(Continued)

*Primary Examiner* — Kerri Rose
(74) *Attorney, Agent, or Firm* — Cantor Colburn LLP

(57) ABSTRACT

Methods, devices and systems for sensor-based wireless communication systems using compressive sampling are provided. In one embodiment, the method for sampling signals comprises receiving, over a wireless channel, a user equipment transmission based on an S-sparse combination of a set of vectors; down converting and discretizing the received transmission to create a discretized signal; correlating the discretized signal with a set of sense waveforms to create a set of samples, wherein a total number of samples in the set is equal to a total number of sense waveforms in the set, wherein the set of sense waveforms does not match the set of vectors, and wherein the total number of sense waveforms in the set of sense waveforms is fewer than a total number of vectors in the set of vectors; and transmitting at least one sample of the set of samples to a remote central processor.

18 Claims, 33 Drawing Sheets

(56) References Cited

U.S. PATENT DOCUMENTS

| | | | |
|---|---|---|---|
| 2004/0245175 A1* | 12/2004 | Godec et al. | 210/639 |
| 2005/0153712 A1 | 7/2005 | Osaka et al. | |
| 2007/0066259 A1* | 3/2007 | Ryan et al. | 455/234.1 |
| 2007/0153689 A1* | 7/2007 | Strub et al. | 370/230 |
| 2007/0249388 A1 | 10/2007 | Sorrells et al. | |
| 2008/0129560 A1 | 6/2008 | Baraniuk et al. | |
| 2008/0270055 A1* | 10/2008 | Rozell et al. | 702/71 |
| 2009/0075674 A1 | 3/2009 | Qahwash | |
| 2009/0161635 A1* | 6/2009 | Kanterakis et al. | 370/335 |
| 2009/0213922 A1 | 8/2009 | Dent et al. | |
| 2009/0222226 A1 | 9/2009 | Baraniuk et al. | |
| 2010/0082302 A1 | 4/2010 | Garudadri | |
| 2010/0182950 A1 | 7/2010 | Sexton et al. | |
| 2011/0028160 A1* | 2/2011 | Roeding et al. | 455/456.1 |
| 2012/0170499 A1* | 7/2012 | Narasimhan | 370/311 |

FOREIGN PATENT DOCUMENTS

| | | |
|---|---|---|
| WO | 2009059279 A1 | 5/2009 |
| WO | 2009130199 A1 | 10/2009 |
| WO | WO 2010/068922 A2 | 6/2010 |
| WO | 2010121050 A2 | 10/2010 |

OTHER PUBLICATIONS

Z. Tian et al., Performance Evaluation of Distributed Compressed Wideband Sensing for Cognitive Radio Networks, IEEE 11th International Conference on Information Fusion, Jun. 30, 2008.
S. Pfetsch et al., On the Feasibility of Hardware Implementation of Sub-Nyquist Random-Sampling Based Analog-To-Information Conversion, IEEE International Symposium on Circuits and Systems, May 18, 2008.
ETSI EN 300 940 V6.3.1, Digital Cellular Telecommunications System (Phase 2-+) Mobile Radio Interface Layer 3 Specification (GSM 04.08 Version 6.3.1. Release 1997), Aug. 1, 1999.
International Search Report and Written Opinion for PCT Application No. PCT/US2010/043747, mailed Apr. 11, 2011.
Parry, Richard, The Road to 3G, Apr. 2002.
International Preliminary Report on Patentability for PCT Application No. PCT/US2010/031270, mailed Oct. 27, 2011.
International Search Report for PCT Application No. PCT/US2011/045854, mailed Nov. 4, 2011.
Polo, Y. L., Compressive Wideband Spectrum Sensing for Cognitive Radio Applications, Thesis, Nov. 28, 2008, pp. 1-82.
Laska, J. et al., Random Sampling for Analog-to-Information Conversion of Wideband Signals, 2006 IEEE Dallas/CAS Workshop on Design, Applications, Integration and Software, Oct. 1, 2006, pp. 119-122.
Extended Search Report for EP Application No. 11178539.0, mailed Oct. 27, 2011.
Extended Search Report for EP Application No. 11178540.8, mailed Oct. 28, 2011.
Wikipedia, UM Interface, retrieved from Internet Dec. 6, 2008, URL:http://en.wikipedia.org/w/index.php?title=Um_interface &oldid=256306958, [retrieved on Oct. 17, 2011].
Digital cellular telecommunications system (Phase 2+); Mobile radio interface signalling layer 3; General aspects (GSM 04.07 version 5.3.0), 3GPP Standard; Draft PR ETS 300 939, 3RD Generation Partnership Project (3GPP), Mobile Competence Centre, 650, Route Des Lucioles, F-06921 Sophia-Antipolis Cedex, France, No. Second edition, Jan. 1, 1998, pp. 1-105.
Digital cellular telecommunications system (Phase 2+); Mobile radio interface layer 3 specification (GSM 04.08 version 7.3.0 Release 1998), 3GPP Standard; ETSI EN 300 940, 3RD Generation Partnership Project (3GPP), Mobile Competence Centre, 650, Route Des Lucioles; F-06921 Sophia-Antipolis Cedex, France, No. V7.3.0, Dec. 7, 1999, pp. 1-645.
Extended Search Report for EP Application No. 11178541.6, mailed Oct. 26, 2011.

International Preliminary Report on Patentability for PCT Application No. PCT/US2010/043747, mailed Feb. 9, 2012.
Waheed Bajwa et al.; "Compressive Wireless Sensing;" 5th International Conference on IPSN, 2008; pp. 134-142.
E.J. Candes et al; "Decoding by Linear Programming," IEEE Trans. on Info. Theory, vol. 51, No. 12, Dec. 2005; 22 pages.
E.J. Candes et al; "An Introduction to Compressive Sampling," IEEE Signal Processing Mag., Mar. 2008; pp. 21-30.
C. A. Devries et al.; Subsampling Architecture for Low Power Receivers, IEEE Trans. on Circuits and Systems, vol. 55, No. 4, Apr. 2008; pp. 304-308.
Griffin et al.; "Compressed Sensing of Audio Signals Using Multiple Sensors;" Processings 16th European Signal Processing Conference (Eusipco 2008), Aug. 25-29, 2008, Lausanne, Switerland; 5 pages.
KR102002001476 English Abstract; Publication Date Feb. 25, 2002, Samsung Electronics; 1 page.
Extened European Search Report for EP Application EP06178976.8; Mailed Jan. 25, 2011; 12 pages.
European Patent Office, European Partial Search Report for EP Application EP06178976.8; Mailed Sep. 6, 2010; 8 pages.
International Preliminary Report on Patentablility; International Application No. PCT/US2009/067754; International Filing Date: Dec. 11, 2009; Date of mailing: Jun. 23, 2011; 8 pages.
International Search Report; International Application No. PCT/US2009/067754; International Filing Date: Dec. 11, 2009; Date of mailing: Jul. 26, 2010; 4 pages.
International Search Report; International Application No. PCT/US2010/031270; International Filing Date: Apr. 15, 2010; Date of mailing: Mar. 9, 2011; 2 pages.
International Written Opinion; International Application No. PCT/US2010/031270; International Filing Date Apr. 15, 2010; Date of mailing: Mar. 9, 2011; 6 pages.
International Search Report; International Application No. PCT/US20111043344; International Filing Date: Aug. 7, 2011; Date of mailing: Oct. 21, 2011; 3 pages.
D. Tse et al.; "7.1 Multiplexing Capability of Deterministic MIMO Channels," Fundamentals of Wireless Communication, Cambridge University Press, 2005, p. 293.
Wei Wang et al.; "Distributed Sparse Random Projections for Refinable Approximation;" Information Processing in Sensor Networks, 2007, IPSN 2007, 6th International Symposium on, IEEE, Apr. 1, 2007, pp. 331-339.
David Soldani, et al.; "Wireless Relays for Broadband Access"; IEEE Communications Magazine; pp. 58-66; Mar. 2008.
Candes, Emmanual, J.; "Stable Signal Recovery for Incomplete and Inaccurate Measurements"; Communications on Pure and Applied Mathematics vol. LIX; p. 1207-1223; 2006.
Candes, Emmanuel, J., et al.; "Robust Uncertainty Principles: Exact Signal Reconstruction From Highly Incomplete Frequency Information"; IEEE Transactions on Information Theory; vol. 52, No. 2; p. 489-509; Feb. 2006.
Chen, Scott Shaobing, et al.; "Atomic Decomposition by Basis Pursuit" Siam J. Sci. Comput.; vol. 20, No. 1; p. 33-61; 1998.
Coldrey (Tapio), Mikael, et al.; "Training-Based MIMO Systems-Part I: Performance Comparison"; IEEE Transactions on Signal Processing; vol. 55, No. 11; p. 5464-5476; Nov. 2007.
Donoho, David, L.; "Stable Recovery of Sparse Overcomplete Representations in the Presence of Noise"; IEEE Transactions on Information Theory; vol. 52, No. 1; p. 6-18; Jan. 2006.
Fletcher, A.K., et al.; "A Sparsity Detection Framework for On-Off Random Access Channels"; ISIT 2009; IEEE; p. 169-173; Jun. 28-Jul. 3, 2009.
Hochwald, Bertrand, M.; "Achieving Near-Capacity on a Multiple-Antenna Channel"; IEEE Transactions on Communications; vol. 51, No. 3; p. 389-399; Mar. 2003.
International Search Report and Written Opinion dated Apr. 15, 2011 for PCT Application No. PCT/US2011/020829.
Jantii, Riku, et al.; "Downlink Resource Management in the Frequency Domain for Multicell OFCDM Wireless Networks"; IEEE Transactions on Vehicular Technology; vol. 57, No. 5; p. 3241-3246; Sep. 2008.
Kirolos, Sami, et al.; "Analog-to-Information Conversion via Random Demodulation"; IEEE; p. 1-4; 2006.

(56) References Cited

OTHER PUBLICATIONS

Kschischang, Frank, R.; Codes Defined on Graphs; IEEE Communications Magazine; p. 118-125; Aug. 2003.

Medard, Muriel; "The Effect upon Channel Capacity in Wireles Communications of Perfect and Imperfect Knowledge of the Channel"; IEEE Transactions on Information Theory; vol. 46, No. 3; p. 933-946; May 2000.

Nazer, Bobak, et al.; "Compute-and-Forward: A Novel Strategy for Cooperative Networks"; IEEE; p. 69-73; 2008.

Romero-Jerez, Juan M.; "Receive Antenna Array Strategies in Fading and Interference: An Outage Probability Comparison"; IEEE Transactions on Wireless Communications; vol. 7, No. 3; p. 920-932; Mar. 2008.

Sampei, Seiichi, et al.; "System Design Issues and Performance Evaluations for Adaptive Modulation in New Wireless Access Systems"; Proceedings of the IEEE; vol. 95, No. 12; p. 2456-2471; Dec. 2007.

Serrador, Antonio, et al.; "Impact of MIMO Systems on CRRM in Heterogeneous Networks"; WCNC; p. 2864-2868; 2008.

Sethuraman, B. A., et al.; "Full-Diversity, High-Rate Space-Time Block Codes from Division Algebras"; IEEE Transactions on Information Theory; vol. 49, No. 10; p. 2596-2616; Oct. 2003.

Sexton, Thomas, A.; "Remote Sampler—Central Brain Architecture"; IEEE; p. 601-604; 2010.

Taubock, Georg, et al.; "A Compressed Sensing Technique for OFDM Channel Estimation in Mobile Environments: Exploiting Channel Sparsity for Reducing Pilots"; ICASSP; p. 2885-2888; 2008.

Emre Teletar; "Capacity of Multi-Antenna Gaussian Channels"; retrieved on Mar. 5, 2013 from http://mars.bell-labs.com/papers/proof; p. 1-28; Oct. 1995.

Wang, I-Hsiang, et al.; "Gaussian Interference Channels with Multiple Receive Antennas: Capacity and Generalized Degrees of Freedom"; Forty-Sixth Annual Allerton Conference; p. 715-722; Sep. 23-26, 2008.

Winters, Jack, H.; "Smart Antenna Techniques and Their Application To Wireless Ad Hoc Networks"; IEEE Wireless Communications; p. 77-83; Aug. 2006.

Zheng, Lizhong, et al.; "Communication on the Grassman Manifold: a Geometric Approach to the Noncoherent Multiple-Antenna Channel"; IEEE Transactions on Information Theory; vol. 48, No. 2; p. 359-383; Feb. 2002.

Chinese Office Action dated Jun. 28, 2013 for Application No. 200980156657.4.

Canadian Office Action mailed Sep. 12, 2013 for application CA2746661, 3 pages.

Chinese Office Action mailed Jun. 28, 2013 for application CN20098056657.4, 6 pages.

Gallager, Robert, G.; "Information Theory and Reliable Communication," John Wiley &Sons, Inc.; 1968; pp. 1-588.

Thomas M. Cover and Joy A. Thomas, "Elements of Information Theory", John Wiley & Sons Inc., 2006, pp. 1-425.

Claude Oestges and Bruno Clerckx, "MIMO Wireless Communications—From Real—World Propagation to Space—Time Code Design", Academic Press—Elsevier Ltd., 2007, pp. 1-448.

\* cited by examiner

| Nature | $\Psi_{ij}$ | $\Phi_{ij}$ |
|---|---|---|
| Random | iid Gaussian | iid Gaussian |
| Deteministic | 1 if i=j, else 0 | $\cos(\frac{\pi ij}{N})$ |

Matrix Nature = Deterministic
M=5
N=10

Transpose of M columns of Phi Matrix

2001:
```
0.32  0.32  0.32  0.32  0.32  0.32  0.32  0.32  0.32  0.32
0.45  0.43  0.36  0.26  0.14  0.00 -0.14 -0.26 -0.36 -0.43
0.45  0.36  0.14 -0.14 -0.36 -0.45 -0.36 -0.14  0.14  0.36
0.45  0.26 -0.14 -0.43 -0.36  0.00  0.36  0.43  0.14 -0.26
0.45  0.14 -0.36 -0.36  0.14  0.45  0.14 -0.36 -0.36  0.14
```

Sai Matrix

2002:
```
1.00  0.00  0.00  0.00  0.00  0.00  0.00  0.00  0.00  0.00
0.00  1.00  0.00  0.00  0.00  0.00  0.00  0.00  0.00  0.00
0.00  0.00  1.00  0.00  0.00  0.00  0.00  0.00  0.00  0.00
0.00  0.00  0.00  1.00  0.00  0.00  0.00  0.00  0.00  0.00
0.00  0.00  0.00  0.00  1.00  0.00  0.00  0.00  0.00  0.00
0.00  0.00  0.00  0.00  0.00  1.00  0.00  0.00  0.00  0.00
0.00  0.00  0.00  0.00  0.00  0.00  1.00  0.00  0.00  0.00
0.00  0.00  0.00  0.00  0.00  0.00  0.00  1.00  0.00  0.00
0.00  0.00  0.00  0.00  0.00  0.00  0.00  0.00  1.00  0.00
0.00  0.00  0.00  0.00  0.00  0.00  0.00  0.00  0.00  1.00
```

Phi column Correlations

2003:
```
 1.0000  0.1414  0.0000  0.1414 -0.0000
 0.1414  1.0000  0.2000 -0.0000  0.2000
 0.0000  0.2000  1.0000  0.2000 -0.0000
 0.1414 -0.0000  0.2000  1.0000  0.2000
-0.0000  0.2000 -0.0000  0.2000  1.0000
```

Sai column Correlation

Matrix Nature = Random
M=5
N=10

Transpose of M columns of Phi Matrix

2101:
```
-0.20  -0.25   0.17   0.12   0.80  -0.20   0.03   0.16  -0.32
-0.94  -0.04   0.01  -0.02   0.09   0.16   0.03  -0.16   0.24
 0.09   0.02  -0.01   0.28   0.57  -0.05   0.34  -0.19   0.08
-0.33  -0.04  -0.04  -0.23   0.49   0.67   0.24   0.11  -0.18
-0.01  -0.20   0.10  -0.00  -0.03   0.14   0.35   0.09   0.84
```

Sai Matrix

2102:
```
-0.11  -0.00  -0.20  -0.20   0.71  -0.17   0.00   0.08  -0.28
-0.44   0.19   0.04  -0.04  -0.04   0.54   0.15   0.10   0.00
-0.53   0.95   0.28   0.00  -0.00   0.04   0.05   0.03  -0.16
-0.21  -0.00   0.15   0.18  -0.22   0.09  -0.18   0.43   0.54
-0.15   0.02   0.11   0.15   0.08  -0.00   0.13  -0.70  -0.01
 0.00  -0.17  -0.06  -0.59   0.58  -0.09  -0.32   0.04  -0.08
 0.14   0.11   0.14   0.54   0.13  -0.25   0.80   0.18   0.23
-0.44   0.05   0.01   0.11   0.01  -0.68   0.35   0.01   0.35
-0.06  -0.05   0.57   0.19   0.01  -0.11   0.12  -0.04  -0.53
 0.49  -0.13   0.70  -0.30   0.29  -0.36  -0.03  -0.52  -0.38
```

Phi column Correlations

2103:
```
 1.0000   0.1436   0.5608   0.4235  -0.1739
 0.1436   1.0000   0.0103   0.4069   0.2312
 0.5608   0.0103   1.0000   0.3368   0.3285
 0.4235   0.4069   0.3368   1.0000   0.0909
-0.1739   0.2312   0.3285   0.0909   1.0000
```

Sai column Correlation

SENSOR-BASED WIRELESS COMMUNICATION SYSTEMS USING COMPRESSIVE SAMPLING

CROSS-REFERENCE TO RELATED APPLICATIONS

This application claims the benefit of U.S. Provisional Application No. 61/230,309, filed Jul. 31, 2009, entitled "REMOTE SAMPLER ANALOG FRONT END," and is a Continuation in Part of U.S. patent application Ser. No. 12/760,892, filed Apr. 15, 2010, entitled "SENSOR-BASED WIRELESS COMMUNICATION SYSTEMS USING COMPRESSIVE SAMPLING," which claims the benefit of U.S. Provisional Application No. 61/169,596, filed Apr. 15, 2009, entitled "REMOTE SAMPLER—CENTRAL BRAIN ARCHITECTURE," and also is a Continuation in Part of U.S. patent application Ser. No. 12/635,526, filed Dec. 10, 2009, entitled "SENSOR-BASED WIRELESS COMMUNICATION SYSTEMS USING COMPRESSIVE SAMPLING," which claims the benefit of U.S. Provisional Application No. 61/121,992, filed Dec. 12, 2008, entitled "LOW POWER ARCHITECTURE AND REMOTE SAMPLER. INVENTIONS." The foregoing applications are incorporated herein by reference in their entirety.

FIELD

This disclosure generally relates to wireless communication systems and more particularly to methods, devices and systems for using compressive sampling in a sensor-based wireless communication system.

BACKGROUND

Wireless communications systems are widely deployed to provide, for example, a broad range of voice and data-related services. Typical wireless communications systems consist of multiple-access communication networks that allow users to share common network resources. Examples of these networks are time division multiple access ("TDMA") systems, code division multiple access ("CDMA") systems, single carrier frequency division multiple access ("SC-FDMA") systems, orthogonal frequency division multiple access ("OFDMA") systems, or other like systems. An OFDMA system is supported by various technology standards such as evolved universal terrestrial radio access ("E-UTRA"), Wi-Fi, worldwide interoperability for microwave access ("WiMAX"), ultra mobile broadband ("UMB"), and other similar systems. Further, the implementations of these systems are described by specifications developed by various standards bodies such as the third generation partnership project ("3GPP") and 3GPP2.

As wireless communication systems evolve, more advanced network equipment is introduced that provide improved features, functionality and performance. Such advanced network equipment may also be referred to as long-term evolution ("LTE") equipment or long-term evolution advanced ("LTE-A") equipment. LTE builds on the success of high-speed packet access ("HSPA") with higher average and peak data throughput rates, lower latency and a better user experience, especially in high-demand geographic areas. LTE accomplishes this higher performance with the use of broader spectrum bandwidth, OFDMA and SC-FDMA air interfaces, and advanced antenna methods.

Communications between user equipment and base stations may be established using single-input, single-output systems ("SISO"), where only one antenna is used for both the receiver and transmitter; single-input, multiple-output systems ("SIMO"), where multiple antennas are used at the receiver and only one antenna is used at the transmitter; and multiple-input, multiple-output systems ("MIMO"), where multiple antennas are used at the receiver and transmitter. Compared to a SISO system, SIMO may provide increased coverage while MIMO systems may provide increased spectral efficiency and higher data throughput if the multiple transmit antennas, multiple receive antennas or both are utilized.

In these wireless communication systems, signal detection and estimation in noise is pervasive. Sampling theorems provide the ability to convert continuous-time signals to discrete-time signals to allow for the efficient and effective implementation of signal detection and estimation algorithms. A well-known sampling theorem is often referred to as the Shannon theorem and provides a necessary condition on frequency bandwidth to allow for an exact recovery of an arbitrary signal. The necessary condition is that the signal must be sampled at a minimum of twice its maximum frequency, which is also defined as the Nyquist rate. Nyquist rate sampling has the drawback of requiring expensive, high-quality components requiring substantial power and cost to support sampling at large frequencies. Further, Nyquist-rate sampling is a function of the maximum frequency of the signal and does not require knowledge of any other properties of the signal.

To avoid some of these difficulties, compressive sampling provides a new framework for signal sensing and compression where a special property of the input signal, sparseness, is exploited to reduce the number of values needed to reliably represent a signal without loss of desired information.

BRIEF DESCRIPTION OF THE DRAWINGS

To facilitate this disclosure being understood and put into practice by persons having ordinary skill in the art, reference is now made to exemplary embodiments as illustrated by reference to the accompanying figures. Like reference numbers refer to identical or functionally similar elements throughout the accompanying figures. The figures along with the detailed description are incorporated and form part of the specification and serve to further illustrate exemplary embodiments and explain various principles and advantages, in accordance with this disclosure, where:

FIG. 10 is a chart illustrating an example of the type of sparse representation matrix and sensing matrix used in a sensor-based wireless communication system using compressive sampling in accordance with various aspects set forth herein.

FIG. 20 is an example of deterministic matrices used in one embodiment of a sensor-based wireless communication system using compressive sampling in accordance with various aspects set forth herein.

FIG. 21 is an example of random matrices used in one embodiment of a sensor-based wireless communication system using compressive sampling in accordance with various aspects set forth herein.

Figure 1:
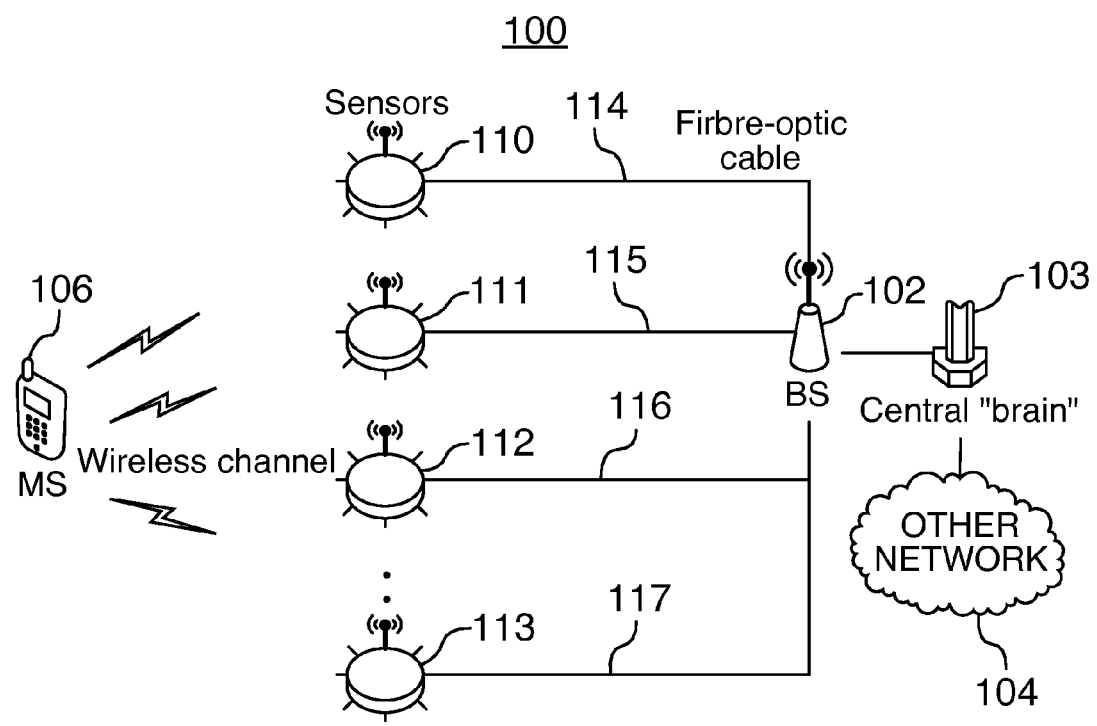
FIG. 1 illustrates one embodiment of a sensor-based wireless communication system using compressive sampling in accordance with various aspects set forth herein.

Skilled artisans will appreciate that elements in the accompanying figures are illustrated for clarity, simplicity and to further help improve understanding of the embodiments, and have not necessarily been drawn to scale.

DETAILED DESCRIPTION

Although the following discloses exemplary methods, devices and systems for use in sensor-based wireless communication systems, it will be understood by one of ordinary skill in the art that the teachings of this disclosure are in no way limited to the examplaries shown. On the contrary, it is contemplated that the teachings of this disclosure may be implemented in alternative configurations and environments. For example, although the exemplary methods, devices and systems described herein are described in conjunction with a configuration for aforementioned sensor-based wireless communication systems, the skilled artisan will readily recognize that the exemplary methods, devices and systems may be used in other systems and may be configured to correspond to such other systems as needed. Accordingly, while the following describes exemplary methods, devices and systems of use thereof, persons of ordinary skill in the art will appreciate that the disclosed exemplaries are not the only way to implement such methods, devices and systems, and the drawings and descriptions should be regarded as illustrative in nature and not restrictive.

Various techniques described herein can be used for various sensor-based wireless communication systems. The various aspects described herein are presented as methods, devices and systems that can include a number of components, elements, members, modules, nodes, peripherals, or the like. Further, these methods, devices and systems can include or not include additional components, elements, members, modules, nodes, peripherals, or the like. In addition, various aspects described herein can be implemented in hardware, firmware, software or any combination thereof. It is important to note that the terms "network" and "system" can be used interchangeably. Relational terms described herein such as "above" and "below", "left" and "right", "first" and "second", and the like may be used solely to distinguish one entity or action from another entity or action without necessarily requiring or implying any actual such relationship or order between such entities or actions. The term "or" is intended to mean an inclusive "or" rather than an exclusive "or." Further, the terms "a" and "an" are intended to mean one or more unless specified otherwise or clear from the context to be directed to a singular form.

The wireless communication system may be comprised of a plurality of user equipment and an infrastructure. The infrastructure includes the part of the wireless communication system that is not the user equipment, such as sensors, base stations, core network, downlink transmitter, other elements and combination of elements. The core network can have access to other networks. The core network, also referred to as a central brain or remote central processor, may include a high-powered infrastructure component, which can perform computationally intensive functions at a high rate with acceptable financial cost. The core network may include infrastructure elements, which can communicate with base stations so that, for instance, physical layer functions may also be performed by the core network. The base station may communicate control information to a downlink transmitter to overcome, for instance, communication impairments associated with channel fading. Channel fading includes how a radio frequency ("RF") signal can be bounced off many reflectors and the properties of the resulting sum of reflections. The core network and the base station may, for instance, be the same the same infrastructure element, share a portion of the same infrastructure element or be different infrastructure elements.

A base station may be referred to as a node-B ("NodeB"), a base transceiver station ("BTS"), an access point ("AP"), a satellite, a router, or some other equivalent terminology. A base station may contain a RF transmitter, RF receiver or both coupled to a antenna to allow for communication with a user equipment.

A sensor may be referred to as a remote sampler, remote conversion device, remote sensor or other similar terms. A sensor may include, for instance, an antenna, a receiving element, a sampler, a controller, a memory and a transmitter. A sensor may be interfaced to, for instance, a base station. Further, sensors may be deployed in a wireless communication system that includes a core network, which may have access to another network.

A user equipment used in a wireless communication system may be referred to as a mobile station ("MS"), a terminal, a cellular phone, a cellular handset, a personal digital assistant ("PDA"), a smartphone, a handheld computer, a desktop computer, a laptop computer, a tablet computer, a netbook, a printer, a set-top box, a television, a wireless appliance, or some other equivalent terminology. A user equipment may contain an RF transmitter, RF receiver or both coupled to an antenna to communicate with a base station. Further, a user equipment may be fixed or mobile and may have the ability to move through a wireless communication system. Further, uplink communication refers to communication from a user equipment to a base station, sensor or both. Downlink communication refers to communication from a base station, downlink transmitter or both to a user equipment.

FIG. 1 illustrates one embodiment of sensor-based wireless communication system 100 using compressive sampling with various aspects described herein. In this embodiment, system 100 can provide robust, high bandwidth, real-time wireless communication with support for high-user density. System 100 can include user equipment 106, sensors 110 to 113, base station 102, core network 103 and other network 104. User equipment 106 may be, for instance, a low cost, low power device. Base station 102 can communicate with user equipment 106 using, for instance, a plurality of low-cost, low-power sensors 110 to 113.

In FIG. 1, system 100 contains sensors 110 to 113 coupled to base station 102 for receiving communication from user equipment 106. Base station 102 can be coupled to core network 103, which may have access to other network 104. In one embodiment, sensors 110 to 113 may be separated by, for instance, approximately ten meters to a few hundred meters. In another embodiment, a single sensor 110 to 113 may be used. A person of ordinary skill in the art will appreciate in deploying a sensor-based wireless communication system that there are tradeoffs between the power consumption of sensors, deployment cost, system capacity, other factors and combination factors. For instance, as sensors 110 to 113 become more proximally spaced, the power consumption of sensors 110 to 113 may decrease while the deployment cost and system capacity may increase. Further, user equipment 106 may operate using a different RF band than used with the underlying wireless network when in close proximity to sensors 110 to 113.

In the current embodiment, sensors 110 to 113 can be coupled to base station 102 using communication links 114 to 117, respectively, which can support, for instance, a fiber-optic cable connection, a coaxial cable connection, other connections or any combination thereof. Further, a plurality of base stations 102 may communicate sensor-based information between each other to support various functions. Sensors 110 to 113 may be designed to be low cost with, for example, an antenna, an RF front-end, baseband circuitry, interface circuitry, a controller, memory, other elements, or combination of elements. A plurality of sensors 110 to 113 may be used to support, for instance, antenna array operation, SIMO operation, MEMO operation, beamforming operation, other operations or combination of operations. A person of ordinary skill in the art will recognize that the aforementioned operations may allow user equipment 106 to transmit at a lower power level resulting in, for instance, lower power consumption.

In system 100, user equipment 106 and base station 102 can communicate using, for instance, a network protocol. The network protocol can be, for example, a cellular network protocol, Bluetooth protocol, wireless local area loop ("WLAN") protocol or any other protocol or combination of protocols. A person of ordinary skill in the art will recognize that a cellular network protocol can be anyone of many standardized cellular network protocols used in systems such as LTE, UMTS, CDMA, GSM and others. The portion of the network protocol executed by sensors 110 to 113 may include, for instance, a portion of the physical layer functions. A person of ordinary skill in the art will recognize that reduced functionality performed by sensors 110 to 113 may result in lower cost, smaller size, reduced power consumption, other advantages or combination of advantages.

Sensors 110 to 113 can be powered by, for instance, a battery power source, an alternating current ("AC") electric power source or other power sources or combination of power sources. Communication including real-time communication among sensors 110 to 113, user equipment 106, base station 102, core network 103, other network 104 or any combination thereof may be supported using, for instance, an automatic repeat request ("ARQ") protocol.

In the current embodiment, sensors 110 to 113 can compress a received uplink signal ("f") transmitted from user equipment 106 to form a sensed signal ("y"). Sensors 110 to 113 can provide the sensed signal ("y") to base station 102 using communication links 114 to 117, respectively. Base station 102 can then process the sensed signal ("y"). Base station 102 may communicate instructions to sensors 110 to 113, wherein the instructions can relate to, for instance, data conversion, oscillator tuning, beam steering using phase sampling, other instructions or combination of instructions. Further, user equipment 106, sensors 110 to 113, base station 102, core network 103, other network 104 or any combination thereof may communicate including real-time communication using, for instance, a medium access control ("MAC") hybrid-ARQ protocol, other similar protocols or combination of protocols. Also, user equipment 106, sensors 110 to 113, base station 102, core network 103, other network 104 or any combination thereof may communicate using, for instance, presence signaling codes which may operate without the need for cooperation from sensors 110 to 113; space-time codes which may require channel knowledge; fountain codes which may be used for registration and real-time transmission; other communication codes or combination of communication codes. Some of these communication codes may require, for instance, applying various signal processing techniques to take advantage of any inherent properties of the codes.

In FIG. 1, base station 102 may perform functions such as transmitting system overhead information; detecting the presence of user equipment 106 using sensors 110 to 113; two-way, real-time communication with user equipment 106; other functions or combination of functions. A person of ordinary skill in the art will recognize that sensors 110 to 113 may be substantially less expensive than base station 102 and core network 103.

Sampling is performed by measuring the value of a continuous-time signal at a periodic rate, aperiodic rate, or both to form a discrete-time signal. In the current embodiment, the effective sampling rate of sensors 110 to 113 can be less than the actual sampling rate used by sensors 110 to 113. The actual sampling rate is the sampling rate of, for instance, an analog-to-digital converter ("ADC"). The effective sampling rate is measured at the output of sensors 110 to 113, which corresponds to the bandwidth of sensed signal ("y"). By providing a lower effective sampling rate, sensors 110 to 113 can consume less power than other sensors operating at the actual sampling rate without any compression. Redundancy can be designed into the deployment of a system so that the loss of a sensor would minimally affect the performance of the system. For many types of signals, reconstruction of such signals can be performed by base station 102, core network 103, other network 104, or any combination thereof.

In the current embodiment, sensors 110 to 113 may each contain a direct sequence de-spreading element, a fast Fourier transform ("FFT") element, other elements or combination of elements. Base station 102 can send to sensor 110 to 113 instructions, for instance, to select direct sequence codes or sub-chip timing for a de-spreading element, to select the number of frequency bins or the spectral band for an FFT element, other instructions or combination of instructions. These instructions may be communicated at, for example, one-millisecond intervals, with each instruction being performed by sensor 110 to 113 within one tenth of a millisecond after being received. Further, user equipment 106 may transmit and receive information in the form of slots, packets, frames or other similar structures, which may have a duration of, for instance, one to five milliseconds. Slots, packets, frames and other similar structures may include a collection of time-domain samples successively captured or may describe a collection of successive real or complex values.

In FIG. 100, system 100 can include the communication of system overhead information between user equipment 106, base station 102, core network 103, other network 104, sensors 110 to 113 or any combination thereof. The system overhead information may include, for instance, guiding and synchronizing information, wireless wide area network information, WLAN information, other information or combination of information. A person of ordinary skill in the art will recognize that by limiting the need for user equipment 106 to monitor the underlying network, extraneous networks or both may reduce its power consumption.

In FIG. 1, user equipment 106 may transmit uplink signals at a low transmission power level if user equipment 106 is sufficiently proximate to sensors 110 to 113. Sensors 110 to 113 can compressively sample the received uplink signals ("g") to generate sensed signals ("y"). Sensors 110 to 113 can send sensed signals ("y") to base station 102 using communication link 114 to 117, respectively. Base station 102 may perform, for instance, layer 1 functions such as demodulation and decoding; layer 2 functions such as packet numbering and ARQ; and higher-layer functions such as registration, channel assignment and handoff. Base station 102 may have substantial computational power to perform computationally intensive functions in real time, near-real time or both.

In the current embodiment, base station 102 may apply link adaptation strategies using, for instance, knowledge of the communication channels such as the antenna correlation matrix of user equipment 106; the number of sensors 110 to 113 in proximity to user equipment 106; other factors or combination of factors. Such adaptation strategies may require processing at periodic intervals, for instance, one-millisecond intervals. Such strategies may allow for operating, for instance, at the optimum space-time multiplexing gain and diversity gain. Also, a plurality of base stations 102 may communicate between each other to perform, for instance, dirty paper coding ("DPC"), which is a technique for efficiently transmitting downlink signals through a communication channel that is subject to some interference that is known to base station 102. To support these techniques, other base stations that receive extraneous uplink signals from user equipment 106 may provide the uplink signals ("f") to base station 102 associated with user equipment 106. A person of ordinary skill in the art will recognize that a plurality of user equipment 106 can communicate with base station 102.

Figure 2:
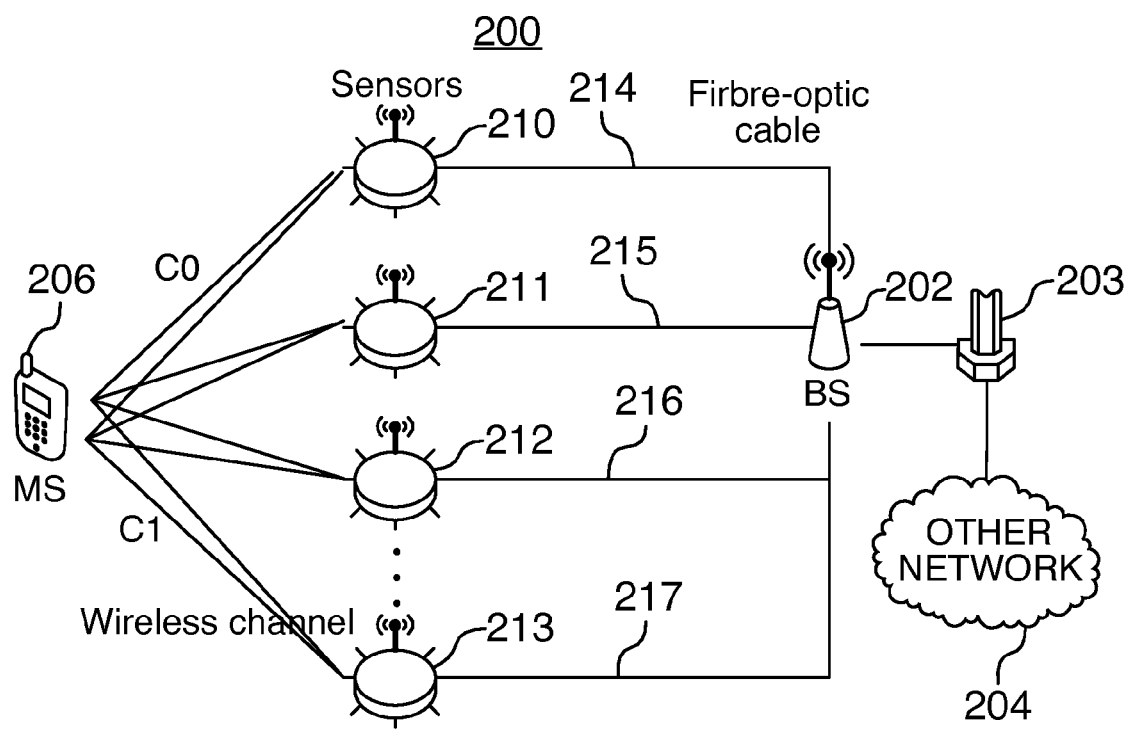
FIG. 2 illustrates another embodiment of a sensor-based wireless communication system using compressive sampling in accordance with various aspects set forth herein.

FIG. 2 illustrates another embodiment of a sensor-based wireless communication system 200 using compressive sampling in accordance with various aspects set forth herein. In this embodiment, system 200 can provide robust, high bandwidth, real-time wireless communication with support for high-user density. System 200 includes user equipment 206, sensors 210 to 213, base station 202, core network 203 and other network 204. In this embodiment, sensors 210 to 213 may perform a portion of layer 1 functions such as receiving an uplink signal and performing compressive sampling. Further, base station 202 may send instructions to sensors 210 to 213 using communication link 214 to 217, respectively. Such instructions may be, for example, to compress using a specific multiple access code such as a direct sequence code or an OFDM code. Further, base station 202 may send instructions to sensors 210 to 213 to perform, for instance, sampling at twice the sampling rate, which may be at a specific phase.

Base station 202 may perform computationally intensive functions to, for instance, detect the presence of user equipment 206 in the sensed signals ("y") received from sensors 210 to 213. Once the presence of user equipment 206 is detected, base station 202 may configure sensors 210 to 213 to improve the reception of uplink signals ("f") from user equipment 206. Such improvements may be associated with timing, frequency, coding, other characteristics or combination of characteristics. Further, user equipment 206 may transmit uplink signals ("f") using, for instance, a fountain code. For high bandwidth, low power communication, user equipment 206 may use a fountain code to transmit uplink signals containing, for instance, real-time speech. The packet transmission rate for such uplink signals may be, for instance, in the range of 200 Hz to 1 kHz. Sensors 210 to 213 may have limited decision-making capability with substantial control by base station 202.

In FIG. 2, sensors 210 to 213 may be densely deployed, for instance, one sensor 210 to 213 in approximately every one hundred meters separation distance, one sensor 210 to 213 in approximately every ten meters separation distance, other configurations or combination of configurations. Sensors 210 to 213 may contain or be co-located with a downlink transmitter, which is used to support the transmission of downlink signals received from base station 202. Further, base station 202 may use a communication link to provide downlink signals to a remote downlink transmitter such as, a traditional cellular tower with antenna sectorization, a cellular transmitter mounted on a building or light pole, a low power unit in an office, other elements or combination of elements. The deployment of such remote downlink transmitters may be to support, for example, building deployment, street light deployment, other deployments or combination of deployments. Further, it will be understood that a plurality of user equipment 206 can communicate with base station 202.

Figure 3:
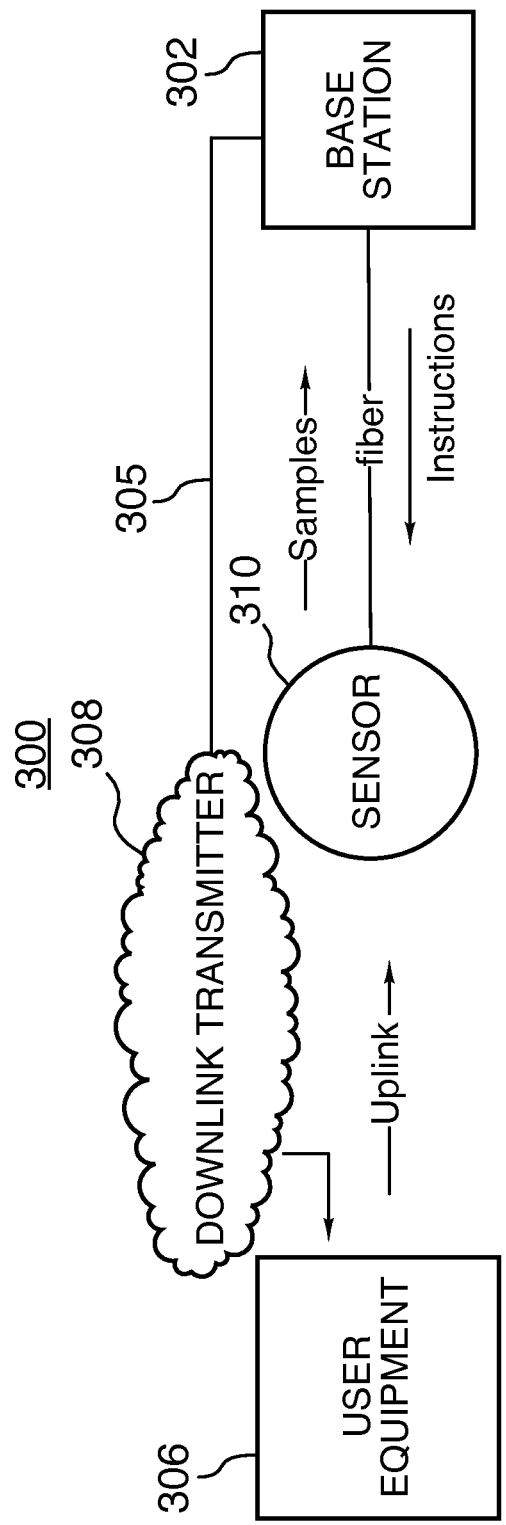
FIG. 3 illustrates another embodiment of a sensor-based wireless communication system using compressive sampling in accordance with various aspects set forth herein.

FIG. 3 illustrates another embodiment of a sensor-based wireless communication system 300 using compressive sampling in accordance with various aspects set forth herein. In this embodiment, system 300 represents a multiple access system. System 300 includes user equipment 306, sensor 310, base station 302 and downlink transmitter 308. In FIG. 3, sensor 310 can include a receiving element for downconverting uplink signals. A person of ordinary skill in the art will appreciate the design and implementation requirements for such a receiving element.

In FIG. 3, base station 302 can be coupled to downlink transmitter 308, wherein downlink transmitter 308 can be co-located, for instance, with a cellular tower. Base station 302 may contain, for instance, a collector for collecting sensed signals from sensor 310, a detector for detecting information signals contained in the sensed signals, a controller for controlling sensor 310, other elements or combination of elements. Base station 302 and downlink transmitter 308 may be co-located. Further, downlink transmitter 308 can be coupled to base station 302 using communication link 309, which can support, for instance, a fiber-optic cable connection, a microwave link, a coaxial cable connection, other connections or any combination thereof. The configuration of system 300 may be similar to a conventional cellular system such as, a GSM system, a UMTS system, a LTE system, a CDMA system, other systems or combination of systems. A person of ordinary skill in the art will recognize that these systems exhibit arrangements of user equipment, base stations, downlink transmitters, other elements or combination of elements.

In the current embodiment, user equipment 308 and base station 302 can communicate using a network protocol to perform functions such as random access; paging; origination; resource allocation; channel assignment; overhead signaling including timing, pilot system identification, channels allowed for access; handover messaging; training or pilot signaling; other functions or combination of functions. Further, user equipment 308 and base station 302 may communicate voice information, packet data information, circuit-switched data information, other information or combination of information.

Figure 4:
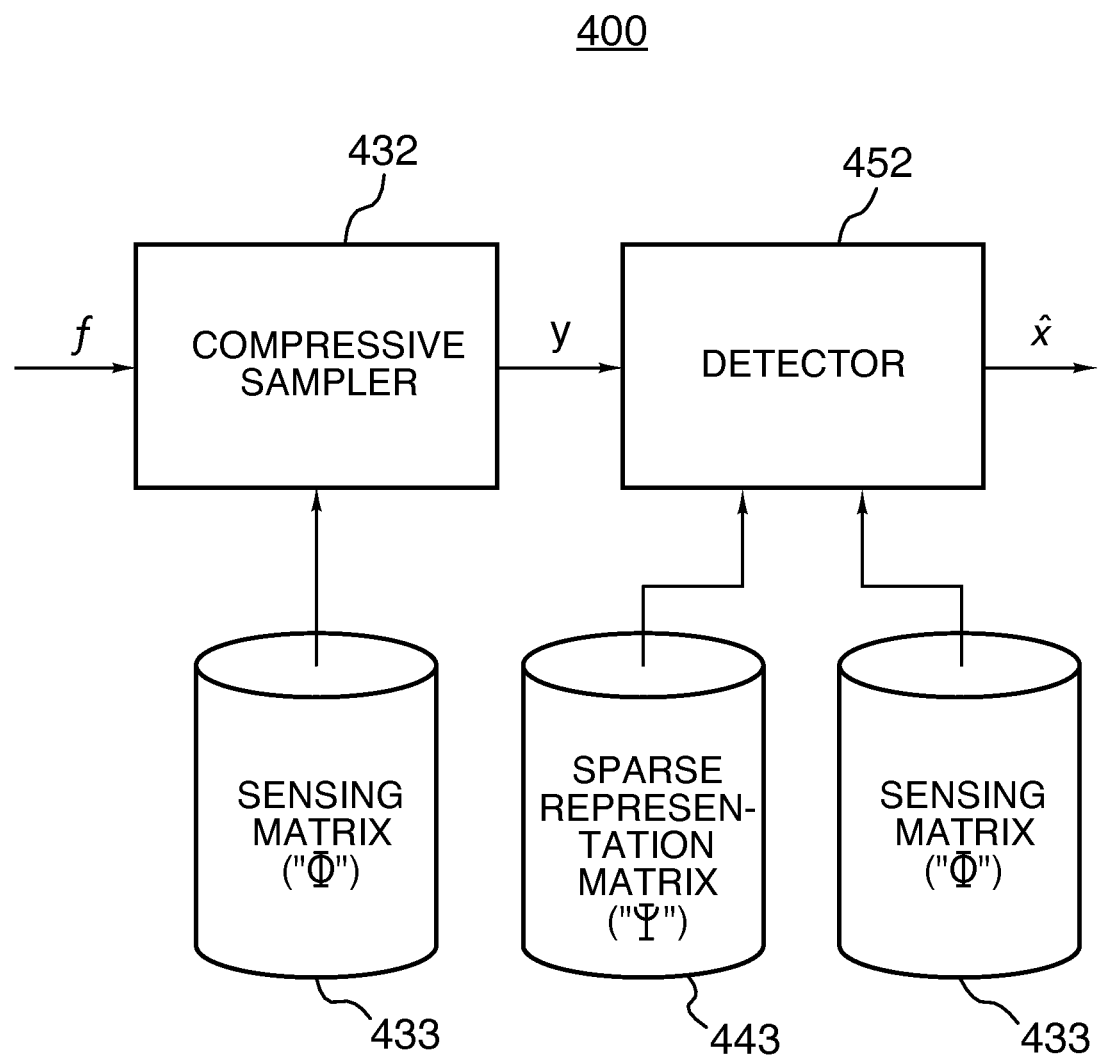
FIG. 4 illustrates one embodiment of a compressive sampling system in accordance with various aspects set forth herein.

FIG. 4 illustrates one embodiment of a compressive sampling system in accordance with various aspects set forth herein. System 400 includes compressive sampler 431 and detector 452. In FIG. 4, compressive sampler 431 can compressively sample an input signal ("f") using sensing waveforms ("$\phi_j$") of sensing matrix ("$\Phi$") to generate a sensed signal ("y"), where $\phi_j$ refers to the jth waveform of sensing matrix ("$\Phi$"). The input signal ("f") can be of length N, the sensing matrix ("$\Phi$") can have M sensing waveforms ("$\phi_j$") of length N and the sensed signal ("y") can be of length M, where M can be less than N. An information signal ("x") can be recovered if the input signal ("f") is sufficiently sparse. A person of ordinary skill in the art will recognize the characteristics of a sparse signal. In one definition, a signal of length N with S non-zero values is referred to as S-sparse and includes N minus S ("N−S") zero values.

In the current embodiment, compressive sampler 431 can compressively sample the input signal ("f") using, for instance, Equation (1).

$$y_k = (f, \phi_k), k \epsilon j \text{ such that } j \subset (1 \ldots N) \tag{1}$$

where the brackets ( . . . ) denote the inner product, correlation function or other similar functions.

Further, detector 452 can solve the sensed signal ("y") to find the information signal ("x") using, for instance, Equation (2).

$$\min_1(x^- \epsilon R^- N) \|x^-\|_1(l_1 1) \text{ subject to } y_t k = (\phi_t k, \Psi x^-), (k \epsilon j) \tag{2}$$

where $\| \ \|_{l_1}$ is the $l_1$ norm, which is the sum of the absolute values of the elements of its argument and the brackets ( ) denote the inner product, correlation function or other similar functions. One method, for instance, which can be applied for $l_1$ minimization is the simplex method. Other methods to solve the sensed signal ("y") to find the information signal ("x") include using, for instance, the $l_o$ norm algorithm, other methods or combination of methods.

Incoherent sampling is a form of compressive sampling that relies on sensing waveforms ("$\phi_j$") of the sensing matrix ("$\Phi$") being sufficiently unrelated to the sparse representation matrix ("$\Psi$"), which is used to make the input signal ("f") sparse. To minimize the required number of sensing waveforms ("$\phi_j$") of sensing matrix ("$\Phi$"), the coherence ("$\mu$") between the sparse representation waveforms ("$\psi_j$") of the sparse representation matrix ("$\Psi$") and the sensing waveforms ("$\phi_j$") of sensing matrix ("$\Phi$") should represent that these waveforms are sufficiently unrelated, corresponding to a lower coherence ("$\mu$"), where $\psi_j$ refers to the jth waveform of the sparse representation matrix ("$\Psi$"). The coherence ("$\mu$") can be represented, for instance, by Equation 3.

$$\mu(\Phi, \Psi) = \sqrt{N} \max_{1 \le k, j \le N} \|\langle \phi_k, \psi_j \rangle\|_{l_1} \tag{3}$$

where $\| \ \|_{l_1}$ is the $l_1$ norm, which is the sum of the absolute values of the elements of its argument and the brackets ( ) denote the inner product, correlation function or other similar functions.

Figure 5:
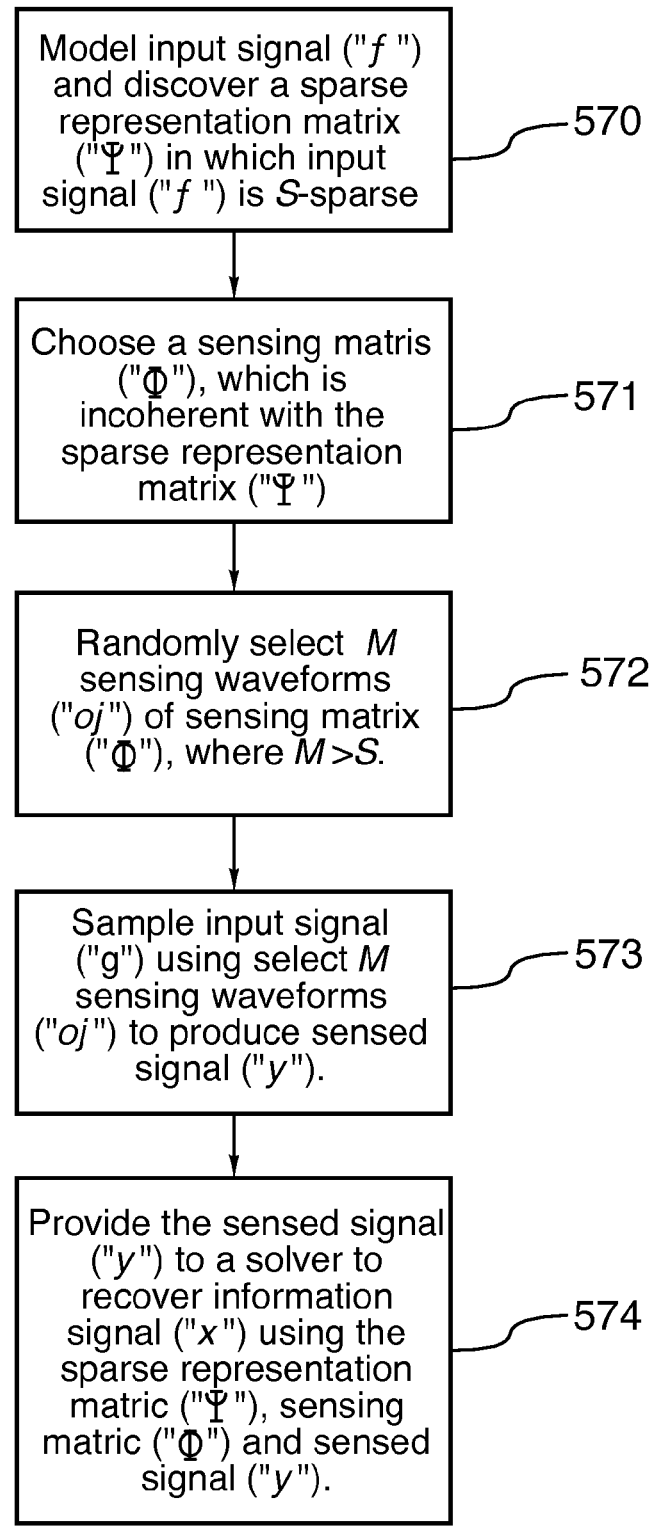
FIG. 5 is a flow chart of one embodiment of a compressive sampling method in accordance with various aspects set forth herein.

FIG. 5 is a flow chart of an embodiment of a compressive sampling method 500 in accordance with various aspects set forth herein, which can be used, for instance, to design a compressive sampling system. In FIG. 5, method 500 can start at block 570, where method 500 can model an input signal ("f") and discover a sparse representation matrix ("$\Psi$")

in which the input signal ("f") is S-sparse. At block 571, method 500 can choose a sensing matrix ("Φ"), which is sufficiently incoherent with the sparse representation matrix ("Ψ"). At block 572, method 500 can randomly, deterministically or both select M sensing waveforms ("$\phi_j$") of sensing matrix ("Φ"), where M may be greater than or equal to S. At block 573, method 500 can sample input signal ("f") using the selected M sensing waveforms ("$\phi_j$") to produce a sensed signal ("y"). At block 574, method 500 can pass the sparse representation matrix ("Ψ"), the sensing matrix ("Φ") and the sensed signal ("y") to a detector to recover an information signal ("x").

Figure 6:
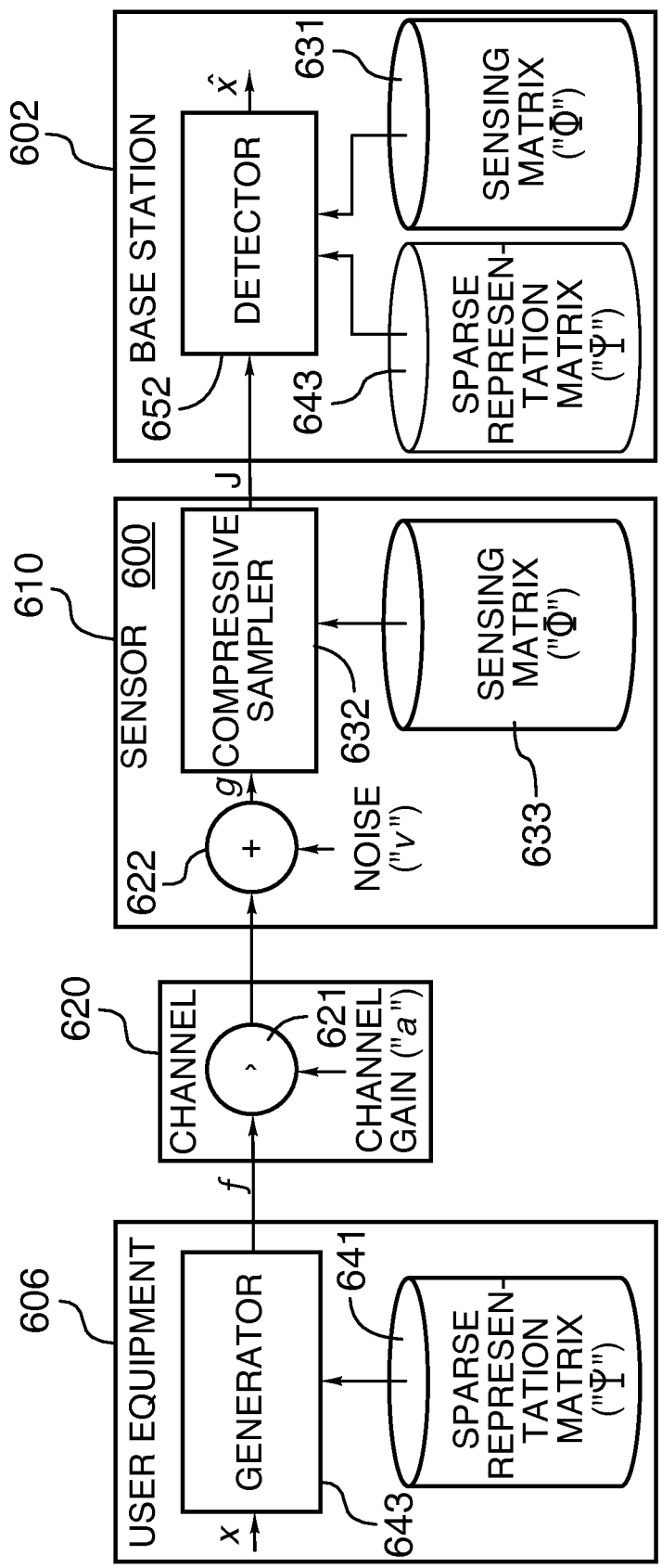
FIG. 6 illustrates another embodiment of a sensor-based wireless communication system using compressive sampling in accordance with various aspects set forth herein.

FIG. 6 illustrates another embodiment of a sensor-based wireless communication system using compressive sampling in accordance with various aspects set forth herein. In this embodiment, system 600 can provide robust, high bandwidth, real-time wireless communication with support for high-user density. System 600 includes user equipment 606, sensor 610 and base station 602. In FIG. 6, system 600 can allow user equipment 606 to communicate with, for instance, the underlying cellular system even if sensor 610, for instance, fails to operate. System 600 may allow sensors 610 to be widely distributed consistent with, for instance, office-building environments. System 600 may allow for base station 602 to not be limited by, for instance, computational capacity, memory, other resources or combination of resources. System 600 may allow for downlink signals to be provided by, for instance, a conventional cellular tower. System 600 may allow user equipment 606 to minimize power consumption by limiting its transmission power level to, for instance, approximately ten to one hundred microwatts. System 600 may allow for sensor 610 to be coupled to base station 602 using communication link 614, wherein communication link 614 can support, for instance, a fiber-optic cable connection, a coaxial cable connection, other connections or any combination thereof. System 600 may allow for sensor 610 to be operated by power sources such as a battery, a photo voltaic power source, an alternating current ("AC") electric power source, other power sources or combination of power sources.

In FIG. 6, system 600 may allow for sensor 610 to be substantially less ex pensive than base station 602. Further, system 600 may allow for sensor 610 to operate using battery power for an extended period such as approximately one to two years. To achieve this, a person of ordinary skill in the art will recognize that certain functions such as signal detection, demodulation and decoding may have to be performed by, for instance, base station 602.

In FIG. 6, sensor 610 can have a receiving element such as an antenna coupled to an RF downconversion chain, which are used for receiving uplink signals ("f"). In this disclosure, uplink signal ("f") can also be referred to as uplink signal ("g"). Uplink signal ("g") includes channel propagation effects and environmental effects on uplink signal ("f"). For instance, channel gain ("a") 621 of channel 620 can represent, for instance, channel propagation effects while channel noise ("v") 622 of channel 620 can represent, for instance, environment noise effects. Further, sensor 610 can support a communication link to send, for instance, sensed signals ("y") to base station 602. Sensor 610 may not have the computational capability to, for instance, recognize when user equipment 606 is transmitting an uplink signal ("f"). Sensor 610 may receive instructions from base station 602 associated with, for instance, RF downconversion, compressive sampling, other functions or combination of functions.

There are many methods for a user equipment to access a wireless communication system. One type of access method is, for instance, the Aloha random access method, which is performed when an unrecognized user equipment attempts to access the network. Two-way communication with a base station may take place, for instance, after the user equipment has been given permission to use the system and any uplink and downlink channels have been assigned.

Figure 7:
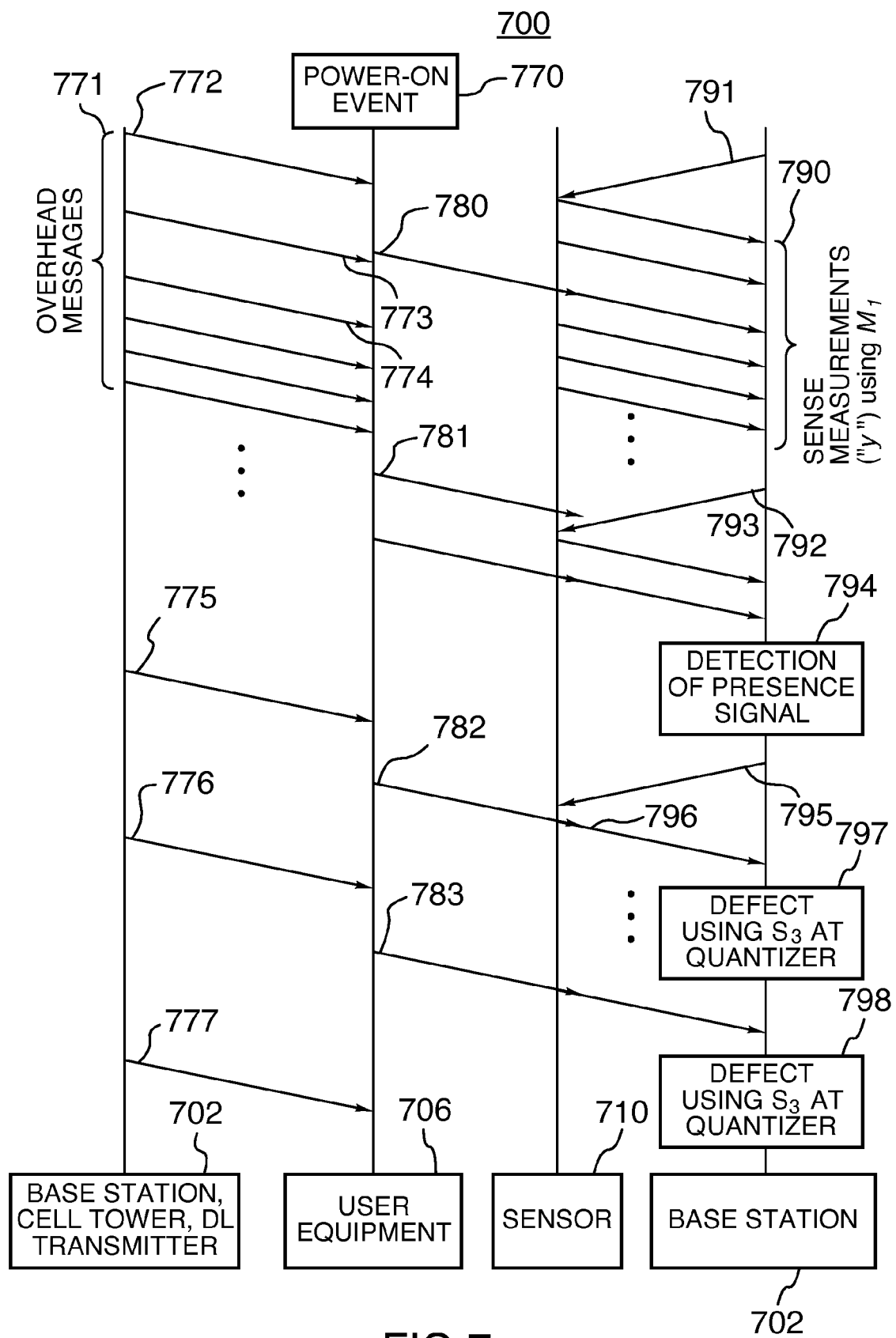
FIG. 7 illustrates one embodiment of an access method in a sensor-based wireless communication system using compressive sampling in accordance with various aspects set forth herein.

FIG. 7 illustrates one embodiment of an access method 700 in a sensor-based wireless communication system using compressive sampling in accordance with various aspects set forth herein. Various illustrative structures are shown in the lower portion of FIG. 7 to facilitate understanding of method 700. Further, FIG. 7 illustrates base station 702 twice but should be interpreted as one and the same base station 702. Accordingly, method 700 includes communication amongst base station 702, user equipment 706, sensor 710 or any combination thereof. User equipment 706 can have, for instance, a power-on event 770 and begin observing overhead messages 771 sent from base station 702. A person of ordinary skill in the art will recognize that a base station can communicate with a user equipment using, for instance, broadcast communication, point-to-multipoint communication, point-to-point communication or other communication methods or combination of communication methods. Overhead messages 771 may contain system parameters including, for instance, the length of message frames, the value of M associated with the number of sensing waveforms ("$\phi_j$") and the sparseness S of the uplink signals ("f") being sent.

In FIG. 7, base station 702 may send, for instance, an overhead message to configure user equipment 706 to use sparseness $S_1$ and sparse representation matrix ("Ψ"), as shown at 772. User equipment 706 may then send, for instance, presence signals using sparseness $S_1$, as represented by 780. Presence signals can include any signal sent by user equipment 706 to base station 702 that can be compressively sampled. In another embodiment, user equipment 706 may send presence signals using $S_1$, as shown at 780, when it determines that it is approaching base station 702. In this situation, user equipment 706 may determine that it is approaching base station 702 via, for instance, overhead messages 771 sent by base station 702, another base station or both.

In FIG. 7, base station 702 may also send, for instance, an overhead message containing system information such as framing, timing, system identification, other system information or combination of information, as shown at 773. In addition, base station 702 may instruct sensor 710 to use, for instance, $M_1$ sensing waveforms ("$\phi_j$") of sensing matrix ("Φ"), as represented by 791. Sensor 710 may then continuously process received uplink signals ("f") and send sensed signals ("y") using $M_1$ sensing waveforms ("$\phi_j$") of sensing matrix ("Φ") to base station 702, as shown at 790.

In FIG. 7, base station 702 may send, for instance, an overhead message to configure user equipment 706 to use sparseness $S_2$ and sparse representation matrix ("Ψ"), as represented by 774. User equipment 706 may then send, for instance, presence signals using sparseness $S_2$, as shown by 781. In addition, base station 702 may instruct sensor 710 to use, for instance, $M_2$ sensing waveforms ("$\phi_j$") of sensing matrix ("Φ"), as represented by 792. Sensor 710 may then continuously process received uplink signals ("f") and send to base station 702 sensed signals ("y") using $M_2$ sensing waveforms ("$\phi_j$") of sensing matrix ("Φ"), as shown at 793. User equipment 706 may continue to send presence signals using $S_2$, as shown by 781, until, for instance, base station 702 detects the presence signals using $S_2$, as shown at 794. At which point, base station 702 may send to user equipment 706 a recognition message including, for instance, a request to send a portion of its electronic serial number ("ESN") and to use sparseness $S_3$ and a sparse representation matrix ("Ψ"), as represented by 775. Further, base station 702 may send to sensor 710 an instruction to use, for instance, a new value of $M_3$ and a new sensing matrix ("Φ"), as shown at 795. Sensor 710 may then continuously process received uplink signals ("f") and send to base station 702 sensed signals ("y") using $M_3$ sensing waveforms ("$\phi_j$") of sensing matrix ("Φ"), as shown at 796.

In FIG. 7, user equipment 706 may send to base station 702 an uplink message containing a portion of its ESN using $S_3$, as represented by 782. Once base station 702 has received this uplink message, base station 702 may send to user equipment 706 a downlink message requesting user equipment 706 to send, for instance, its full ESN and a request for resources, as shown at 776. User equipment 706 may then send an uplink message containing its full ESN and a request for resources using $S_3$, as represented by 783. After base station 702 receives this uplink message, base station 702 may verify the full ESN of user equipment 706 to determine its eligibility to be on the system and to assign it any resources, as represented by 798. Base station 702 may then send to user equipment 706 a downlink message to assign it resources, as shown at 777.

Sensor 710 may continuously receive uplink signals ("f") of a frequency bandwidth ("B") centered at a center frequency ("$f_c$"). Sensor 710 can downconvert the uplink signal ("f") using a receiving element and then perform compressive sampling. Compressive sampling is performed, for instance, by sampling the received uplink signal ("f") and then computing the product of a sensing matrix ("Φ") and the samples to generate a sensed signal ("y"). Sampling may be performed, for instance, at the frequency bandwidth ("B") corresponding to the Nyquist rate, consistent with preserving the received uplink signal ("f") according to Shannon's theorem. The received uplink signal ("f") can be sampled, for instance, periodically, aperiodically or both.

The sampling process can result in N samples, while computing the product of a sensing matrix ("Φ") and the N samples can result in M values of sensed signal ("y"). The sensing matrix ("Φ") may have dimensions of N by M. These resulting M values of sensed signal ("y") can be sent over a communication link to base station 702. Compressive sampling can reduce the number of samples sent to base station 702 from N samples for a conventional approach to M samples, wherein M can be less than N. If sensor 710 does not have sufficient system timing, sampling may be performed at a higher sampling rate resulting in, for instance, 2N samples. For this scenario, sensor 710 may compute the product of a sensing matrix ("Φ") and the 2N samples of uplink signal ("f") resulting in 2M samples of sensed signal ("y"). Thus, the compressive sampler may reduce the number of samples sent to base station 702 from 2N samples for a conventional approach to 2M samples, wherein M may be less than N. For this scenario, the sensing matrix ("Φ") may have dimensions of 2N by 2M.

The compressive sampler may compute sensed signal ("y") by correlating the sampled received uplink signal ("f") with, for instance, independently selected sensing waveforms ("$\phi_j$") of the sensing matrix ("Φ"). Selection of the sensing waveforms ("$\phi_j$") of the sensing matrix ("Φ") may be without any knowledge of the information signal ("x"). However, the selection of M may rely, for instance, on an estimate of the sparseness S of the received uplink signal ("f"). Therefore, the selected M sensing waveforms ("$\phi_j$") of the sensing matrix ("Φ") may be independent of the sparse representation matrix ("Ψ"), but M may be dependent on an estimate of a property of the received uplink signal ("f"). Further, the sparseness S of received uplink signal ("f") may be controlled, for instance, by base station 702 sending to user equipment 706 a downlink message recognizing user equipment 706 and configuring user equipment 706 to use sparseness $S_3$ and a new sparse representation matrix ("Ψ") 775.

Successful detection of the information signal ("x") by base station 702 may require M to be greater than or equal to the sparseness S. The lack of knowledge of sparseness S may be overcome, for instance, by base station 702 estimating sparseness S and adjusting thereafter. For example, base station 702 may initialize M to, for instance, the value of N, which may correspond to no compression benefit. As base station 702 estimates the activity level of the frequency band B received at sensor 710, base station 702 may, for instance, adjust the value of M. By doing so, base station 702 can affect the power consumption of sensor 710 by, for instance, adjusting the number of M sensing waveforms ("$\phi_j$"); thus, adjusting the bandwidth of the sensed signals ("y") sent to base station 702 over the communication link.

Further, base station 702 may send an instruction to sensor 710 to, for instance, periodically increase the value of M to allow base station 702 to evaluate thoroughly the sparseness S in the frequency band B. In addition, base station 702 may send to sensor 710 an instruction as to the method of selecting sensing waveforms ("$\phi_j$") such as, random selection, selection according to a schedule, other selection methods or combination of selection methods. In some instances, sensor 710 may need to communicate its selection of sensing waveforms ("$\phi_j$") to base station 702.

User equipment 706 can send presence signals to notify base station 702 of its presence. Each presence signal may be an informative signal generated by, for instance, selecting and combining sparse representation waveforms ("$\psi_j$") of sparse representation matrix ("Ψ"). The selection of sparse representation waveforms ("$\psi_j$") of sparse representation matrix ("Ψ") may be configured, for instance, by an overhead message sent by base station 702. For example, base station 702 may broadcast an overhead message that specifies a subset of sparse representation waveforms ("$\psi_j$") of sparse representation matrix ("Ψ").

Base station 702 may also broadcast a downlink overhead message for unrecognized user equipment 706 to use a specific sparse representation waveform ("$\psi_j$") of sparse representation matrix ("Ψ"), which can be referred to as a pilot signal ("$\psi_0$"). Sensor 710 can continuously receive uplink signals ("f"), compressively sample uplink signals ("f") to generate sensed signal ("y"), and send sensed signals ("y") to base station 702. Base station 702 can then detect the pilot signal ("$\psi_0$") in the sensed signal ("y"). Once the pilot signal ("$\psi_0$") is detected, base station 702 may estimate the channel gain ("â") between user equipment 706 and sensor 710 and may instruct any user equipment 706, which had sent the pilot signal ("$\psi_0$"), to send, for instance, a portion of its ESN. If a collision occurs between uplink transmissions from different user equipment 706, collision resolution methods such as the Aloha algorithm may be used to separate subsequent uplink transmission attempts by different user equipment 706.

Sensor 710 may also operate irrespective of the communication between base station 702 and user equipment 706. Base station 702 may instruct sensor 710 to use, for instance, M sparse representation waveform ("$\psi_j$") of sparse representation matrix ("Ψ"). Further, base station 702 may vary the value of M based on anticipating, for instance, the amount of uplink signal ("f") activity by user equipment 706. For example, if base station 702 anticipates that the sparseness S of uplink signal ("f") is changing, it may instruct sensor 710 to change the value of M. For a certain deterministic sensing matrix ("Φ"), when M equals the value of N, sensing matrix ("Φ") in sensor 710 may effectively become a discrete Fourier transform ("DFT").

Figure 8:
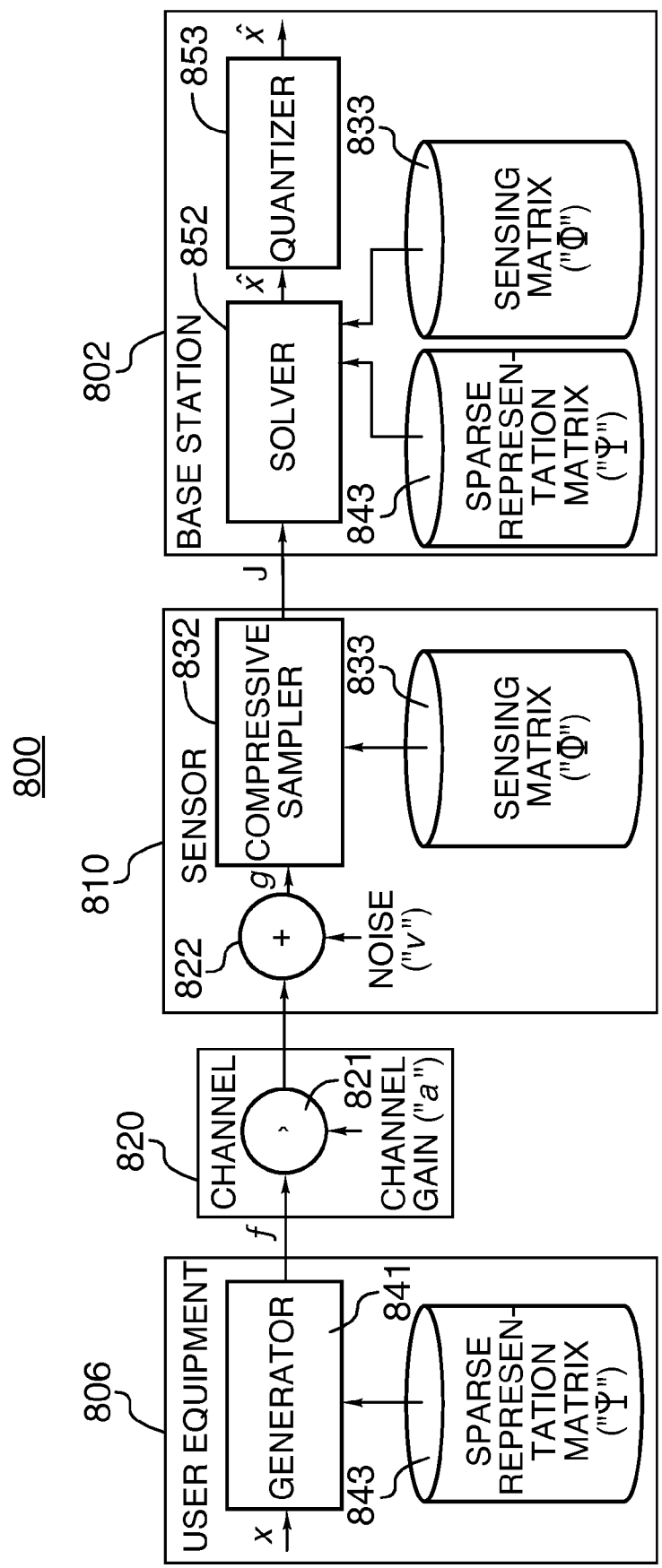
FIG. 8 illustrates another embodiment of a sensor-based wireless communication system using compressive sampling in accordance with various aspects set forth herein.

FIG. 8 illustrates another embodiment of a sensor-based wireless communication system 800 using compressive sampling in accordance with various aspects set forth herein. In this embodiment, system 800 can provide robust, high bandwidth, real-time wireless communication with support for high-user density. In FIG. 8, system 800 includes user equipment 806, sensor 810 and base station 802. Base station 802 can receive sensed signals ("y") from sensor 810 as input to detector 851 of base station 802 to generate an estimate of information signal ("x"), also referred to as x̃Base station 802 can then quantize this estimate to generate, for instance, a quantized estimate of the information signal ("x"), also referred to as x̂. The estimate of the information signal ("x") may be determined using, for instance, the simplex algorithm, $l_1$ norm algorithm, $l_o$ norm algorithm, other algorithms or combination of algorithms. In this embodiment, all of the elements of the estimate of the information signal ("x") may have non-zero values. Therefore, a hard decision of the estimate of the information signal ("x") may be performed to determine the information signal ("x"), which consists of, for instance, S non-zero values and N minus S ("N–S") zero values.

Figure 9:
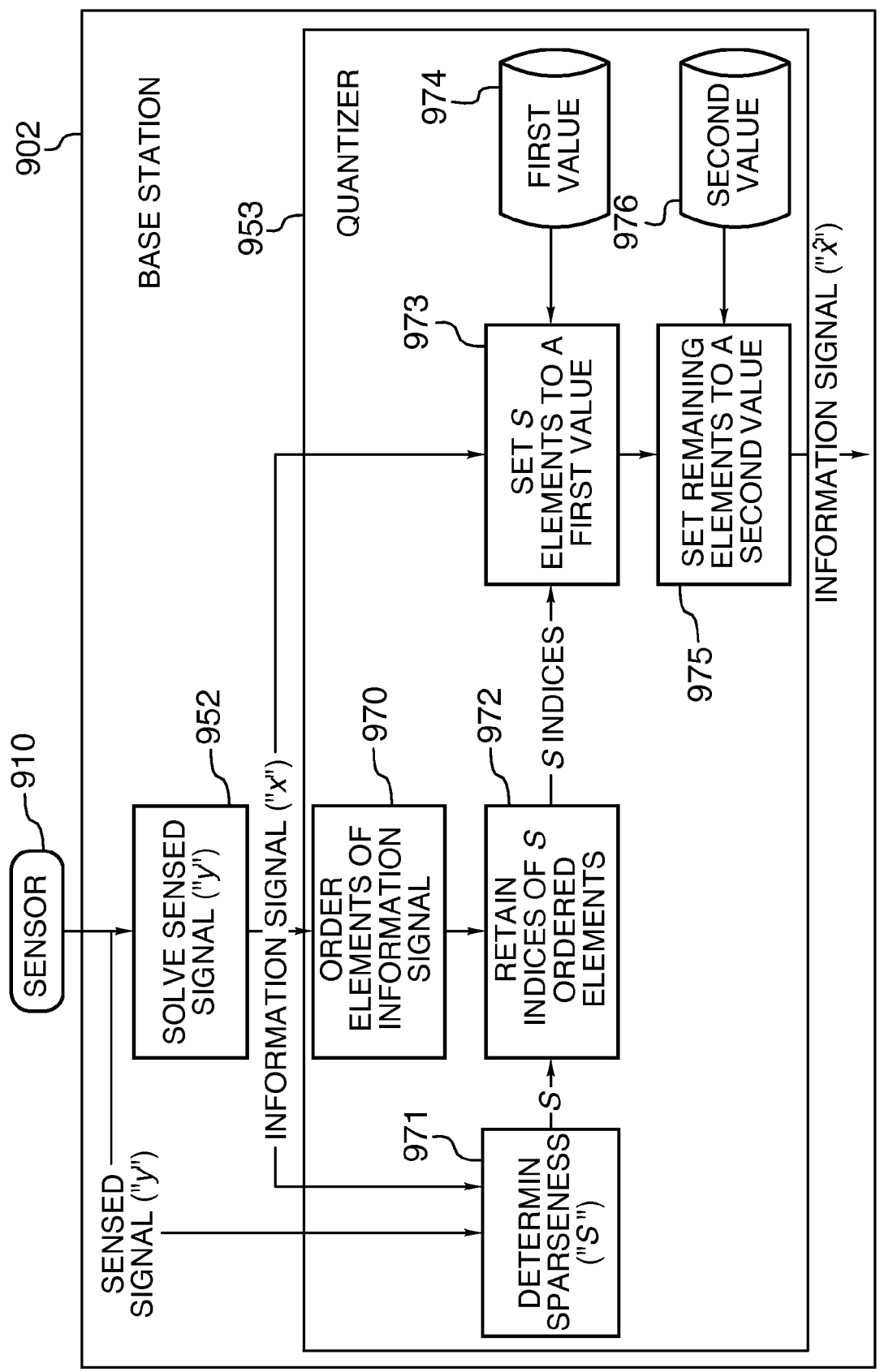
FIG. 9 illustrates one embodiment of a quantizing method of a detector in a sensor-based wireless communication system using compressive sampling in accordance with various aspects set forth herein.

FIG. 9 illustrates one embodiment of a quantizing method 900 of a detector in a sensor-based wireless communication system using compressive sampling in accordance with various aspects set forth herein. FIG. 9 refers to steps within base station 902 and steps within quantizer 953 within base station 902. Method 900 starts at sensor 910, which can send sensed signal ("y") to base station 902. At block 952, method 900 can solve sensed signal ("y") to determine an estimate of the information signal ("x"), also referred to as x̃. At block 970, method 900 can order the elements of the estimate of the information signal ("x"), for instance, from the largest value to the smallest value.

In FIG. 9, the information signal ("x") is applied to quantizer 953. At block 971, method 900 can determine the sparseness S using, for instance, the sensed signal ("y"), the estimate of the information signal ("x") or both. Further, base station 902 may fix the value of S for a user equipment, by sending a downlink message to the user equipment. Base station 902 may also periodically scan for appropriate values of S by sending different values of S to the sensor and determining the sparseness S of uplink signal ("f") during some period of time, for instance, one to two seconds. Because user equipment may make multiple access attempts, base station 902 may have the opportunity to recognize a bad estimate of S and instruct the sensor to adjust its value of M. With a sufficiently low duty cycle on the scanning for S, the power consumption advantages of using a sensor-based wireless communication network can be preserved. In this way, compressive sampling activities by sensor 910 may adaptively track the sparseness of the signals, which may affect it. Therefore, sensor 910 may minimize its power consumption even while continuously performing compressive sampling.

At block 972, method 900 can use the sparseness S determined at block 971 to retain indices of the largest S elements of the estimate of the information signal ("x"). At block 973, method 900 can use the S indices determined at block 972 to set the largest S elements of the estimate of the information signal ("x") to first value 974. At block 975, method 900 can then set the remaining N–S elements of the estimate of the information signal ("x") to second value 976. The output of quantizer 953 can be a quantized estimate of the information signal ("x"), referred to as x̂. First value 974 may be, for instance, a logical one. Further, second value 976 may be, for instance, a logical zero.

FIG. 10 is chart 1000 illustrating an example of the type of sparse representation matrix and sensing matrix used in sensor-based wireless communication system 100, 200, 300, 400, 600 and 800 using compressive sampling in accordance with various aspects set forth herein. In one embodiment, a sensor-based wireless communication system using compressive sampling may use random matrices for the sparse representation matrix ("Ψ") and the sensing matrix ("Φ"). The random matrices are composed of for instance, independently and identically distributed ("iid") Gaussian values.

In another embodiment, a sensor-based wireless communication system using compressive sampling may use deterministic matrices for the sparse representation matrix ("Ψ") and the sensing matrix ("Φ"). The deterministic matrices are composed of, for instance, an identity matrix for the sparse representation matrix ("Ψ") and a cosine matrix for the sensing matrix ("Φ"). A person of ordinary skill in the art would recognize that many different types and combinations of matrices might be used for a sensor-based wireless communication system using compressive sampling.

Figure 11:
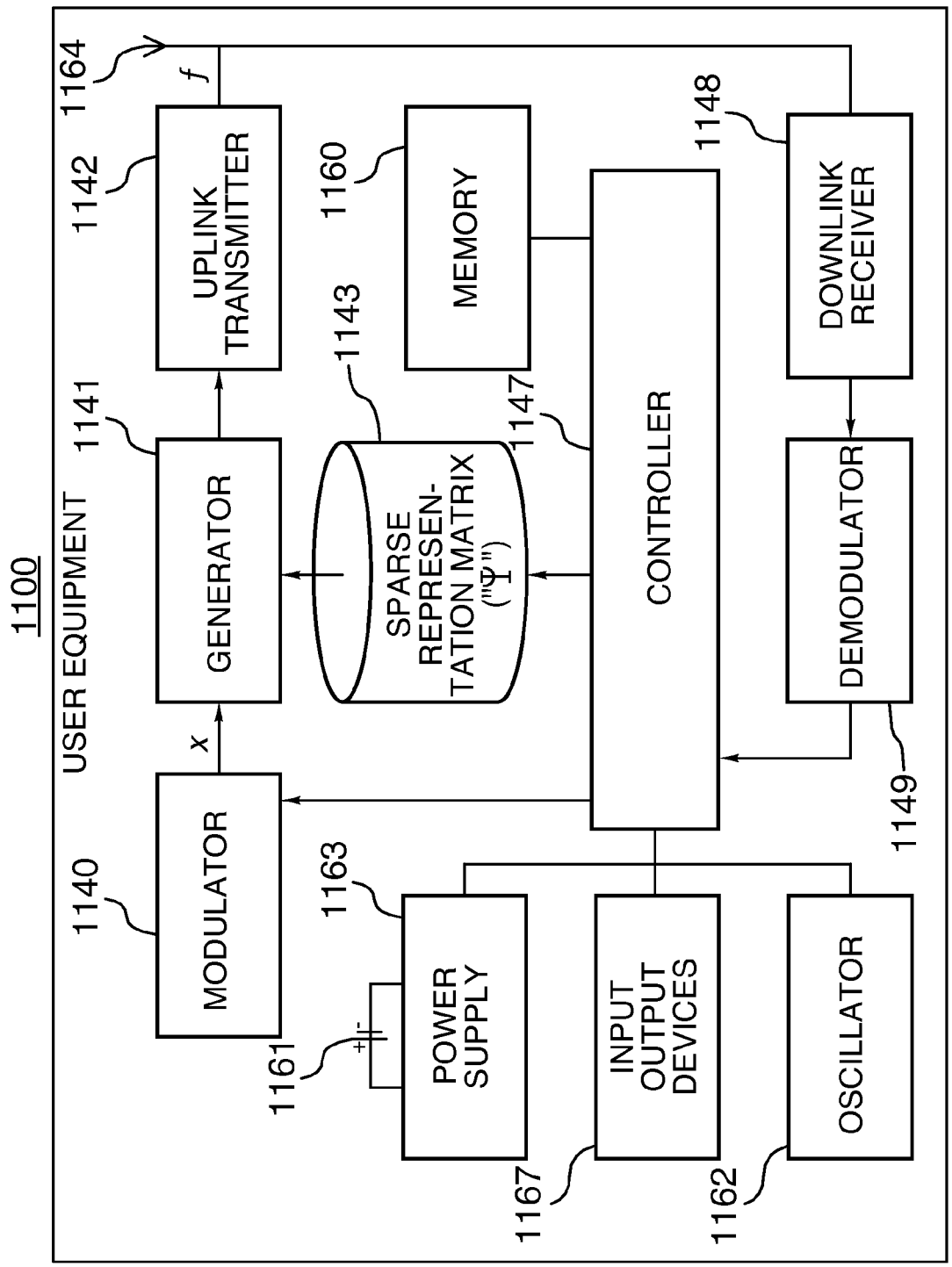
FIG. 11 illustrates one embodiment of a wireless device, which can be used in a sensor-based wireless communication system using compressive sampling in accordance with various aspects set forth herein.

FIG. 11 illustrates one embodiment of user equipment 1100, which can be used in sensor-based wireless communication system 100, 200, 300, 400, 600 and 800 using compressive sampling in accordance with various aspects set forth herein. In FIG. 11, user equipment 1100 can include modulator 1140 for modulating an uplink message to form an information signal ("x"). Generator 1141 can receive the information signal ("x") and can apply a sparse representation matrix ("Ψ") 1143 to the information signal ("x") to generate an uplink signal ("f"), which is transmitted by uplink transmitter 1142 using, for instance, antenna 1364. User equipment 1100 can also include a downlink receiver 1148 for downconverting a downlink signal received by antenna 1164. The received downlink signal can then be processed by demodulator 1149 to generate a downlink message.

In this embodiment, user equipment 1100 can include oscillator 1162 for clocking user equipment 1100 and maintaining system timing, power supply 1163 such as battery 1361 for powering user equipment 1100, input/output devices 1367 such as a keypad and display, memory 1360 coupled to controller 1147 for controlling the operation of user equipment 1100, other elements or combination of elements. A person of ordinary skill in the art will recognize the typical elements found in a user's equipment.

Figure 12:
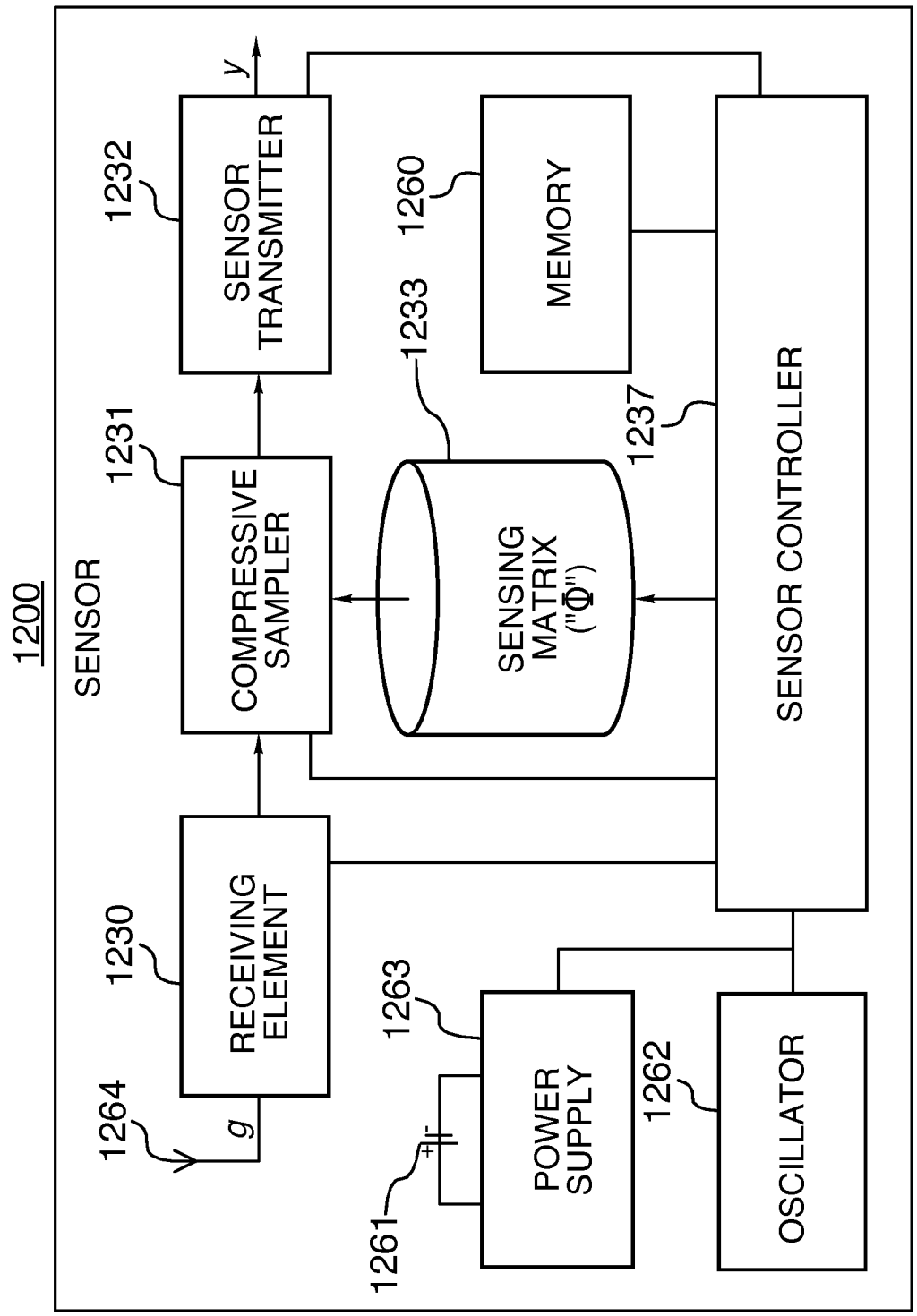
FIG. 12 illustrates one embodiment of a sensor, which can be used in a sensor-based wireless communication system using compressive sampling in accordance with various aspects set forth herein.

FIG. 12 illustrates one embodiment of a sensor 1200, which can be used in sensor-based wireless communication system 100, 200, 300, 400, 600 and 800 using compressive sampling in accordance with various aspects set forth herein. In FIG. 12, sensor 1200 can include receiving element 1230 for downconverting an uplink signal ("f") received by, for instance, antenna 1264. Compressive sampler 1231 can apply a sensing matrix ("Φ") 1233 to the uplink signal ("f") to generate a sensed signal ("y"), which can be sent using sensor transmitter 1232.

In this embodiment, sensor 1200 can include oscillator 1262 for clocking sensor 1200 and maintaining system timing, power supply 1263 such as battery 1261 for powering user equipment 1100, memory 1260 coupled to controller or state machine 1237 for controlling the operation of sensor 1200, other elements or combination of elements. Controller 1237 may be implemented in hardware, software, firmware or any combination thereof. Further, controller 1237 may include a microprocessor, digital signal processor, memory, state machine or any combination thereof.

Figure 13:
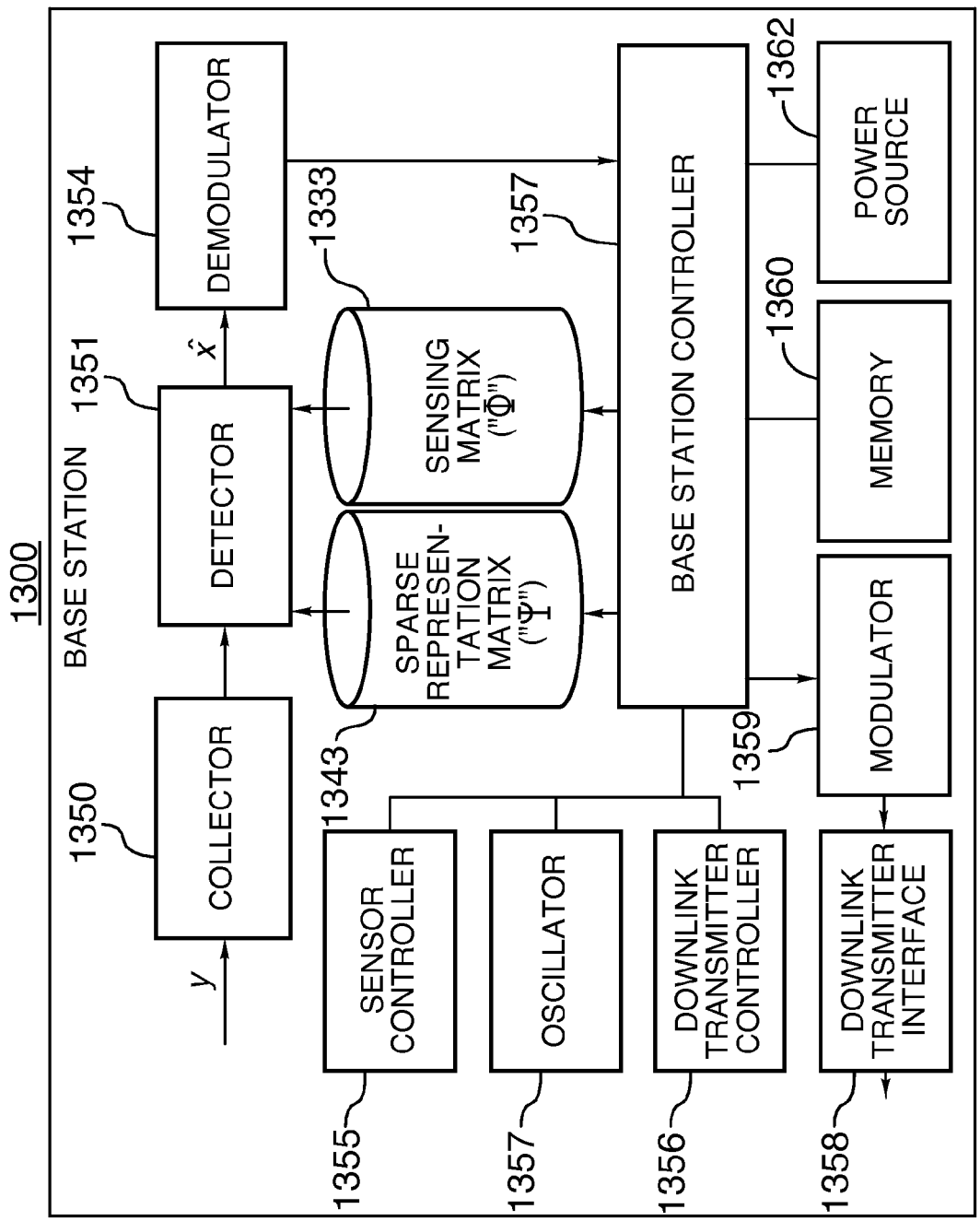
FIG. 13 illustrates one embodiment of a base station, which can be used in a sensor-based wireless communication system using compressive sampling in accordance with various aspects set forth herein.

FIG. 13 illustrates one embodiment of base station 1300, which can be used in sensor-based wireless communication system 100, 200, 300, 400, 600 and 800 using compressive sampling in accordance with various aspects set forth herein. In FIG. 13, in the uplink direction, base station 1300 can include collector 1350 for collecting sensed signal ("y"). Detector 1351 can receive the collected sensed signal ("y") and can use a sensing matrix ("Φ") 1233 and a sparse representation matrix ("Ψ") 1143 to estimate and detect information signal ("x") from the collected sensed signal ("y"). Controller 1357 may evaluate the detected information signal ("x̂") to determine the uplink message. In the downlink direction, base station 1300 can include a modulator 1359 for modulating a downlink message and downlink transmitter interface 1358 for sending the modulated downlink signals.

In this embodiment, base station 1300 can include oscillator 1362 for clocking base station 1300 and maintaining system timing, power supply 1363 for powering base station 1300, memory 1360 coupled to controller 1337 for controlling the operation of base station 1300, sensor controller 1355 for controlling a sensor, downlink transmitter controller for controlling a downlink transmitter, other elements or combination of elements.

In one embodiment, sensor-based wireless communication system 100, 200, 300, 400, 600 and 800 may use a plurality of sensors 110 to 113, 210 to 213, 310, 610, 710, 810, 1200 and 1310 to process uplink signal ("f") to allow for the joint detection of a presence signal at base station 102, 202, 302, 602, 702, 802 and 1302 by using antenna array signal processing techniques, MIMO signal processing techniques, beamforming techniques, other techniques or combination of techniques. The use of a plurality of sensors 110 to 113, 210 to 213, 310, 610, 710, 810, 1200 and 1310 may allow the value of M to be lower at each sensor 110 to 113, 210 to 213, 310, 610, 710, 810, 1200 and 1310. Therefore, the power consumption of each sensor 110 to 113, 210 to 213, 310, 610, 710, 810, 1200 and 1310 may be reduced by placing the plurality of sensors 110 to 113, 210 to 213, 310, 610, 710, 810, 1200 and 1310, for instance, in a more dense deployment.

In another embodiment, sensor-based wireless communication system 100, 200, 300, 400, 600 and 800 may deploy sensors 110 to 113, 210 to 213, 310, 610, 710, 810, 1200 and 1310 to allow typically two sensors 110 to 113, 210 to 213, 310, 610, 710, 810, 1200 and 1310 to receive uplink signals ("f") transmitted by user equipment 706. Such a deployment may be in an indoor environment where sensors 110 to 113, 210 to 213, 310, 610, 710, 810, 1200 and 1310 may be deployed by, for instance, a thirty meters separation distance with a path loss exponent between two or three. Sensors 110 to 113, 210 to 213, 310, 610, 710, 810, 1200 and 1310 may each be deployed to cover a larger area; however, the path loss exponent may be smaller. For successful detection, the probability of detecting a single presence signal may be above ten percent.

In another embodiment, sensor-based wireless communication system 100, 200, 300, 400, 600 and 800 may deploy sensor 110 to 113, 210 to 213, 310, 610, 710, 810, 1200 and 1310 in macrocells to support, for instance, vehicular communication, other communication or combination of communication. Further, sensor 110 to 113, 210 to 213, 310, 610, 710, 810, 1200 and 1310 may be deployed in microcells to support, for instance, pedestrian communication, indoor communication, office communication, other communication or combination of communication.

In system 100, 200, 300, 400, 600 and 800, channel 620 and 820 may be static with channel gain ("a") 621 and 821 and channel noise ("v") 622 and 821 may be additive white Gaussian noise ("AWGN"). Channel noise ("v") 622 and 821 may include an additive signal, which may distort the receiver's view of the information of interest. The source of the channel noise ("v") may be, for instance, thermal noise at a receive antenna, co-channel interference, adjacent channel interference, other noise sources or combination of noise sources. Further, sensor 110 to 113, 210 to 213, 310, 610, 710, 810, 1200 and 1310; user equipment 106, 206, 306, 606, 706, 806 and 1100; base station 102, 202, 302, 602, 702, 802 and 1302; or any combination thereof may be sufficiently synchronized in timing, frequency, phase, other conditions or combination of conditions thereof. In addition, there may be only one sensor 110 to 113, 210 to 213, 310, 610, 710, 810, 1200 and 1310; one user equipment 106, 206, 306, 606, 706, 806 and 1100; one base station 102, 202, 302, 602, 702, 802 and 1302; or any combination thereof.

The compressive sampling scheme may use a sparse representation matrix ("Ψ") and a sensing matrix ("Φ") that are, for instance, a random pair, a deterministic pair or any combination thereof. For these matrices, base station 102, 202, 302, 602, 702, 802 and 1302, sensor 110 to 113, 210 to 213, 310, 610, 710, 810, 1200 and 1310, user equipment 106, 206, 306, 606, 706, 806 and 1100, or any combination thereof may be provided with, for instance, the sparse representation matrix ("Ψ"), the sensing matrix ("Φ") or both, information such as a seed value to generate the sparse representation matrix ("Ψ"), the sensing matrix ("Φ") or both, or any combination thereof. Base station 102, 202, 302, 602, 702, 802 and 1302 may know which sparse representation matrix ("Ψ") and sensing matrix ("Φ") are being used. Base station 102, 202, 302, 602, 702, 802 and 1302 may instruct sensor 110 to 113, 210 to 213, 310, 610, 710, 810, 1200 and 1310 to use a specific set of M sensing waveforms ("$\phi_j$") of sensing matrix ("Φ"). Further, base station 102, 202, 302, 602, 702, 802 and 1302 may instruct user equipment 106, 206, 306, 606, 706, 806 and 1100 and sensor 110 to 113, 210 to 213, 310, 610, 710, 810, 1200 and 1310 that the uplink signal consists, for instance, of N intervals or chips.

The aforementioned random matrices, deterministic matrices or both may be generated only once or may not change if generated again. Further, these matrices may be regenerated after some time, for instance, a few seconds. Also, these matrices may be regenerated each time they are to be used. In any case, the detector, which includes the solver, of base station 102, 202, 302, 602, 702, 802 and 1302 may know the sparse representation matrix ("Ψ") used by user equipment 706 as well as the sensing matrix ("Φ") used by the sampler. A person of ordinary skill in the art would recognize that this does not mean that the base station must provide the matrices. On the other hand, for example, user equipment 106, 206, 306, 606, 706, 806 and 1100 and base station 102, 202, 302, 602, 702, 802 and 1302 may change the sparse representation matrix ("Ψ") according to, for instance, a pseudo-noise ("pn") function of the system time. Similarly, for example, sensor 110 to 113, 210 to 213, 310, 610, 710, 810, 1200 and 1310 and base station 102, 202, 302, 602, 702, 802 and 1302 may change the sensing matrix ("Φ") according to, for instance, a pseudo-noise ("pn") function of the system time.

Figure 14:
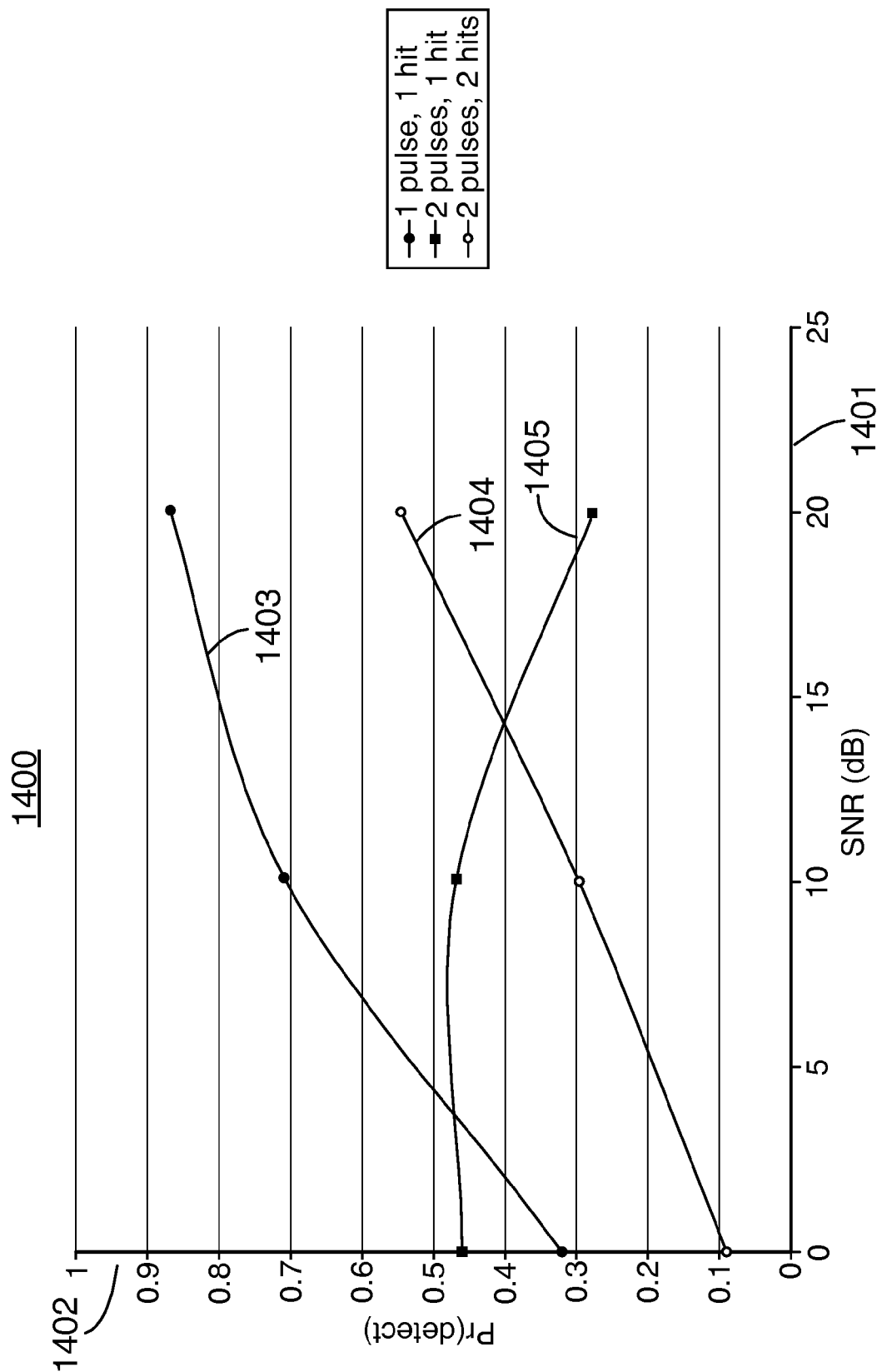
FIG. 14 illustrates simulated results of one embodiment of detecting a wireless device in a sensor-based wireless communication system using compressive sampling in accordance with various aspects set forth herein.

FIG. 14 illustrates simulated results of one embodiment of detecting a user equipment in a sensor-based wireless communication system using compressive sampling in accordance with various aspects set forth herein, where the performance of system 800 was measured using N=10, M=5, S=1 or 2, and random matrices. The graphical illustration in its entirety is referred to by 1400. The logarithmic magnitude of the signal-to-noise ("SNR") ratio is shown on abscissa 1401 and is plotted in the range from 0 decibels ("dB") to 25 dB. The probability of detection ("Pr (detect)") is shown on ordinate 1402 and is plotted in the range from zero, corresponding to zero probability, to one, corresponding to one hundred percent probability. Graphs 1403, 1404 and 1405 represent simulation results for system 800, where N is ten, M is five, S is one or two and random iid Gaussian values are used to populate the sparse representation matrix ("Ψ") and the sensing matrix ("Φ"). Graph 1403 shows the probability of detecting one non-zero entry in a quantized estimate of the information signal ("x"), where S is one. Graph 1404 shows the probability of detecting one non-zero entry in a quantized estimate of the information signal ("x"), where S is two. Graph 1405 shows the probability of detecting two non-zero entries in a quantized estimate of the information signal ("x"), where S is two.

Figure 15:
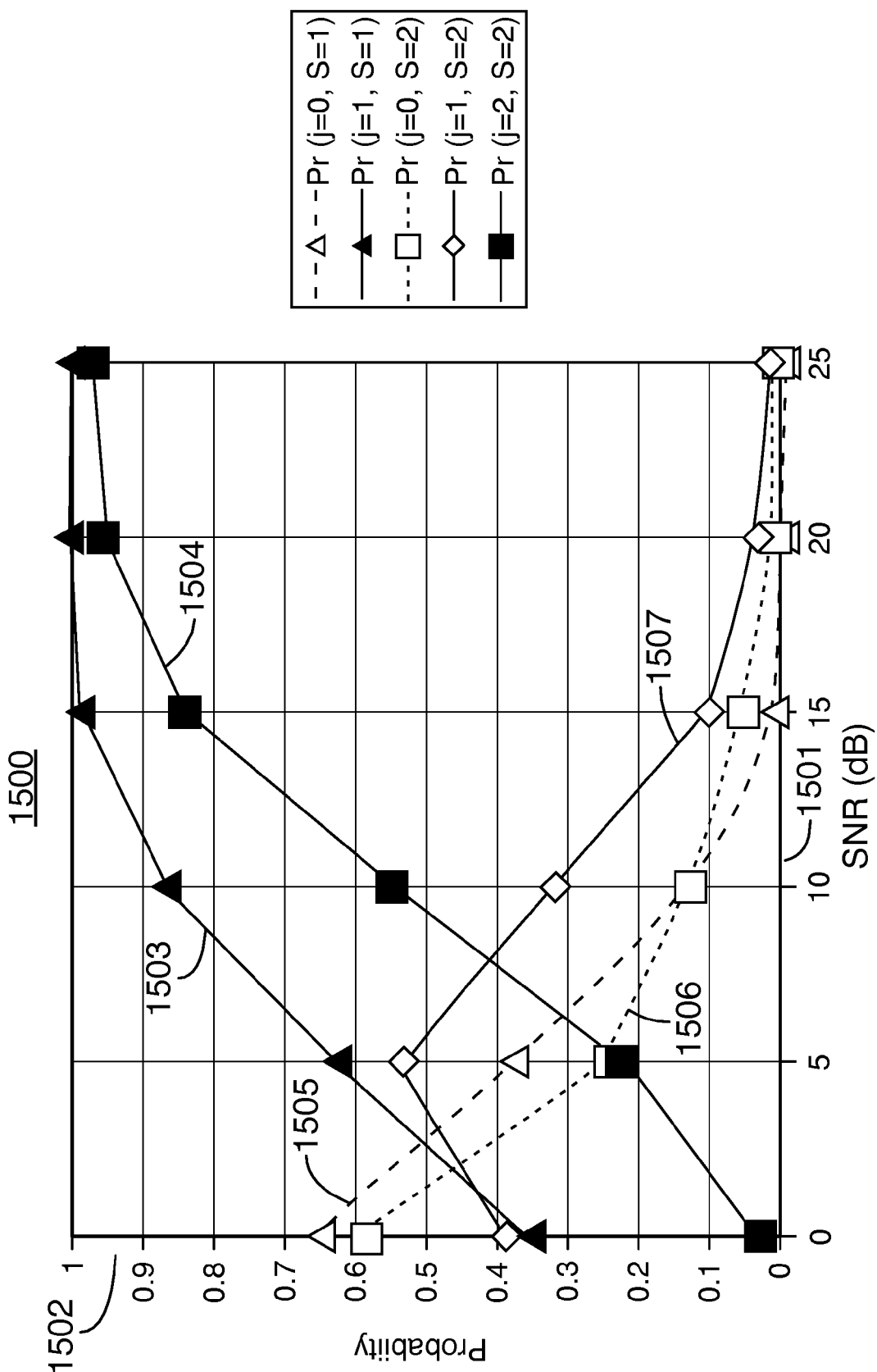
FIG. 15 illustrates simulated results of the performance of one embodiment of a sensor-based wireless communication system using compressive sampling in accordance with various aspects set forth herein.

FIG. 15 illustrates simulated results of the performance of one embodiment of a sensor-based wireless communication system using compressive sampling in accordance with various aspects set forth herein, where the performance of system 800 was measured using N=20, M=10, S=1 or 2, and random matrices. The graphical illustration in its entirety is referred to by 1500. The logarithmic magnitude of the SNR ratio is shown on abscissa 1501 and is plotted in the range from 0 dB to 25 dB. The probability of detection ("Pr (detect)") is shown on ordinate 1502 and is plotted in the range from zero, corresponding to zero probability, to one, corresponding to one hundred percent probability. Graphs 1503, 1504, 1505, 1506 and 1507 represent simulation results for system 800, where N is twenty, M is ten, S is one or two and random iid Gaussian values are used to populate the sparse representation matrix ("Ψ") and the sensing matrix ("Φ"). Graph 1503 shows the probability of detecting one non-zero entry in a quantized estimate of the information signal ("x"), where S is one. Graph 1504 shows the probability of correctly detecting two non-zero entries in a quantized estimate of the information signal ("x"), where S is two. Graph 1505 shows the probability of correctly detecting no non-zero entries in a quantized estimate of the information signal ("x"), where S is one. Graph 1506 shows the probability of correctly detecting no non-zero entries in a quantized estimate of the information signal ("x"), where S is two. Graph 1507 shows the probability of correctly detecting one non-zero entry in a quantized estimate of the information signal ("x"), where S is two.

Figure 16:
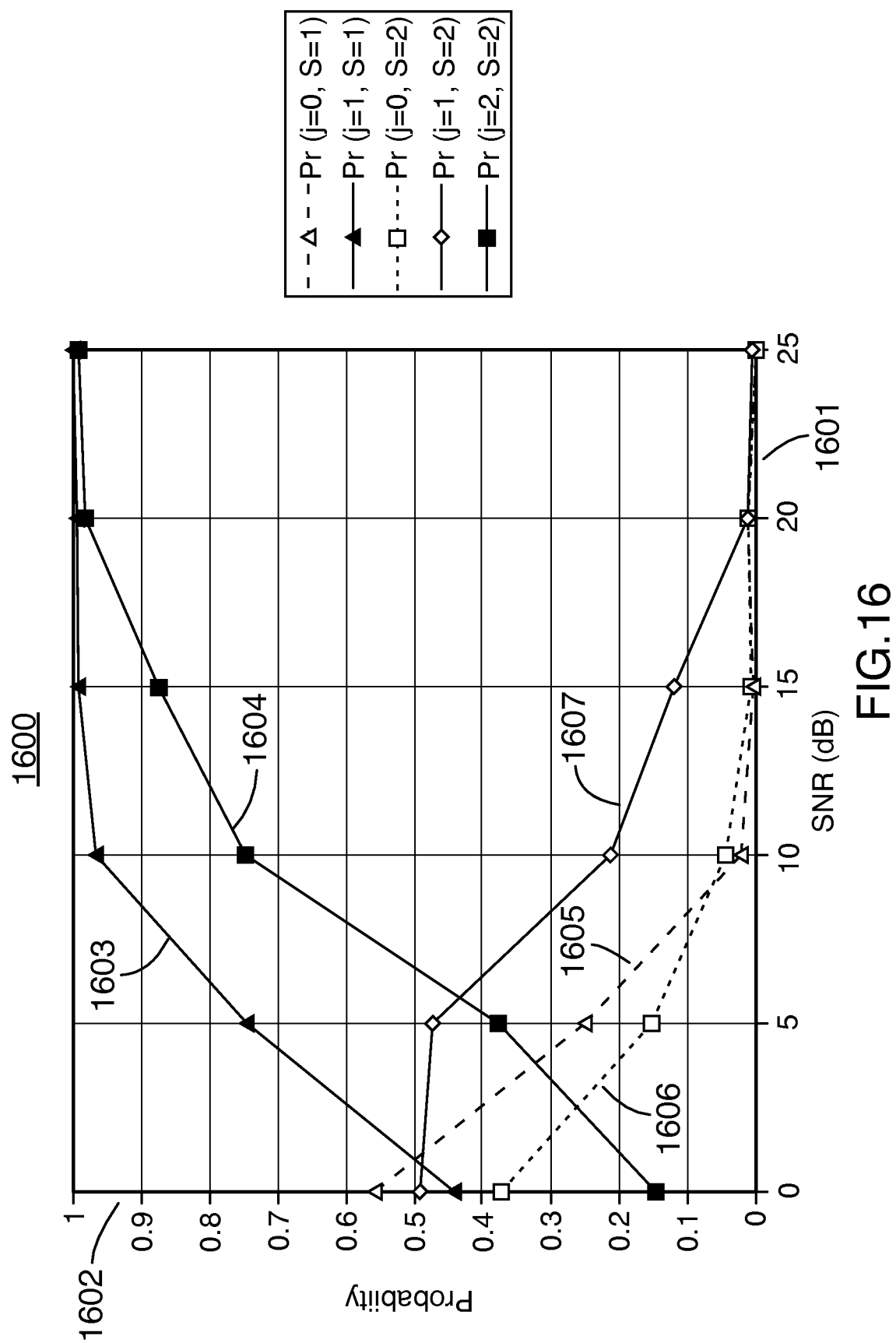
FIG. 16 illustrates simulated results of the performance of one embodiment of a sensor-based wireless communication system using compressive sampling in accordance with various aspects set forth herein.

FIG. 16 illustrates simulated results of the performance of one embodiment of a sensor-based wireless communication system using compressive sampling in accordance with various aspects set forth herein, where the performance of system 800 was measured using N=10, M=3, S=1, and deterministic or random matrices. The graphical illustration in its entirety is referred to by 1600. The logarithmic magnitude of the SNR ratio is shown on abscissa 1601 and is plotted in the range from 0 dB to 25 dB. The probability of detection ("Pr (detect)") is shown on ordinate 1602 and is plotted in the range from zero, corresponding to zero probability, to one, corresponding to one hundred percent probability. Graphs 1603, 1604, 1605, 1606 and 1607 represent simulation results for system 800, where N is twenty, M is ten, S is one or two and deterministic values are used for the sparse representation matrix ("Ψ") and the sensing matrix ("Φ"). Graph 1603 shows the probability of correctly detecting one non-zero entry in a quantized estimate of the information signal ("x"), where S is one. Graph 1604 shows the probability of correctly detecting two non-zero entries in a quantized estimate of the information signal ("x"), where S is two. Graph 1605 shows the probability of correctly detecting no non-zero entries in a quantized estimate of the information signal ("x"), where S is one. Graph 1606 shows the probability of correctly detecting no non-zero entries in a quantized estimate of the information signal ("x"), where S is two. Graph 1607 shows the probability of correctly detecting one non-zero entry in a quantized estimate of the information signal ("x"), where S is two.

Figure 17:
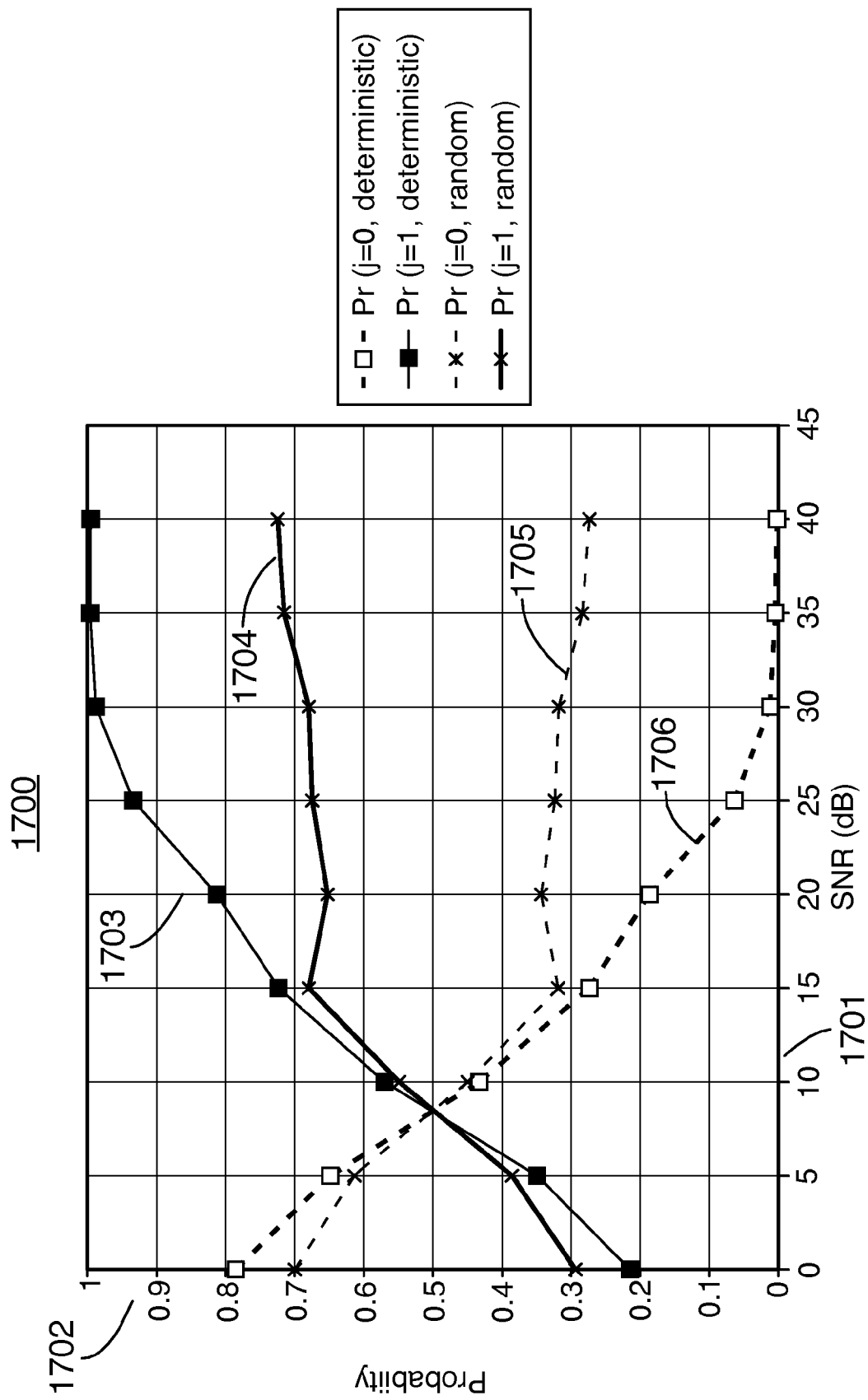
FIG. 17 illustrates simulated results of the performance of one embodiment of a sensor-based wireless communication system using compressive sampling in accordance with various aspects set forth herein.

FIG. 17 illustrates simulated results of the performance of one embodiment of a sensor-based wireless communication system using compressive sampling in accordance with various aspects set forth herein, where the performance of system 800 was measured using N=10, M=3, S=1, and random or deterministic matrices. The graphical illustration in its entirety is referred to by 1700. The logarithmic magnitude of the SNR ratio is shown on abscissa 1701 and is plotted in the range from 0 dB to 45 dB. The probability of detection ("Pr (detect)") is shown on ordinate 1702 and is plotted in the range from zero, corresponding to zero probability, to one, corresponding to one hundred percent probability. Graphs 1703, 1704, 1705 and 1706 represent simulation results for system 800, where N is ten, M is three and S is one. Graph 1703 shows the probability of correctly detecting one non-zero entry in a quantized estimate of the information signal ("x"), where deterministic matrices are used. Graph 1704 shows the probability of correctly detecting one non-zero entry in a quantized estimate of the information signal ("x"), where iid Gaussian random matrices are used. Graph 1705 shows the probability of correctly detecting no non-zero entries in a quantized estimate of the information signal ("x"), where iid Gaussian random matrices are used. Graph 1706 shows the probability of correctly detecting no non-zero entries in a quantized estimate of the information signal ("x"), where deterministic matrices are used.

Figure 18:
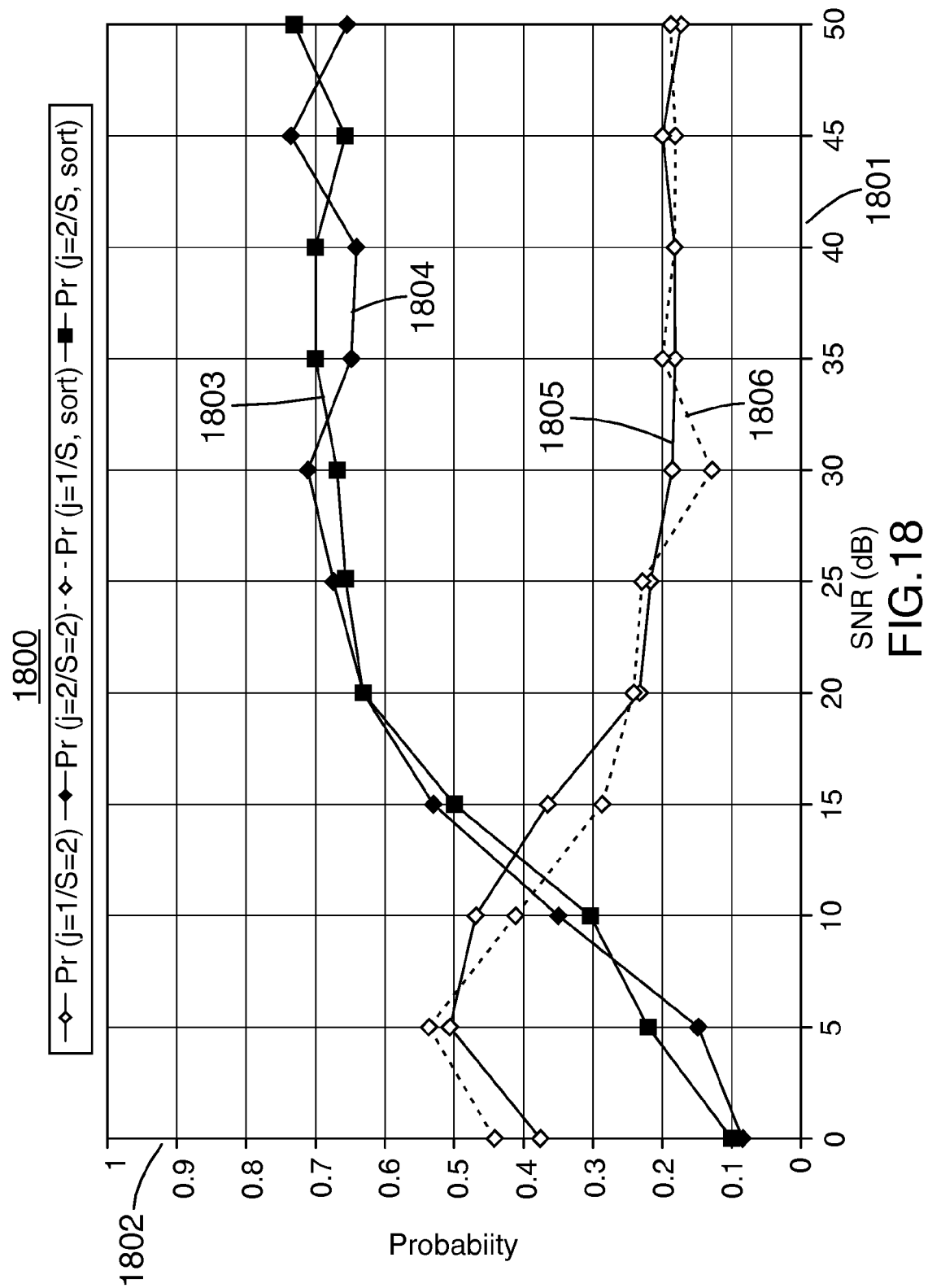
FIG. 18 illustrates simulated results of the performance of one embodiment of a sensor-based wireless communication system using compressive sampling in accordance with various aspects set forth herein.

FIG. 18 illustrates simulated results of the performance of one embodiment of a sensor-based wireless communication system using compressive sampling in accordance with various aspects set forth herein, where the performance of system 800 was measured using N=10, M=5, S=2, and random matrices. Further, the sparse representation matrix ("Ψ") and the sensing matrix ("Φ") were varied prior to each transmission of the information signal ("x"). The graphical illustration in its entirety is referred to by 1800. The logarithmic magnitude of the SNR ratio is shown on abscissa 1801 and is plotted in the range from 0 dB to 50 dB. The probability of detection ("Pr (detect)") is shown on ordinate 1802 and is plotted in the range from zero, corresponding to zero probability, to one, corresponding to one hundred percent probability. Graphs 1803, 1804, 1805 and 1806 represent simulation results for system 800, where N is ten, M is five, S is two, random iid Gaussian matrices are used for the sparse representation matrix ("Ψ") and the sensing matrix ("Φ") and the random matrices are regenerated prior to each transmission. Graph 1803 shows the probability of detecting two non-zero entries in a quantized estimate of the information signal ("x"). Graph 1804 shows the probability of detecting two non-zero entries in a quantized estimate of the information signal ("x"), where any two sensing waveforms ("$\phi_j$") of sensing matrix ("Φ") are substantially incoherent. Graph 1805 shows the probability of detecting one non-zero entry in a quantized estimate of the information signal ("x"), where any two sensing waveforms ("$\phi_j$") of sensing matrix ("Φ") are substantially incoherent. Specifically, graph 1804 and graph 1805 also represent the effect of rejecting any two sensing waveforms ("$\phi_j$") of sensing matrix ("Φ") having a correlation magnitude greater than 0.1. Graph 1806 shows the probability of detecting one non-zero entry in a quantized estimate of the information signal ("x").

Figure 19:
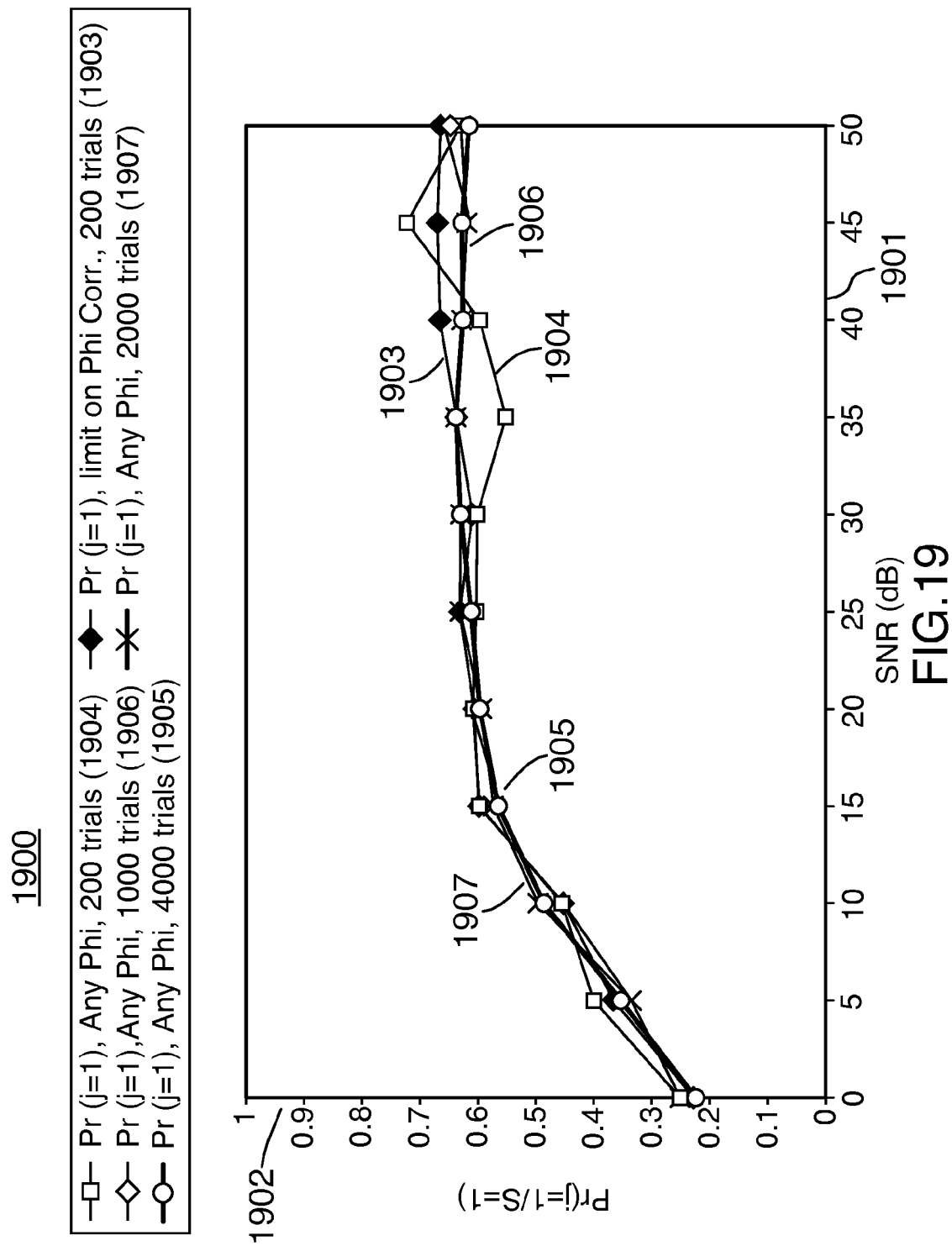
FIG. 19 illustrates simulated results of the performance of one embodiment of a sensor-based wireless communication system using compressive sampling in accordance with various aspects set forth herein.

FIG. 19 illustrates simulated results of the performance of one embodiment of a sensor-based wireless communication system using compressive sampling in accordance with various aspects set forth herein, where the performance of system 800 was measured using N=10, M=3, S=1, random matrices, and various number of trials. Further, the sparse representation matrix ("Ψ") and the sensing matrix ("Φ") were varied prior to each transmission of the information signal ("x"). The graphical illustration in its entirety is referred to by 1900. The logarithmic magnitude of the SNR ratio is shown on abscissa 1901 and is plotted in the range from 0 dB to 50 dB. The probability of detection ("Pr (detect)") is shown on ordinate 1902 and is plotted in the range from zero, corresponding to zero probability, to one, corresponding to one hundred percent probability. Graphs 1903, 1904, 1905, 1906 and 1907 represent simulation results for system 800, where N is ten, M is three, S is one, random iid Gaussian matrices are used for the sparse representation matrix ("Ψ") and the sensing matrix ("Φ") and the random matrices are regenerated prior to each transmission. Graph 1903 shows the probability of detecting one non-zero entry in a quantized estimate of the information signal ("x"), where any two sensing waveforms ("$\phi_j$") of sensing matrix ("Φ") are substantially incoherent and two hundred trials are performed. Specifically, graph 1903 also represents the effect of rejecting any two sensing waveforms ("$\phi_j$") of sensing matrix ("Φ") having a correlation magnitude greater than 0.1. Graph 1904 shows the probability of correctly detecting one non-zero entry in a quantized estimate of the information signal ("x"), where two hundred trials are performed. Graph 1905 shows the probability of correctly detecting one non-zero entry in a quantized estimate of the information signal ("x"), where four thousand trials are performed. Graph 1906 shows the probability of correctly detecting one non-zero entry in a quantized estimate of the information signal ("x"), where one thousand trials are performed. Graph 1907 shows the probability of correctly detecting one non-zero entry in a quantized estimate of the information signal ("x"), where two thousand trials are performed.

FIG. 20 is an example of deterministic matrices used in one embodiment of a sensor-based wireless communication system using compressive sampling in accordance with various aspects set forth herein. The example of the deterministic matrices is collectively referred to as 2000. Matrices 2001 and 2002 are representative of the deterministic matrices that can be used in systems 100, 200, 300, 400, 600 and 800, where N is ten and M is five. Matrix 2001 can represent the transform of the sensing matrix ("Φ"). Matrix 2002 can represent the sparse representation matrix ("Ψ").

Figure 21:
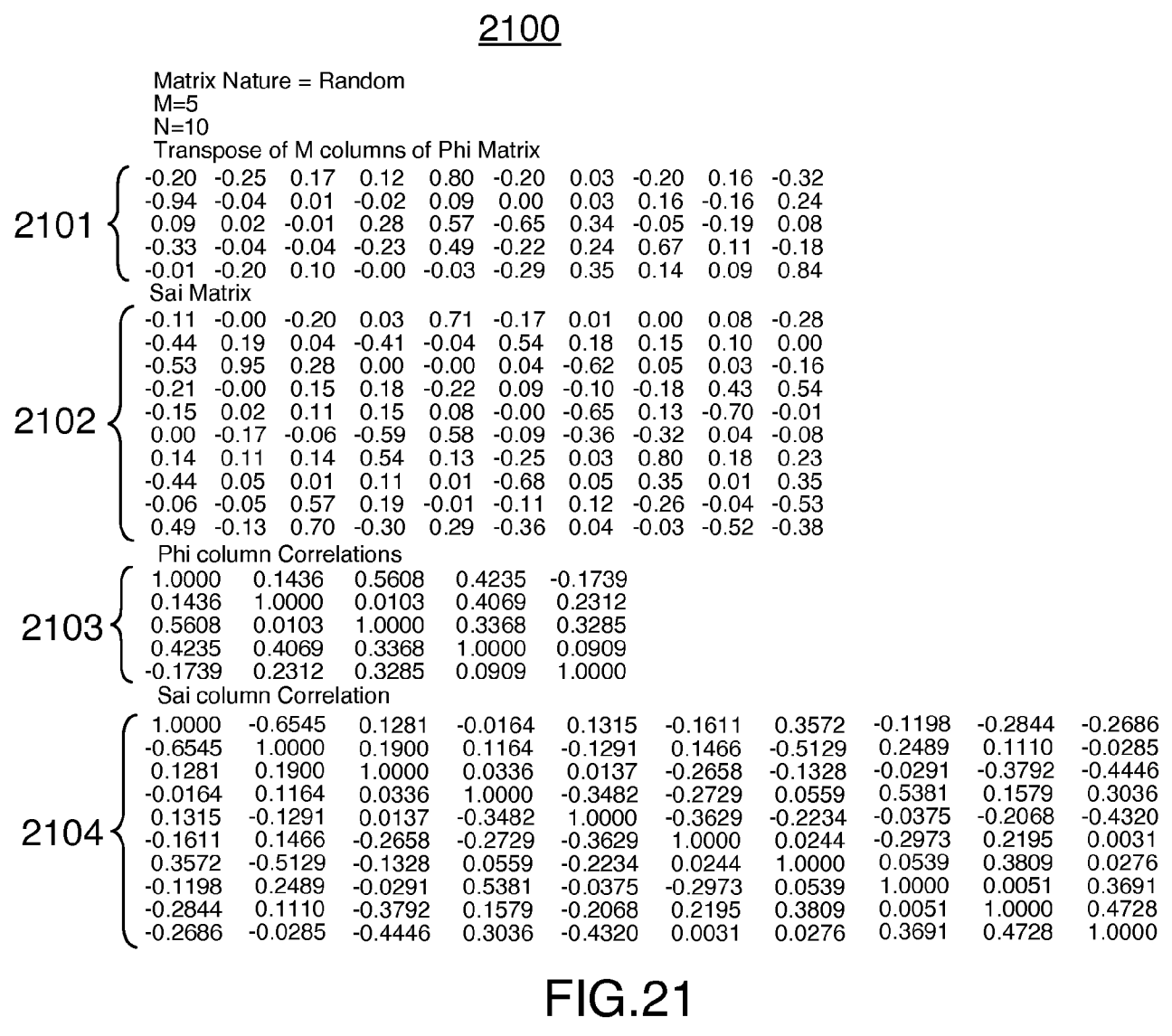

FIG. 21 is an example of random matrices used in one embodiment of a sensor-based wireless communication system using compressive sampling in accordance with various aspects set forth herein. The example of the random matrices is collectively referred to as 2100. Matrices 2101 and 2102 are representative of the random matrices that can be used in systems 100, 200, 300, 400, 600 and 800, where N is ten and M is five. Matrix 2101 can represent the transform of the sensing matrix ("Φ"). Matrix 2102 can represent the sparse representation matrix ("Ψ").

Figure 22:
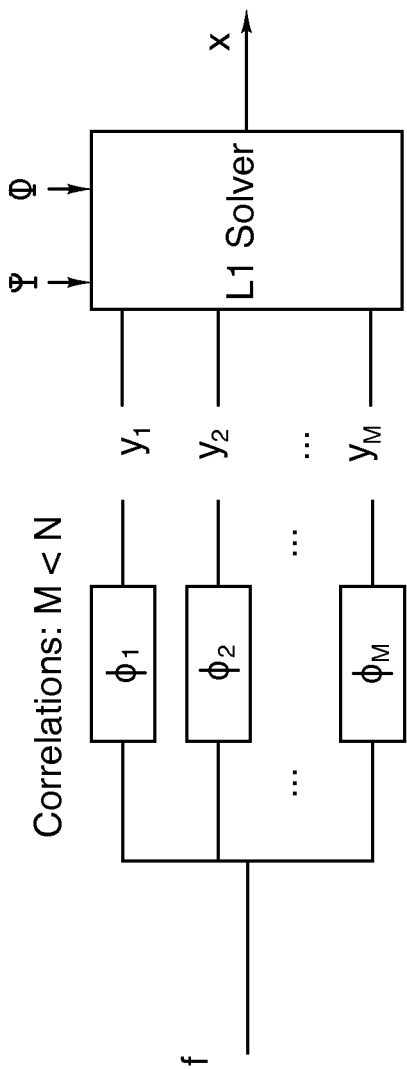
FIG. 22 illustrates an example of an incoherent sampling system in a noise-free environment.

A different way of sampling is shown in FIG. 22. This figure is based on [CW08]. The sampler in FIG. 22 is a set of sensing waveforms, Φ. The signal, x, can be recovered without error if f is sparse. An N dimensional signal is S-sparse, if in the representation f=Ψx, x only has S nonzero entries (see [CW08, page 23]). Representation parameters are the parameters which characterize the variables in the expression f=Ψx. These parameters include the number of rows in Ψ, i.e. N, the values of the elements of Ψ, and the number of nonzero entries in x, i.e. S. The steps of sampling and recovery in FIG. 22 are replaced by a new pair of operations, sensing and solving.

Step 1. Sensing.

$$y_k = (f, \phi_k), k \in j \text{ such that } j \subset \{1 \ldots N\} \quad (4)$$

Step 2. Solving.

$$\min_1 (x^- \in R^-N) \|x^-\|, (l_1 1) \text{ subject to } y, k = (\phi_t k, \Psi x^-), (k \in j) \quad (5)$$

Equations (1) and (2) are from [CW08, equations 4 and 5]. In Eq. (1), the brackets ( ), denote inner product, also called correlation. The l1 norm, indicated by $\|x^-\|1$, is the sum of the absolute values of the elements of its argument.

In order to use as few sensing waveforms as possible, the coherence between the vectors of the basis, Ψ and the vectors used for sensing taken from Φ must be low [CW08, equations 3 and 6]. The coherence, μ is given by $$\mu(\Phi, \Psi) = \sqrt{N} \max_{1 \le k, j \le N} \|\langle \phi_k, \psi_j \rangle\|_{l_1} \quad (6)$$

The Incoherent Sampling Method for designing a sampling system (compare with [CW08]) is:
1 Model f and discover in Ψ which f is S-sparse.
2 Choose a Φ which is incoherent with Ψ.
3 Randomly select M columns of Φ, where M>S.
4 Sample f using the selected φ vectors to produce y.
5 Pass Ψ, Φ and y to an $l_1$ minimizer, and recover x.

One method which can be applied for $l_1$ minimization is the simplex method [LY08].

Figure 23:
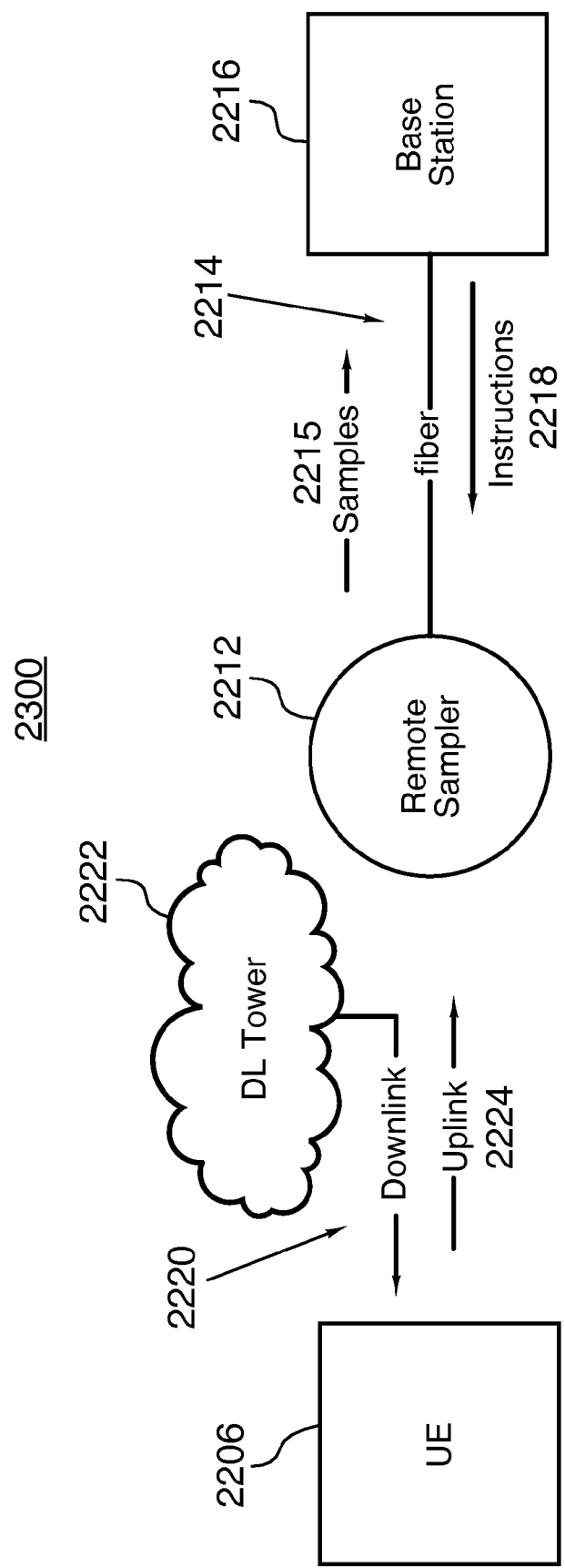
FIG. 23 illustrates another embodiment of a sensor-based wireless communication system using compressive sampling in accordance with various aspects set forth herein.

An embodiment of the invention shown in FIG. 23 includes a low power receiver. The RF portions of the low power receiver can be implemented as taught in [ESY05, KJR+06]. The figure represents a multiple access system 2300. The multiple Access Schemes that can be used in the system, include FDMA, TDMA, DS-CDMA, TD/CDMA using FDD and TDD modes [Cas04, pp. 23-45, 109] and OFDM access scheme [AAN08]. The system includes a user equipment or UE 2206 and an infrastructure 2210. The UE 2206 includes a mobile station, cellular-radio equipped laptop computer, and smart phone. The infrastructure 2210 includes the parts of the cellular system, which is not the UE, such as remote samplers 2212, base station 2216, central brain, and DL tower 2222. The remote samplers 2212 includes a device consisting of an antenna, a down-conversion RF section, a correlating section, a controller or state machine for receiving instructions over a backhaul, a memory for storing a configuration and optical transmitter to send the correlation results or value over a fiber (back-haul) to the base station 2216. Each base station 2216 will be fed by more than one remote sampler 2212, in general. Remote samplers 2212 may be deployed in a system using the Central Brain concept, or in a system not using the Central Brain concept.

Conversion includes representing an input waveform is some other form suitable for transmission or computation. Examples are shifting the frequency of a signal (down conversion), changing from analog to digital form (A to D conversion).

The central brain is a high-powered infrastructure component which can carry out computations at a very high speed with acceptable cost. The central brain includes infrastructure components which can communicate with the base stations quickly so that many physical layer computing activities can be carried out at the Central Brain. Radio control via the base station and the DL tower is not so slow as to be infeasible to overcome communications impairments associated with the rate of fading of the channel. The Central Brain and the Base Station may physically be the same computer or infrastructure component. The base station transmitter is located at the DL (downlink) Tower 2222 which includes a conventional cellular tower, cellular transmitters mounted on buildings, light poles or low power units in offices.

The downlink, DL 2220 is the flow of information-bearing RF energy from the infrastructure to the User Equipment or UE. This includes radio signals transmitted by the DL tower 2222 and received by a UE 2206.

Fading includes descriptions of how a radio signal can be bounced off many reflectors and the properties of the resulting sum of reflections. Please see [BB99, Ch. 13] for more information on fading.

Environmental parameters includes the range from the UE to the remote sampler, the range from the UE to the DL tower, the SNR at any remote sampler of interest and any co channel signal which is present and any fading.

There are several kinds of access in cellular systems. Aloha random access takes place when the UE wishes to reach the infrastructure, but the infrastructure does not know the UE is there. Two-way data exchange takes place after the UE has been given permission to use the system and UL and DL channels have been assigned. For more discussion of access, please see [Cas04, pg. 119].

"Channels" include permitted waveforms parameterized by time, frequency, code and/or space limitations. An example would by a particular TDMA slot in a particular cell sector in a GSM system. User data and/or signaling information needed for maintaining the cellular connection are sent over channels.

The term "Base Station" is used generically to include description of an entity which receives the fiber-borne signals from remote samplers, hosts the l1 solver and Quantizer and operates intelligently (that is, runs computer software) to recognize the messages detected by the Quantizer to carry out protocol exchanges with UEs making use of the DL. It generates the overhead messages sent over the DL. It is functionally part of the Central Brain concept created by RIM. A "Solver" includes a device which uses the l1 distance measure. This distance is measured as the sum of the absolute values of the differences in each dimension. For example, the distance between (1.0, 1.5, 0.75) and (0, 2.0, 0.5) is |1−0|+|1.5−2.0|+|0.75−0.5|=1.75. A "Quantizer" includes a device which accepts an estimate as input and produces one of a finite set of information symbols or words as output.

The base station receiver, solver, quantizer, and a controller are at the point called "base station" 2216 in the figure. The base station 2216 and DL Tower 2222 could be co-located, and in any event they are completely connected for signaling purposes. Uplink 2224 is the flow of information-bearing RF energy from the UE 2206 to the infrastructure 2210. This includes radio signals transmitted by the UE 2206 and received by one or more remote samplers 2212.

Cellular systems provide multiple access to many mobile users for real time two way communication. Examples of these systems are GSM, IS-95, UMTS, and UMTS-Wi-Fi [Cas04, pg. 559].

A mixed macro/micro cellular network includes large cells for vehicles and small cells for pedestrians [Cas04, pg. 45]. For a general perspective on cellular system design, the GSM or WCDMA systems are suitable reference systems. That is, they exhibit arrangements of mobile stations (UEs), base stations, base station controllers and so on. In those systems various signaling regimes are used depending on the phase of communication between the UE and the infrastructure such as random access, paging, resource allocation (channel assignment), overhead signaling (timing, pilot system id, channels allowed for access), handover messaging, training or pilot signals on the uplink and downlink and steady state communication (voice or data, packet or circuit).

Feeding an unsampled analog signal to a base station via a fiber was presented in [CG91]. In Chu, a kind of transducer is attached to an antenna and feeds a fiber. The transducer in [CG91] does not sample the RF signal, it simply converts it to optical energy using an analog laser transmitter. Part of the novelty of this invention is the number and nature of values sent to the base station from a remote antenna and how the number and nature is controlled.

Figure 24:
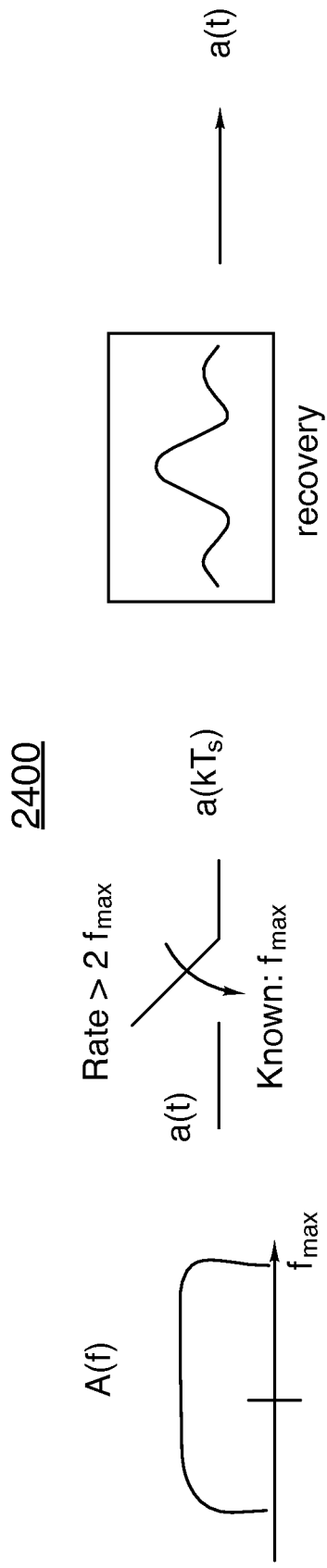
FIG. 24 illustrates an example of a prior art lossless sampling system.

FIG. 24 is often thought of in the context of lossless sampling. If the power spectrum of a signal A(f) is zero for |f|>fmax, then the time domain signal a(t) can be represented based on discrete samples taken at rate 2fmax [Pro83, page 71]. In this general scenario, the only thing the sampler knows about A(f) is that it is zero above fmax.

For a radio system in which the sampler is locked to the chip rate, in general, lossless sampling would consist of sampling once per chip. For an N chip waveform, which includes a frame defined at N discrete, sequential points in time, this would mean N samples per chip-level codeword. The frame might be a frame ready for conversion to passband for transmission, or it might simply be a frame of boolean, real, or complex values inside of a computing device or memory. In one embodiment of this invention, N chip waveforms are sensed with M values, where M<N. "Frame" includes a collection of time samples captured in sequence. It may also describe a collection of boolean (or real or complex) values generated in sequence.

"Noise" includes an additive signal, which distorts the receiver's view of the information it seeks. The source may be thermal noise at receive antenna, or it may be co channel radio signals from undesired or other desired sources, or it may arise from other sources. The basic theory of detection of signals in noise is treated in [BB99, Ch. 2.6].

"Performance" includes how well a radio system is doing according to a designer's intended operation. For instance, the designer may wish that when a UE powers up and recognizes an overhead signal, it will send a message alerting the base station. The performance of the base station detection of this signal includes the probability that the base station will recognize a single transmission of that message. The performance varies depending on the system parameters and environmental factors. "System parameters" includes the length of message frames, the number of sensing waveforms and the sparseness of the messages being sent.

The Uplink is the flow of information-bearing RF energy from the UE to the infrastructure. This includes radio signals transmitted by the UE and received by one or more remote samplers. Incoherent sampling includes a kind of compressive sampling which relies on sensing waveforms (columns Φ) which are unrelated to the basis, Ψ, in which the input signal is sparse. This report discloses simple sampling and low rate data transmission to conserve battery power at the remote sampler, please see FIG. 25. Compressive sampling includes a technique where a special property of the input signal, sparseness, is exploited to reduce the number of values needed to reliably (in a statistical sense) represent a signal without loss of desired information. Here are some general points about the inventive architecture.

1. The overall cellular system continues to operate with full performance even if a sampler stops working.

2. The remote samplers are widely distributed with a spacing of 30 to 300 m in building/city environments.

3. The base station is not limited in its computing power.

4. The cellular system downlink is provided by a conventional cell tower, with no unusual RF power limitation.

5. UE battery is to be conserved, the target payload data transmission power level is 10 to 100 µWatts.

6. Any given remote sampler is connected to the base station by a fiber optic. One alternative for selected sampler deployments would be coaxial cable.

7. If possible, the remote sampler should operate on battery power. Using line power (110 V, 60 Hz in US) is another possibility.

From the overall system characteristics, we infer the following traits of a remote sampler.

1. The remote sampler is very inexpensive, almost disposable.

2. The remote sampler battery must last for 1-2 years.

3. The remote sampler power budget will not allow for execution of receiver detection/demodulation/decoding algorithms.

4. The remote sampler will have an RF down conversion chain and some scheme for sending digital samples to the base station.

5. The remote sampler will not have the computer intelligence to recognize when a UE is signaling.

6. The remote sampler can receive instructions from the base station related to down conversion and sampling.

Examples of modulation schemes are QAM and PSK and differential varieties [Pro83, pp. 164, 188], coded modulation [BB99, Ch. 12].

From those traits, these Design Rules emerge:

Rule A: Push all optional computing tasks from the sampler to the base station.

Rule B: Drive down the sampler transmission rate on the fiber to the lowest level harmonious with good system performance.

Rule C: In a tradeoff between overall system effort and sampler battery saving, overpay in effort.

Rule D: Make the sampler robust to evolutionary physical layer changes without relying on a cpu download.

Figure 25:
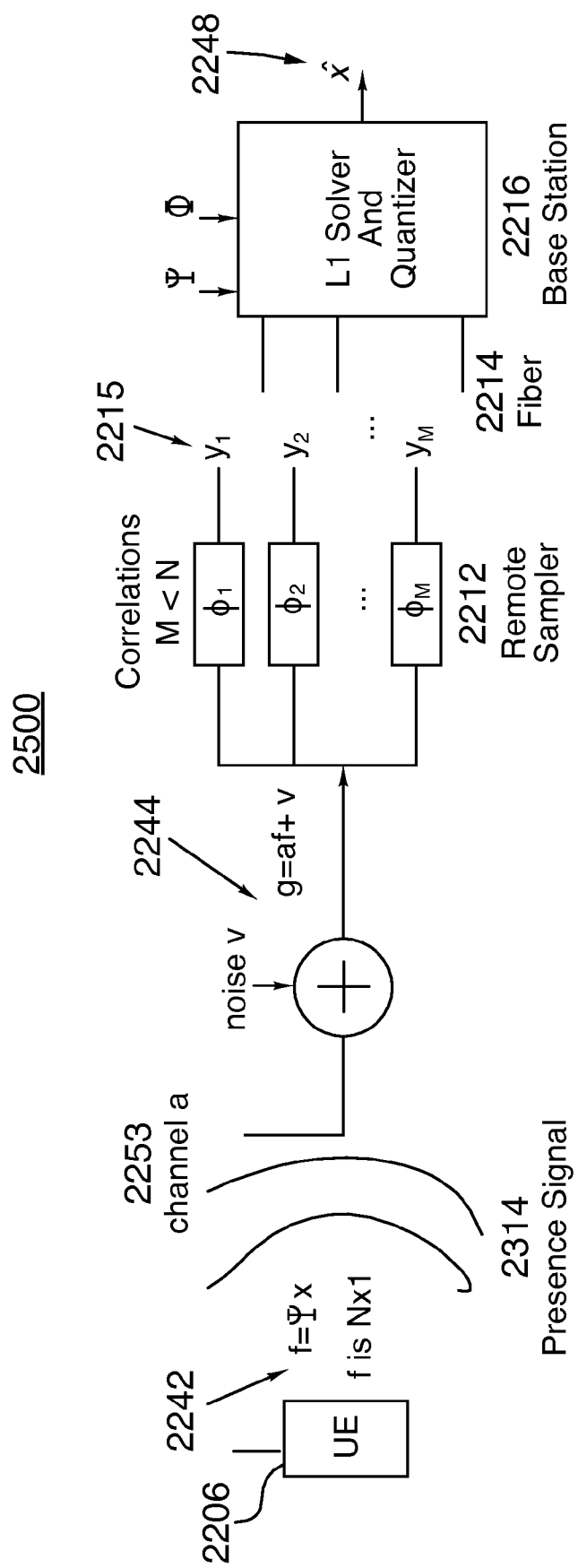
FIG. 25 illustrates another embodiment of a sensor-based wireless communication system using compressive sampling in a noisy environment in accordance with various aspects set forth herein.

From the Design Rules, we arrived at the design sketched in FIGS. 23 and 25.

In this report, we have focused on the problem of alerting the base station when a previously-unrecognized UE (User Equipment or mobile station) is present. The situation is similar to one of the access scenarios described in [LKL+08, "Case 1"], except that we have not treated power control or interference here. There are well known methods to control those issues. The sampler operates locked to a system clock provided by the base station.

Figure 26:
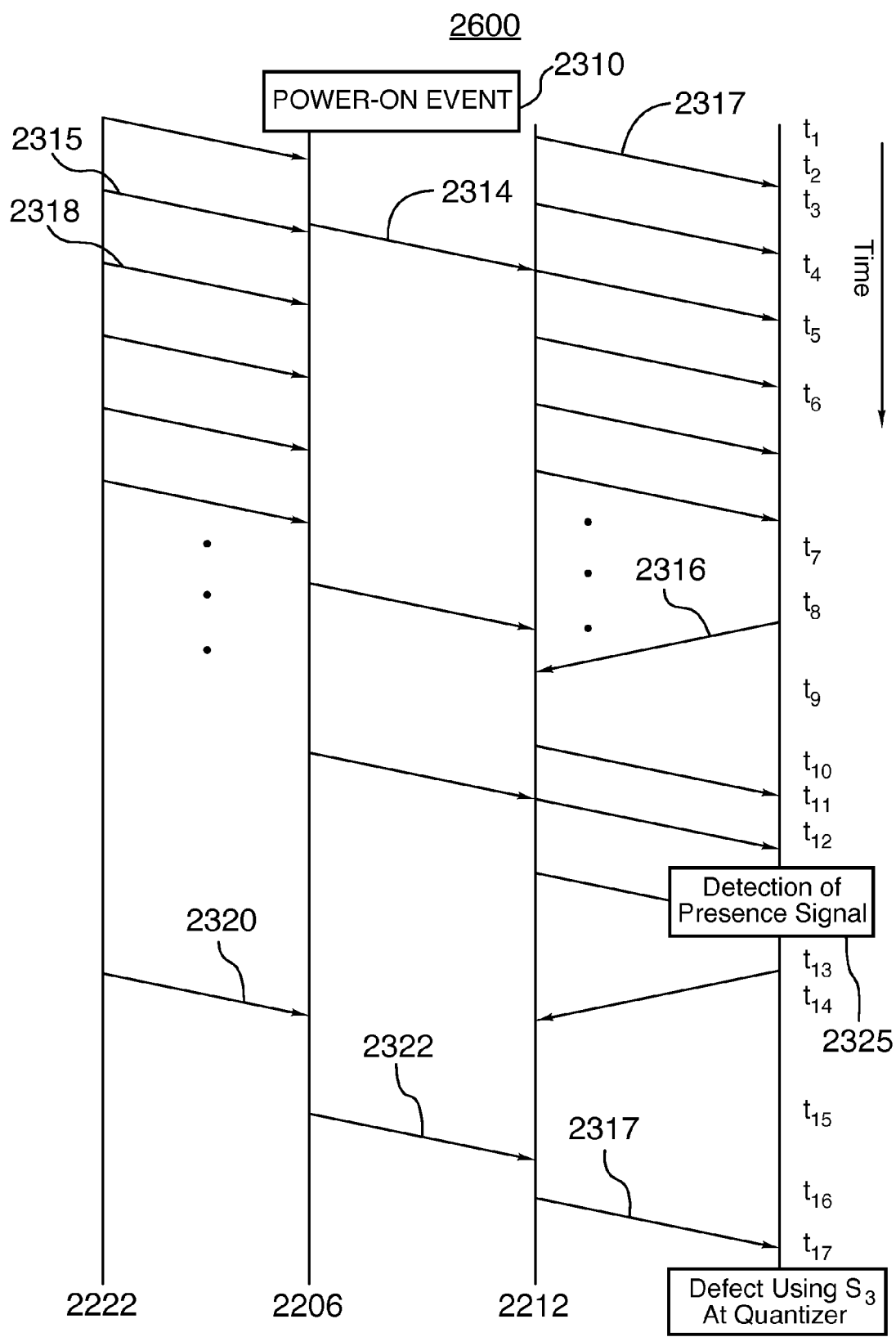
FIG. 26 illustrates another embodiment of an access method in a sensor-based wireless communication system using compressive sampling in accordance with various aspects set forth herein.

See FIG. 26 for an illustration of the messages being sent in cellular system access event that this report is focused on. FIG. 26 is one example situation which illustrates the UE 2206 sending Presence signals 2314. In the figure, the UE 2206 powers on, observes overhead signals 2312, and begins to send Presence Alert signals 2314. The term "Presence Signal" includes any signal which is sent by the UE 2206 to the base station which can be incoherently sampled by sense waveforms. "Sense waveforms" includes a column from the sensing matrix, Φ, which is correlated with a frame of the input to obtain a correlation value. The correlation value is called $y_i$ where i is the column of Φ used in the correlation. In general, the UE 2206 may use Presence Alert signals 2314 whenever it determines, through overhead information 2312, that it is approaching a cell which is not currently aware of the UE 2206. The remote sampler 2212 sends sense measurements, y, continuously unless M=0.

Sense parameters are the parameters which characterize the variables in the expression. Overhead 2312 is sent continuously. The Presence Alert signal 2314 is sent with the expectation that it will be acknowledged. The UE and base station exchange messages in this way: UL is UE 2206 to remote sampler 2212. The remote sampler 2212 continuously senses, without detecting, and sends sense measurements y to the base station 2216 over a fiber optic. The DL is the base station tower 2222 to UE 2206, for instance the message 2318 instructing UEs to use sparsity $S_2$ when sending a Presence signal 2314. A sparse signal includes an N-chip waveform which can be created by summing S columns from an N×N matrix. An important characteristic of this signal is the value of S, "sparsity". For nontrivial signals, S ranges from 1 to N. An instruction 2316 changing the value of M used by the remote sampler 2212 is shown. An indication is a way of messaging to a UE or instructing a remote sampler as the particular value of a particular variable to be used. The figure is not intended to show exactly how many messages are sent.

The UE also has access to the system clock via overhead transmissions from the base station on the downlink (DL). The remote sampler observes a bandwidth of radio energy, B, centered at some frequency fc. Generally, it does not treat B as the only information it has, so it does provide samples at rate 2B over the fiber to the base station. Rather, the sampler obtains N samples of the N chip waveform, and computes M correlations. The resulting M values are sent over the fiber to the base station. If the sampler does not have chip timing lock, it can acquire 2N samples at half-chip timing and compute 2M correlations. The reduction in samples sent to the base station is from 2N for a conventional approach to 2M.

The sampler is able to compute sensing measurements, y, by correlating with independently selected columns of the Φ matrix. Sensing parameters are the parameters which characterize the variables in the correlation of the received signal g with columns of the Φ matrix. These parameters include the number of elements in y, i.e. M, the values of the elements of Φ, and the number of chip samples represented by g, i.e., N. Selection of the columns of the Φ matrix which are used is without any knowledge of x except selection of the value of M itself relies on an estimate of S. So, which columns of Φ are used is independent of Ψ, but the number of columns of Φ used is dependent on an estimate of a property of f. Or, the sparsity of f can be controlled by DL transmissions as shown at time t17 in FIG. 26.

A necessary condition for successful detection of x at the base station, is that the value of M used by the remote sampler must be chosen greater than S. The lack of knowledge of S can be overcome by guessing at the base station, and adjusting thereafter. For instance, M may start out with a maximum value of N, and as the base station learns the activity level of the band B, M can be gear shifted to a lower, but still sufficiently high, value. In this way, power consumption at the remote sampler, both in computing correlations, y, and in transmissions to the base station on the fiber, can be kept low. The base station might periodically boost M (via instruction to the remote sampler) to thoroughly evaluate the sparsity of signals in the band B. The base station can direct the sampler as to which columns it should use, or the sampler may select the columns according to a schedule, or the sampler may select the columns randomly and inform the base station as to its selections.

Detection includes operating on an estimated value to obtain a nearest point in a constellation of finite size. A constellation includes a set of points. For example, if each point in the constellation is uniquely associated with a vector containing N entries, and each entry can only take on the values 0 or 1 (in general, the vector entries may be booleans, or reals, or complex) then the constellation has 2N or fewer points in it.

The UE 2206, upon powering on, wishes to let the system know of its existence. To do this, the UE sends a Presence Alert signal 2314. The Presence Alert signal is an informative signal constructed by selecting columns out of the $\Psi$ matrix and summing them. The selection of columns can be influenced by the base station overhead signal. For instance, the base station may specify a subset of $\Psi$ columns which are to be selected from.

The base station can require, via a DL overhead message 2312, that a UE which has not yet been recognized, to transmit one particular column, say $\psi 0$. This would act as a pilot. The remote sampler 2212 would operate, according to Incoherent Sampling, and send samples y to the base station 2216. The base station 2216 would then process this signal and detect the presence of $\psi 0$, estimate the complex fading channel gain, $\hat{\alpha}$, between the previously-unrecognized UE and the remote sampler, and then instruct any UEs which had been sending $\psi 0$ to commence sending the last two bits of their ESN (Electronic Serial Number, a globally unique mobile station identifier), for example. "Sampling" includes changing a signal from one which has values at every instant of time to a discrete sequence which corresponds to the input at discrete points in time (periodic or aperiodic).

If a collision occurs between transmissions from two different mobile stations the uplink (UL), standard Aloha random back-off techniques may be used to separate subsequent UL attempts.

The remote sampler 2212 is unaware of this protocol progress, and simply keeps sensing with columns from $\Phi$ and sending the samples y to the base station 2216. The base station 2216 may instruct the remote sampler 2212 to use a particular quantity, M, of sensing columns. This quantity may vary as the base station anticipates more or less information flow from the UEs. If the base station anticipates that S, which has a maximum of N, is increasing, it will instruct the remote sampler to increase M (the maximum value M can take on is N). For example, in FIG. 26, the Recognition Message can include a new value of S, $S_2$, to be used by the UE, and at the same time the base station can configure the remote sampler to use a higher value of M, called $M_2$ in the figure. In the figure these events occur at times $t_{12}$, $t_{15}$ and $t_{16}$. At t17 the base station expects a message with sparsity $S_2$ and that that message has probably been sensed with an adequate value of M, in particular the value called here $M_2$. A sequence of events is illustrated, but the timing is not meant to be precise. In the limit as M is increased, if $\Phi$ is deterministic (for example, sinusoidal) and complex, when M takes on the limiting value N, $\Phi$ in the remote sampler has become a DFT operation (Discrete Fourier Transform possibly implemented as an FFT). Continuing with the scenario description, once the base station has a portion of the ESNs of all the UEs trying to access the system, the base station can tell a particular UE, with a particular partial ESN, to go ahead and transmit its full ESN and request resources if it wishes. Or the base station may assign resources, after determining that the UE is eligible to be on this system.

The remote sampler/central brain system conducts information signaling in a noisy environment and with almost no intelligent activity at the remote sampler. The system has the benefit of feedback via a conventional DL. The link budget includes design of a radio system to take account of the RF energy source and all of the losses which are incurred before a receiver attempts to recover the signal. For more details, please see [Cas04, pp. 39-45, 381]. Our initial link budget calculations show that a UE may be able to operate at a transmission power of 10 to 100 µWatts at a range of 20 to 30 m if a reuse factor of 3 can be achieved and a received SNR of 0 to 10 dB can be achieved. These figures are "order of" type quantities with no significant digits. For detection of the presence signal, usually more than one sampler can receive noisy, different, versions of f and joint detection can be done. This will allow M to be lower at each sampler than if f is only visible at one remote sampler. Thus, the battery drain at each sampler is reduced by deploying the samplers in a dense fashion. For brevity, sometimes the noisy version of f is referred to as g.

"Reuse" includes how many non-overlapping deployments are made of a radio bandwidth resource before the same pattern occurs again geographically.

For a worst-case design, we assume the signal from the UE only impinges on one remote sampler. In general, for indoor transmission, we expect two remote samplers to be within a 30 m range with a path loss exponent between 2 and 3. The design is not limited to indoor transmission. Outdoors, the range will be larger, but the path loss exponent will tend to be smaller. For successful detection, the probability of detecting a single transmission should be above 10% (presuming the error mechanism is noise-induced and therefore detection attempts will be independent). The remote sampler can be deployed in macro cells to support vehicular traffic and microcells to support pedestrian or indoor-office communication traffic.

Coming to a concrete example, then, we have fashioned the following scenario.

1. The channel is static (no fading).

2. The noise is AWGN.

3. The UE, remote sampler and base station are all locked to a clock with no timing, frequency or phase errors of any kind. Impairments such as these can be dealt with in standard ways [BB99, Ch. 5.8, Ch. 9].

4. There is one UE.

5. The Incoherent Sampling scheme uses a random pair $(\Psi_r, \Phi_r)$ or a deterministic pair $(\Psi_d, \Phi_d)$, in any case the solver knows everything except the signals x, f and noise.

6. The base station has instructed the sampler to use a specific set of M columns of $\Phi$.

7. The base station has instructed the UE and the sampler that transmission waveforms consist of N intervals or chips.

Figure 27:
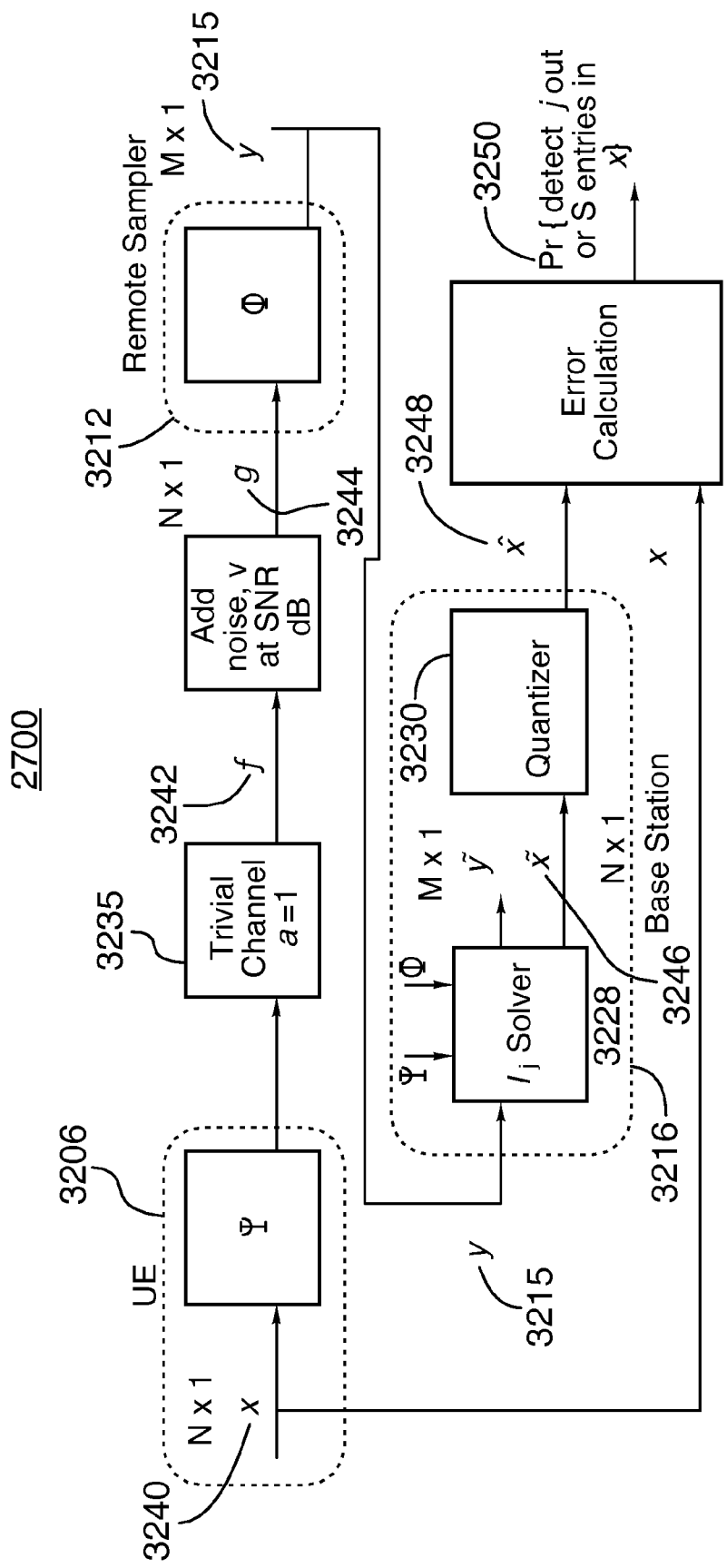
FIG. 27 illustrates another embodiment of a sensor-based wireless communication system using compressive sampling in a noisy environment in accordance with various aspects set forth herein.

FIG. 27 is an illustration of one embodiment of the remote sampler/central brain cellular architecture in accordance with various aspects set forth herein. The information is x 3240. f 3242 is S-sparse, and the base station has estimated S as discussed elsewhere. The input to the remote sampler 3212 is a noisy version of f, sometimes referred to here as g 3244. The remote sampler 3212 computes M correlations of g 3244 with pre-selected columns of $\Phi$, producing the M×1 vector y 3215 (Equation 1). y 3215 is passed down a fiber optic to the base station 3216.

"Estimation" is a statistical term which includes attempting to select a number, $\tilde{x}$, from an infinite set (such as the reals) which exhibits a minimum distance, in some sense, from the true value of x. A frequently used measure of minimum distance is mean-squared error (MSE). Many estimators are designed to minimize MSE, i.e., Expectation $\{(x-\tilde{x})^2\}$. Statistical operations, such as Expectation, are covered in [Pro83, Ch. 1]. In practice, numbers output from estimators are often represented with fixed-point values.

For reals, the correlation, or inner product, of g with $\phi_p$ is computed as $$y_p = \sum_{k=0}^{N-1} \phi_p(k)g(k),$$

where the kth element of g is denoted g(k).

For complex numbers the correlation would be $$y_p = \sum_{k=0}^{N-1} \phi_p(k)g*(k),$$

where g· denotes complex conjugation.

The l2 norm of a signal, g, is $$\|g\|^2 = \sum_{k=0}^{N-1} g(k)g*(k);$$

the expression for reals is the same, the complex conjugation has no effect in that case.

The base station 3216 produces first an estimate of x, called x̃ 3246, and then a hard decision called x̂ 3248. The estimate 3246 is produced by forming a linear program and then solving it using the simplex algorithm. The algorithm explores the boundaries of a feasible region for realizations of the N×1 vector x* which produce vectors y*. The search does not rely on sparsity. The l1 minimization works because the signal is sparse, but the minimizer acts without any attempt to exploit sparsity.

Hence, the N entries in x* are generally all nonzero. That x* which produces a y* which satisfies y*=y and has the minimum sum of absolute values is selected as x̃ (Equation 5). x̃ is generally not equal to x, so a hard decision is made to find the nearest vector x̂ to x consisting of S ones and N−S zeros.

Linear programs include a set of equations and possibly inequalities. The variables only appear in linear form. For example, if x1 and x2 are variables, variables of the form $x_1^2$ do not appear.

The probability that this quantization identifies one or more correct nonzero entries in x is what the simulation is designed to determine. There are many definitions of "nearest". We determine x̂ as follows. The quantizer 3230 first arithmetically-orders the elements of x̃ and retain the indices of the first S elements (e.g., +1.5 is greater than −2.1). Secondly, the quantizer sets all the entries of x̂ to logical zero. Thirdly, the quantizer sets to logical one those elements of x̂ with indices equal to the retained indices. The result is the output of the quantizer.

The Quantizer 3230 obtains S from a variety of ways. Examples would be an all-knowing genie (for limiting performance determination) or that the base station has fixed the value of S to be used by the mobile station, using the DL or that the base station periodically "scans" for S by trying different values (via instruction to the remote sampler) and determining the sparseness of f during some macro period of time, e.g., 1-2 seconds. Because UEs will make multiple attempts, the base station has opportunity to recognize a miss-estimate of S and instruct the remote sampler to reduce or increase the value it is using for S. With a sufficiently low duty cycle on the scanning for S, the power-saving aspect of the sensing technique will be preserved. In this way, the remote sampler's sensing activities track the sparsity of the signals which impinge on it. Thus, the remote sampler is always sampling, in general, but only with a battery drain sufficient for the system to operate, and not much more battery drain than that. In particular, the remote sampler is not sampling at the full Nyquist rate for large periods when there is no UE present at all.

The v⁻ is notation from [CW08, page 24]. The [1] is not notation from [CW08], because that reference does not treat signals corrupted by noise. The x̃ and "x̂" notations for estimates and detected outputs are commonly used in the industry, and can be seen, for example in [Pro83, page 364, FIG. 6.4.4 "Adaptive zero-forcing equalizer"].

FIG. 27 shows the functional pieces and signals in the computer simulation. The nature of the matrices used is specified in Table 1. The columns were normalized to unit length. Please see examples of these matrices in FIGS. 20 and 21

TABLE 1

| | Nature of the Matrices | |
|---|---|---|
| Nature | $\Psi_{ij}$ | $\Phi_{ij}$ |
| Random | iid Gaussian | iid Gaussian |
| Deterministic | 1 if i = j, else 0 | $\cos\left(\frac{\pi ij}{N-}\right)$ cos(ⅰⅰ) |

The deterministic matrices are generated only once, and would not change if generated again. The random matrices might be generated only once, or the random matrices may be regenerated after some time, such as a few seconds. Also the random matrices may be regenerated each time they are to be used. In any case, the solver 3228 must know what Ψ matrix the UE 3206 uses at any time and what Φ matrix the sampler 3212 uses. This does not mean the solver 3228 must dictate what matrices are used. If the UE is changing Ψ according to a pseudo-random ("pn") function of the system time (time obtained via the DL overhead), then the solver 3228 can use the same pn function generator to find out what Ψ was. Unless stated otherwise, the probabilities given in this report are for the case where the random matrices were generated once and fixed for all SNRs and trials at those SNRs.

The simulation has been restricted to real numbers to ease development, but there is nothing in the schemes presented here that limits their application to real numbers. The same building block techniques such as correlation and linear programming can be applied to systems typically modeled with complex numbers. This is true since any complex number a+jb can be written as an all real 2×2 matrix with the first row being [a−b] and the second row being [b a].

This may be done at the scalar or the matrix level. Therefore any complex set of equations can be recast as an all-real set.

TABLE 2

Detector Performance with M = 5, N = 10. AWGN. ψ and Φ with iid Gaussian entries. See FIG. 27.

| SNR (dB) | S | Pr{Total Miss} | Pr{j = 1 hit} | Pr{j = 2 hit} |
|---|---|---|---|---|
| 0 | 1 | 0.67 | 0.32 | n/a |
| 10 | 1 | 0.29 | 0.71 | n/a |
| 20 | 1 | 0.12 | 0.87 | n/a |
| 0 | 2 | 0.44 | 0.46 | 0.09 |

TABLE 2-continued

Detector Performance with M = 5, N = 10. AWGN. ψ and Φ with iid Gaussian entries. See FIG. 27.

| SNR (dB) | S | Pr{Total Miss} | Pr{j = 1 hit} | Pr{j = 2 hit} |
|---|---|---|---|---|
| 10 | 2 | 0.22 | 0.47 | 0.30 |
| 20 | 2 | 0.16 | 0.28 | 0.55 |

In these simulations, the performance we are looking for is anything exceeding about 10%. A high number of trials is not needed as the only random events are the noise, the signal and the matrix generation. The data points were gathered using 100 or 200 trials per point in most cases. In about 0.5% of the trials, our l1 solver implementation attempted to continue the optimization of x when it should have exited with the existing solution. These few trials were tossed out. Even if included either as successes or failures, the effect on the results would be imperceptible, since we are looking for any performance greater than 10%.

The data from Table 3 is plotted in FIG. 14. S is the number of nonzero entries in x and is called "pulses" in FIG. 14. The event "j=1 hit" means that the detector detected exactly one nonzero entry in x correctly. In the case that S=1, that is the best the detector can do. The event "j=2 hit" means that the detector detected exactly two nonzero entries in x correctly.

I also did a simulation with M=3, N=10 and S=1 (please see FIG. 17 discussed below).

TABLE 3

Detector Performance with M = 5, N = 10. AWGN. ψ and Φ with deterministic entries.

| SNR (dB) | S | Pr{Total Miss} | Pr{j = 1 hit} | Pr{j = 2 hit} |
|---|---|---|---|---|
| 0 | 1 | 0.64 | 0.36 | n/a |
| 10 | 1 | 0.13 | 0.87 | n/a |
| 20 | 1 | 0.03 | 0.97 | n/a |
| 0 | 2 | 0.42 | 0.49 | 0.09 |
| 10 | 2 | 0.13 | 0.40 | 0.47 |
| 20 | 2 | 0.07 | 0.19 | 0.74 |

FIGS. 15, 16 and 17 give detection performance for various combinations of M, N, S, SNR and nature of the matrices. In each of these plots j is the number of nonzero entries in x correctly determined by the combination of the l1 minimizer and the Quantizer (FIG. 25).

For system design, the important probability is the probability that the detector gets the message completely right in one observation. The system is assumed to use multiple transmissions, each of which will be independent as to uncontrolled effects like noise. In that case, the probability of detecting the Presence signal in C transmissions or less is 1−Pr(Miss)C. A Miss can be defined either as the event j=0 or the event j<S. When S=1 and with random matrices, the event j=S occurs with probability greater than 10% at SNR below 0 dB, and at S=2 at SNR of about 3 dB. The 90% points are at about 12 and 17 dB respectively as seen in FIG. 15. The performance is better for deterministic matrices and S=1 as seen in FIG. 16.

In order to see how the detector would work when the sparsity condition (M>>S not true) was weak, we generated the data shown in FIG. 17 using S=1 and M=3. Both the random and deterministic configurations are able to detect at low SNR, but the random configuration saturates near 70% rather than reaching the 90% point. The performance for the random configuration is a bit worse than that for M=5, N=10 (e.g. Pr{detection}=0.55 at SNR=10 dB, while with M=5 this probability is 0.71). At high SNR, the probability approaches 1 for the deterministic case, FIG. 17.

Thus, we see that with increasing M and SNR, we approach Candes noise-free result that 100% reliable exact recovery is reached. However, for low M and a noisy signal, sometimes the solver produces x is not equal to x. An important qualitative characteristic is that the degradation is gradual for the deterministic configuration. A threshold effect in noise may exist with the random configuration unless M>>S. In FIG. 17, M=3S, while in all of the other figures M≥5S for S=1.

An unusual characteristic of the Incoherent Sampling Method is the incoherence. Most detectors seek to try many candidate waveforms to see which one matches the received waveform and then use some kind of "choose largest" function to determine the identity, or index, of the transmitted waveform. A local replica is a waveform which has the same identity as a transmitted waveform. In Incoherent Sampling, the only requirement is that Ψ and Φ be weakly related at most. This means that a great variety of sense matrices (Φs) could be used for any Ψ. For the random case, we explored the effect of changing both matrices every transmission. Results for this are shown in FIGS. 18 and 19. From this we noticed some variation in performance, even at high SNR. We confirmed a conjecture that this is due to the generation of "bad" matrices with poor autocorrelation properties. High correlation within either matrix would weaken the estimation ability, since for Ψ it would reduce the support for distinguishing the values of x on any two correlated columns, and for Φ it would reduce the solver's ability to distinguish between candidate contributions from two correlated columns of Φ. To localize the mechanism of these variations at high SNR, we rejected Φ matrices where any two columns had a correlation magnitude greater than a threshold. In the plots the threshold is 0.1. Studies were done with other thresholds. A threshold of 0.4 has almost no effect. What we have learned from this is that, yes, there are wide variations in the effect of the actual Φ matrix on the performance. Another way to put this, is that there are "bad" Φ matrices that we do not want to sense with. The performance is a random variable with respect to the distribution of matrices. This means that a probability of outage can be defined. In particular, the probability of outage is the probability that the probability of detection will fall below a probability threshold. For example, the system can be designed so that not only the average probability of detection is greater than 40%, but the probability that the probability of detection will be less than 10% is less than 1%. We can reduce the number of "bad" matrices in order to reduce the probability of outage. One way to do this is to constrain correlation in the Φ matrices. Constraining the Ψ matrices will also be beneficial, especially as S increases.

Figure 28:
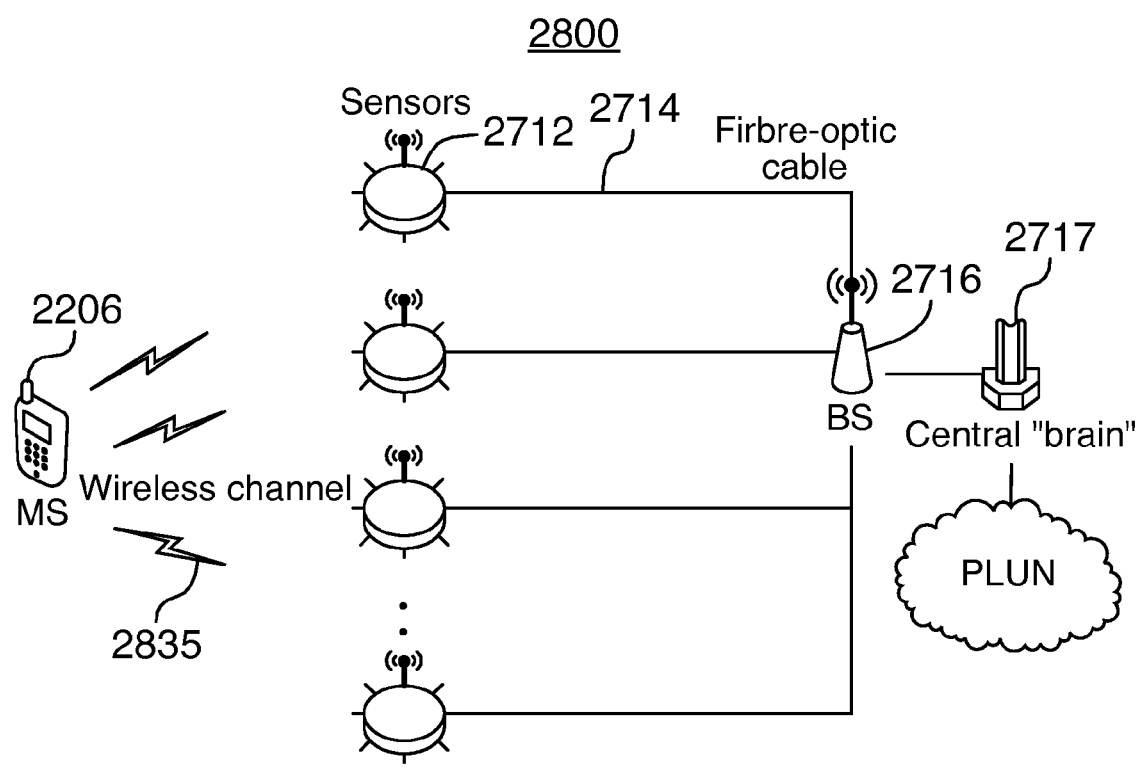
FIG. 28 illustrates another embodiment of a sensor-based wireless communication system using compressive sampling in accordance with various aspects set forth herein.

To provide robust high bandwidth real time service and high user density by radio, we have created an architecture based on dispersed antennas and centralized processing of radio signals. We call the system Remote Conversion or Remote Sampling. The mobile stations are simple low power devices, the infrastructure core is super-computer-like, and the Base Stations are linked to mobile stations by a redundant sea of cheap radio sensors. FIG. 28 is a diagram of the cellular network that we are proposing here. It shows a series of simple sensors 2712 deployed in large numbers such that generally more than one is within the range of the mobile subscriber (MS) device 2206. These sensors may also be referred to as remote samplers or remote conversion devices in this project. The sensors could be separated in the range of ten meters to a few hundreds of meters. There is a deployment tradeoff between the power required for the sensors, the ease of deploying the sensors and the amount of capacity needed in the system. The UE may use frequency bands much higher than typical in cellular telephony.

The sensors are provided a fiber-optic back haul 2714 to a central base station 2716. The backhaul could also be provided by another medium such as coaxial cable. There may be several base stations in a deployment where they communicate and pass information. The sensors have one or more antennas attached to an RF front end and base-band processing that is designed to be inexpensive. The sensors with one antenna can be used as an array and can be made into MIMO air interfaces.

Beam-formed air interfaces allow the MS to transmit at a low power. The upper layer protocol used between the MS and the Base Station could be one from a standardized cellular network (e.g. LTE). Upper Layer Protocols that specialize in low power and short range (e.g. Bluetooth) are alternative models for communications between the MS and Base Station. The stack at the sensor will include only a fraction of layer one (physical). This is to reduce cost and battery power consumption. Possibly the sensors will be powered by AC (110 V power line in US). Low round-trip time hybrid-ARQ retransmission techniques to handle real-time applications can be used; the Layer 2 element handling ARQ will not be in the sensor but rather in the BS or Central Brain. Areas of Innovation A completely new topology is given here in which the sensors compress a high bandwidth mobile signal received at short range and the infrastructure makes physical layer calculations at high speed.

1. Instructions, communication protocols and hardware interfaces between the base station and the sensors
   a. remote conversion instructions
   b. oscillator retuning instructions
   c. beam steering (phase sampling) instructions
2. Communication protocols and hardware interfaces between the MS and the BS or Central Brain
   a. a high bandwidth MAC hybrid-ARQ link between an MS and the BS which can support real-time services.
3. Communication protocols and processing techniques between the MS and the central processor/Central Brain
   a. presence-signaling codes which work without active cooperation from the sensors space time codes for this new topology and mixture of channel knowledge
   c. fountain codes for mobile station registration and real time transmission
   d. large array signal processing techniques
   e. signal processing techniques taking advantage of the higher frequency transmission bands
4. The Base Stations support activities which include the following:
   a. transmission of system overhead information
   b. detection of the presence of mobile stations with range of one or more sensors
   c. two-way real-time communication between the base stations and mobile station.

Figure 29:
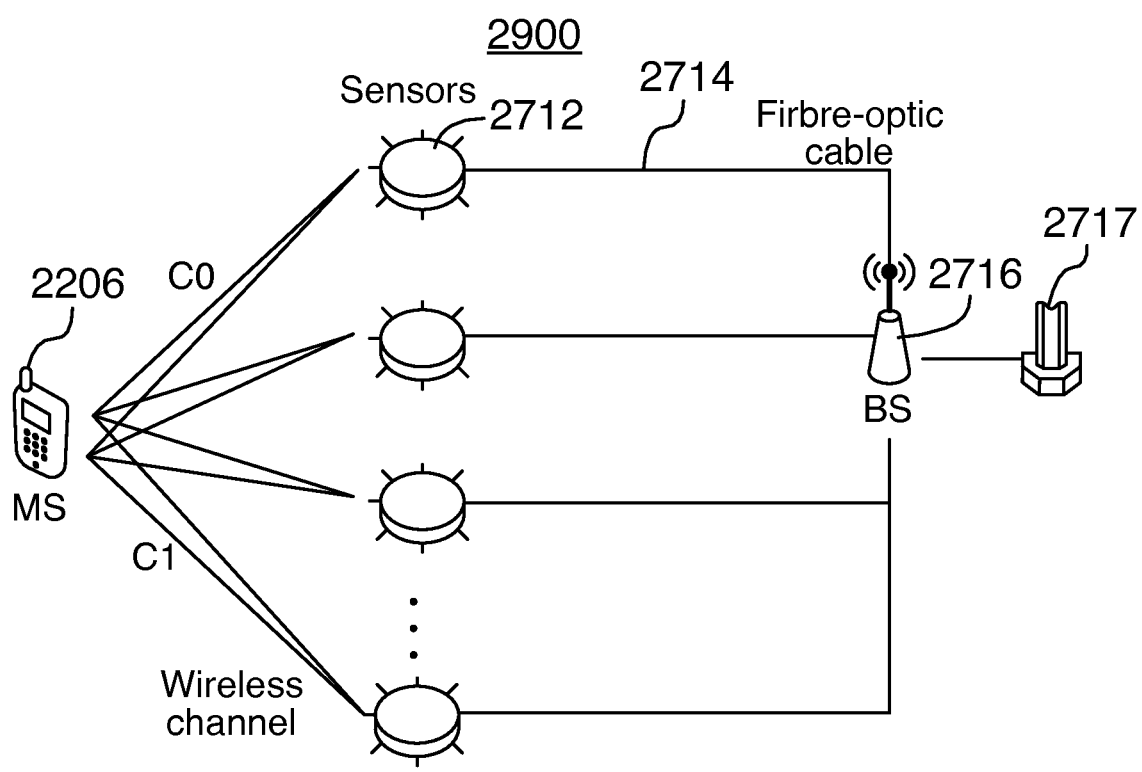
FIG. 29 illustrates another embodiment of a sensor-based wireless communication system using compressive sampling in accordance with various aspects set forth herein.

This memo addresses the sensor or sampler to be used in a cellular telephony architecture. These sensors are cheaper than Base Stations and sample RF signals of high bandwidth, for example bandwidth B. The compressed signals are sent over fiber to the base station. The sensors often do not perform Nyquist sampling. This is done for several reasons. One is that sampling at high rates consumes much energy. We aim to provide low-power sensor technology. Redundancy is expected to be designed into the system so that loss of single sensors can be easily overcome. For many important signals, low-error reconstruction of that signal which is present can be done at the base station. A sensor may be equipped with a direct sequence de-spreader, or an FFT device. The sensors do not make demodulation decisions. The direct sequence code used in the de-spreader, or the sub-chip timing of the de-spreader or the number of bins used in the FFT, or the spectral band the FFT is to be applied to by the sensor are things which the Base Station tells the sensor through an instruction. In one embodiment, these instructions come at 1 ms intervals and the sensor adjusts its sampling or conversion within less than 0.1 ms of receiving the instruction. For purposes of structure, we assume that the mobile station transmits and receives information packets or frames of du-ration 1 to 5 ms. The format may be circuit-like or non-circuit-like. The system overhead information may include guiding and synchronizing information which cause the mobile stations to practice and copy good cooperative behavior according to game theory. There may also be important information provided that the MS needs to know about a possible wireless WAN. By keeping all communications within this sub-communication network and not having to monitor external networks, battery power can be saved. The mobile stations transmit their messages at low power. The sensors sample the wireless channel. The sensors in this proposal compress the samples. The compressed samples in the present proposal are sent over a fiber channel to the base station. The base station is responsible for many layer 1 activities (demodulation, decoding), layer 2 activities (packet numbering, ARQ), and signaling activities (registration, channel assignment, handoff). The computational power of the base station is high. The base station may use this computing power to solve equation systems in real time that would have only been simulated offline in prior systems. The base station can use knowledge of the channel (mobile station antenna correlation matrix, number of sensors in view of the mobile station) to determine link adaptation strategies on a 1 ms interval. These strategies will include operating at the optimum space time multiplexing gain/diversity gain trade-off point. Also multiple base stations can be in almost instantaneous communication with each other, and optimally design transmit waveforms which will sum to yield a distortion-free waveform (dirty paper coding) at the simple mobile station. Other base stations which receive extraneous uplink energy from the mobile station occasionally supply an otherwise-erased 1 ms frame interval to the anchoring base station. FIG. 29 shows another schematic of the proposed system. The sensors 2712 in this proposal are only responsible for sub-layer 1 activities, i.e., compression at the sample level. The Base Station 2716 in this proposal may send instructions to the sensors, such as compress using multiple access code 16 (this might be a DS code, or OFDM code). The Base Station may send an instruction such as perform 2× sampling with phase theta. In other words, the sensor is a remote pulling away from an A/D path from a conventional base station, like pulling a corner of taffy and creating a thin connecting strand. The taffy strand is a metaphor for the fiber channel from a sensor to the base station. The base station uses very high available computing power to detect the presence of MS signals in the compressed data. The base station in this proposal then responds to the detected MS by instructing the sensor to use sampling and compressing techniques which will capture well the MS signal (timing, frequency, coding particulars which render the compressed data full of the MS signal, even though the sensor is unaware of the utility of the instructions). The MS in this proposal may transmit with a fountain code, at least for call establishment. For very high bandwidth, low power links, the mobile station may transmit real time voice using a fountain code. The packet transmission rate should be with period on the order of 1 to 5 ms. The sensor is primarily not a decision-making device; it is not locally adaptive; sensor control is from the Base Station. The sensors are deployed densely in space, that is, at least one every 100 m×100 m and possibly one every 10 m×10 m. The sensors may or may not support a DL transmission. The DL might be carried from a traditional base station tower with sectorization. The density of such towers would be at least one every 1000 m×1000 m (building deployment) and possibly one every 300 m×300 m (street light deployment).

Figure 30:
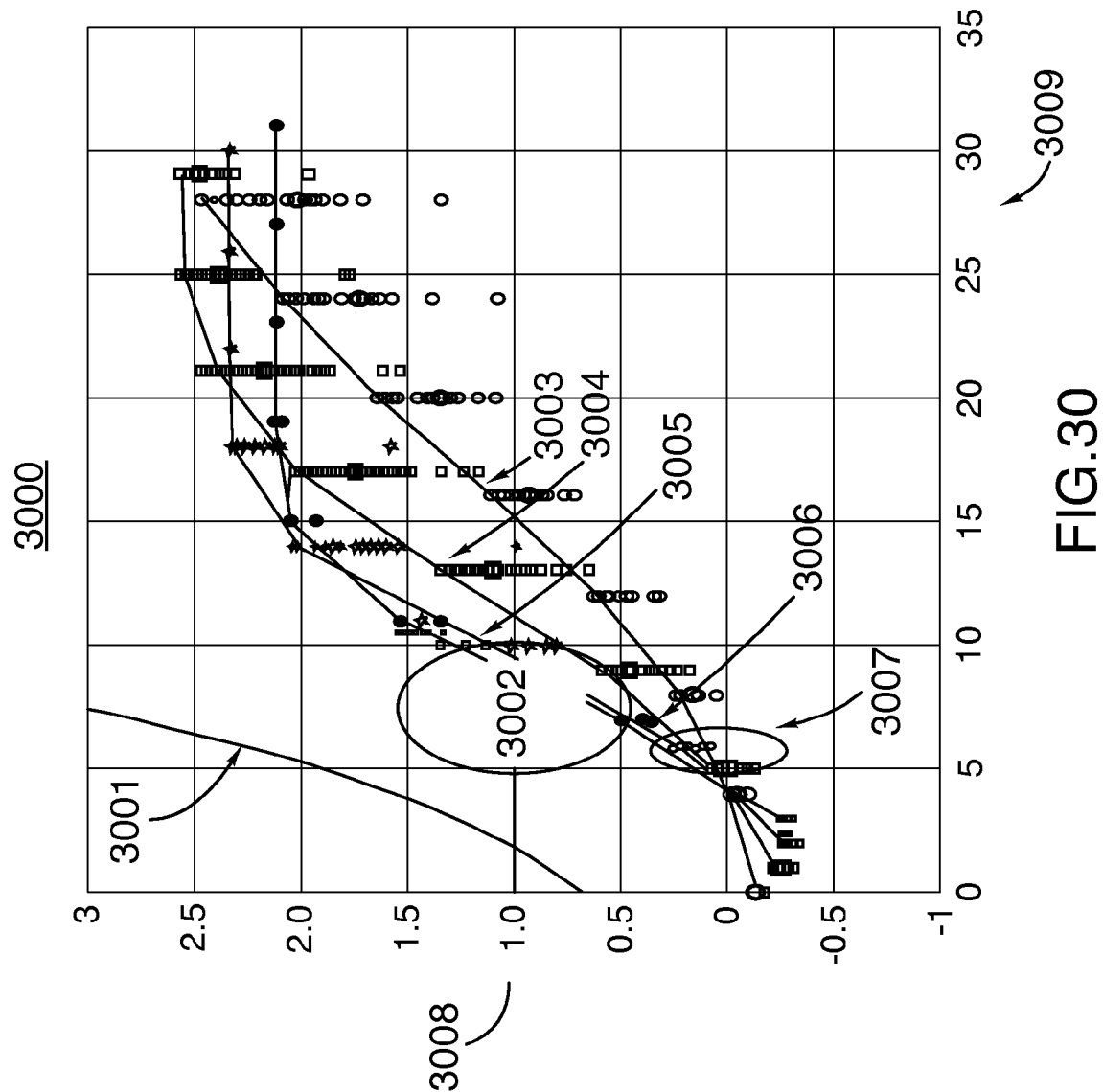
FIG. 30 illustrates a proposed target operating region of a sensor-based wireless communication system using compressive sampling in accordance with various aspects set forth herein.

FIG. 30 illustrates simulated results of the performance of one embodiment of a sensor-based wireless communication system using compressive sampling in accordance with various aspects set forth herein, where the performance of system 3000 was measured using N=8, S=1, and varied values of M. The graph depicts the mutual information between compressed samples and the transmitted signal for various values of M. Based on the simulation results, a proposed target operating region for the compressed sampling architecture is identified. The importance of these observations lies in the fact that conservation of battery life is a key attribute of the proposed compressive sampling architecture. When the value of M is increased, the samplers require more battery power. However, if the value of M is too small, the mutual information between the transmitted and the received signal may fall below an acceptable level. Thus, for acceptable system performance, it is necessary to identify a value of M to provide a stable system. For this simulation, the sparse representation matrix ("$\Psi$") is Walsh in nature and the sensing matrix ("$\Phi$") is random in nature. The choice of representation and sensing matrices used affects the mutual information between the transmitted signal and the compressed samples, depending on the SNR. There is a benefit to orthogonalizing the representation matrix for certain sets of conditions. Using deterministic matrices aids in increasing the mutual information, however, would require more signaling. Thus, there is a tradeoff between signaling and battery power, and, correspondingly, between coordinating the matrices and the value of M. In cases where the signaling is more limited, then a higher value of M should be used. However, if battery life is more critical, then more signaling should be used. Additionally, the mutual information between the transmitted signal and the compressed samples is a function of the additive noise. Hence, deterministic matrices should be used when feasible. However, this once again will increase the signaling requirements of the system. Furthermore, choosing representation and sensing matrices that have some form of length preservation is advantageous.

The graphical illustration in its entirety is referred to by 3000. The logarithmic magnitude of the SNR ratio is shown on abscissa 3009 and is plotted in the range from 0 dB to 35 dB. The mutual information is shown on ordinate 3908 and is plotted in the range from −1.0 to 3. Curves 3003, 3004, 3005 and 3006 represent simulation results for system 3000, where N is eight, S is one, a random iid Gaussian matrix is used for the sensing matrix ("$\Phi$") and a Walsh matrix is used for the sparse representation matrix ("$\Psi$"). Curve 3003 shows a lower bound ("LB") for the mutual information when M=1. Curve 3004 shows a LB for the mutual information when M=2. Curve 3005 shows a LB for the mutual information when M=3. Curve 3006 shows a LB for the mutual information when M=4. 3001 and 3007 represent the upper bound and collection of lower bounds respectively. An example of a target operating region is shown as Region 3002. A max operation has been performed to retain the best Monte Carlo realization of probability of $\Phi$ for each M. As shown by the graph, the worst bound ($\Phi$, $\Psi$) for M=3 is better than the best bound for M=1. The target operating region is chosen as the area indicated by Region 3002 in order to obtain reasonable limits on signaling delay. The behaviour of the simulated system applies for any linear modulation system.

In designing the system, various attributes may be changed or adjusted to increase system performance or maximize efficiency. For instance, all UEs of a system may be assigned the same value of S while all the Remote Samplers may be assigned the same value of M. This is not necessary, as the values of S and M may be different for all of the UEs and remote samplers. Additionally, for low values of SNR, the value of S may be reduced, while for high SNR, the value of S may be increased. These value changes are logical since increasing S at a low SNR rate has very little benefit. However, at a high SNR rate, increasing S makes sense in order to transfer more of the user information. The system would also benefit if the solver is aware of the value of S assigned to the UE. It should also be appreciated by those skilled in the art that maximum value of M would be 2N in the case of asynchronous sampling because for synchronous systems with chip lock, N samples per word are required whereas for a no chip lock system, a minimum of 2N samples must be taken. Another aspect of the current invention is that the controller is able to differentiate between various types of signals in a compressive sampling architecture, such as between WCDMA and GSM. Thus, the controller can issue instructions to maximize the efficiency of signal transfer based on the type of signal it perceives. The system may also be designed so as to not require adjustment of time of flight for a UE. For example, in a GSM system, the system may require a UE to adjust its transmission based on the fact that the signal is time shifted from other signals. However, in the proposed system, these adjustments may be taken into account in designing the system by using a long chip period such that no adjustment on the part of the UE is required.

Figure 31:
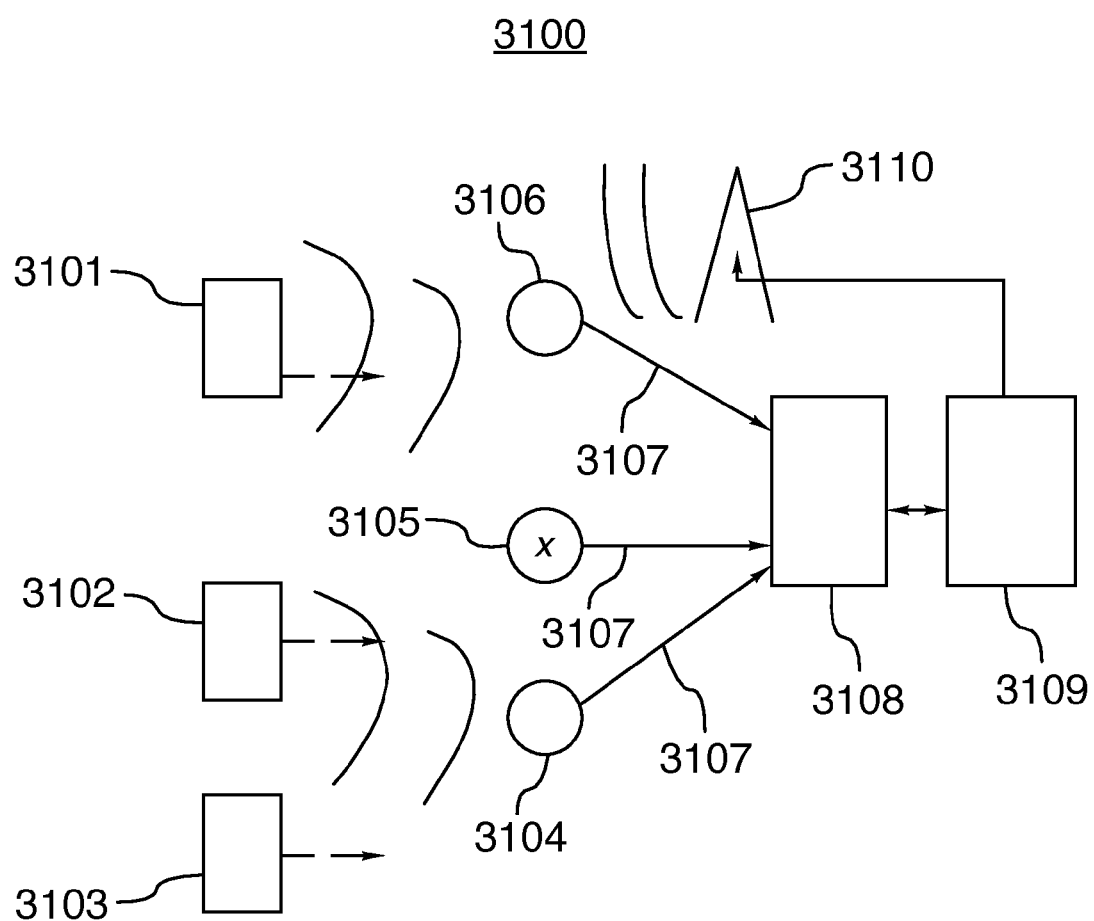
FIG. 31 illustrates another embodiment of a sensor-based wireless communication system using compressive sampling in accordance with various aspects set forth herein.

FIG. 31 is a sketch of one embodiment of the present invention in which several UEs communicate using compressive sampling. FIG. 31 shows UEs 3101, 3102 and 3103 communicating with Remote Samplers 3104, 3105 and 3106. Remote Samplers 3104, 3105 and 3106 are connected via fiber optic cables 3107 to solver 3108. Controller 3109 sends instructions to Remote Samplers 3104, 3105 and 3106 via fiber optic cables 3107, in addition to sending instructions for Solver 3108 itself. Controller 3109 sends instructions to UEs 3101, 3102 and 3103 through Base. Station Tower 3110. One aspect of the current invention is that UEs 3101, 3102 and 3103 are not restricted to any particular remote sampler. Each UE simply transmits and the multiple remote samplers simply report the samples they capture. The downlink between the UEs and the Controller is accomplished via Base Station Tower 3110. The uplink is accomplished through Remote Samplers 3104, 3105 and 3106.

In any given system, if the number of remote samplers is increased, then the value of M may be decreased without appreciably harming system performance. Furthermore, although the current invention seeks to preserve battery life of a remote sampler, if there are remote samplers in the system which have significantly more energy available than other remote samplers, it would be beneficial to increase the value of M at those remote samplers. In this way, the value of M for other remote samplers, which are limited with regards to their energy, may be reduced without affecting system performance.

A further aspect of the proposed architecture is to reduce signal complexity based on known channel coefficients. If there are multiple UEs communicating with multiple remote samplers, channel coefficients may indicate that due to some obstruction, a particular UE communicates almost exclusively, with a single remote sampler. In such a situation, the channel coefficient matrix associated with the multiple UEs may show that the vectors associated with a particular sensed waveform are insignificant in certain areas. For example, if a UE communicates exclusively with one remote sampler, the channel coefficients associated with that UE for the remaining remote samplers may be zero. Thus, the signal associated with this UE may be reconstructed without regard to measurements at any other remote sampler besides the one to which the UE is communicating. By separating out this particular signal, the complexity of the matrix representing the remaining signals is reduced. This in turn will decrease the computational power needed by the solver. Based upon this, the controller may issue instructions to the solver to break the matrices into smaller matrices to reduce computational complexity.

Figure 32:
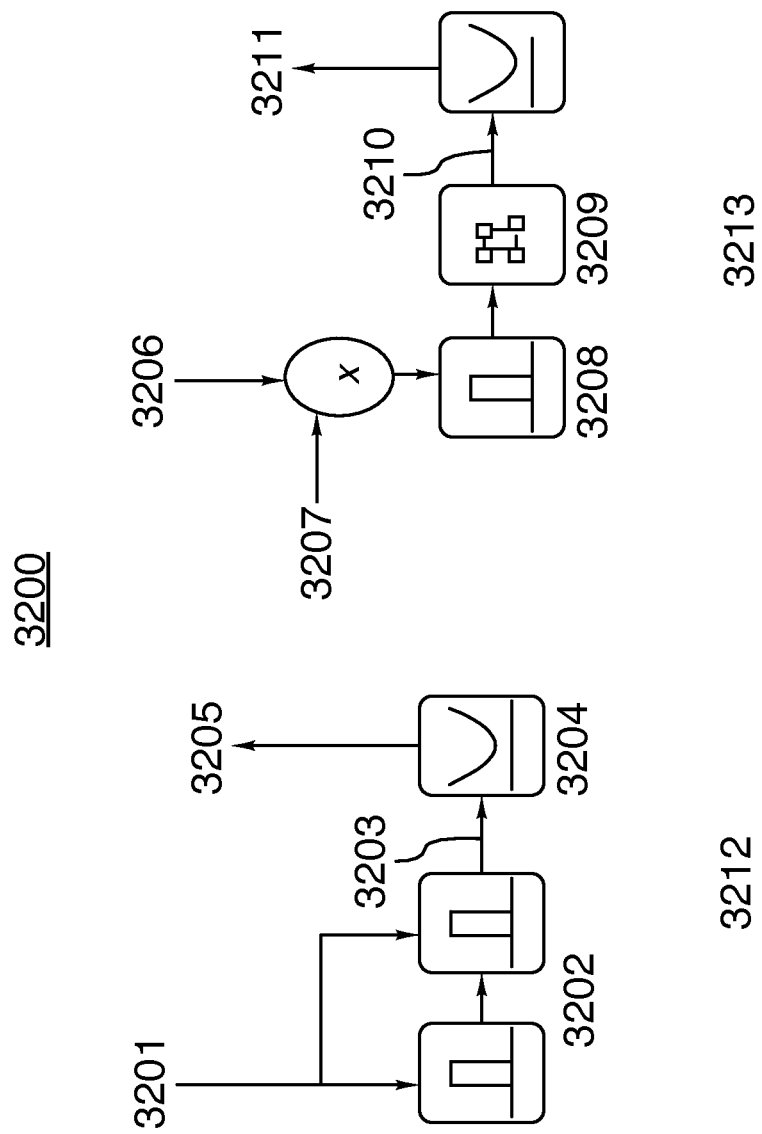
FIG. 32 illustrates embodiments of frequency domain sampling of a sensor-based wireless communication system using compressive sampling in accordance with various aspects set forth herein.

FIG. 32 represents a method of frequency domain sampling using frequency shifting and filter banks. These are forms of analog or continuous time correlations for the proposed system. It should be noted that correlation may be done in discrete time or continuous time. 3212 is a diagram of a sparse signal sampler using a filter bank. 3212 shows recovery of x̂ 3211 using a bank of M narrow band filters 3202. Received signal y 3201 is multiplexed and fed into a signal bank of M narrow band filters 3202. The filter bank performs the matrix operations Φ for the analogue signals. The output is the signal y 3203 which is passed to optimizer 3204 which recovers an estimate of x̂ 3205. Frequency domain sampling using filter banks is characterized by the following points:

1. The number of samples, M, is limited by the number of narrow band filters in the device.
2. The hardware requirement increases with M, as M narrow band filters are needed.
3. Memory storage of y may not be required.
4. Non-stationary or time varying signal processing is possible.

3213 is a diagram of a sparse signal sampler using frequency shifting. 3213 presents a method for recovering the signal x̂ directly from the time domain signal y for a temporally stationary signal. The voltage controlled oscillator 3207 and narrow band filter 3208 perform the operations of Φ in the analogue domain. Signal y 3206 is frequency shifted by the VCO 3202 to the pass band of the narrow band filter 3208. It should be noted that a low pass filter may be used instead of a narrow band filter with differing results. The output amplitude and phase is stored in memory 3209 until all M frequencies are sampled. y 3209 is then passed to the optimizer 3210 which generates the estimate of x̂ 3211. Frequency domain sampling using frequency shifting is characterized by the following points:

1. The number of samples M can be dynamically changed by controlling the VCO.
2. Memory storage of initially found y values is required to recover the entire vector y.
3. The signal must be stationary or slowly time varying.

Figure 33:
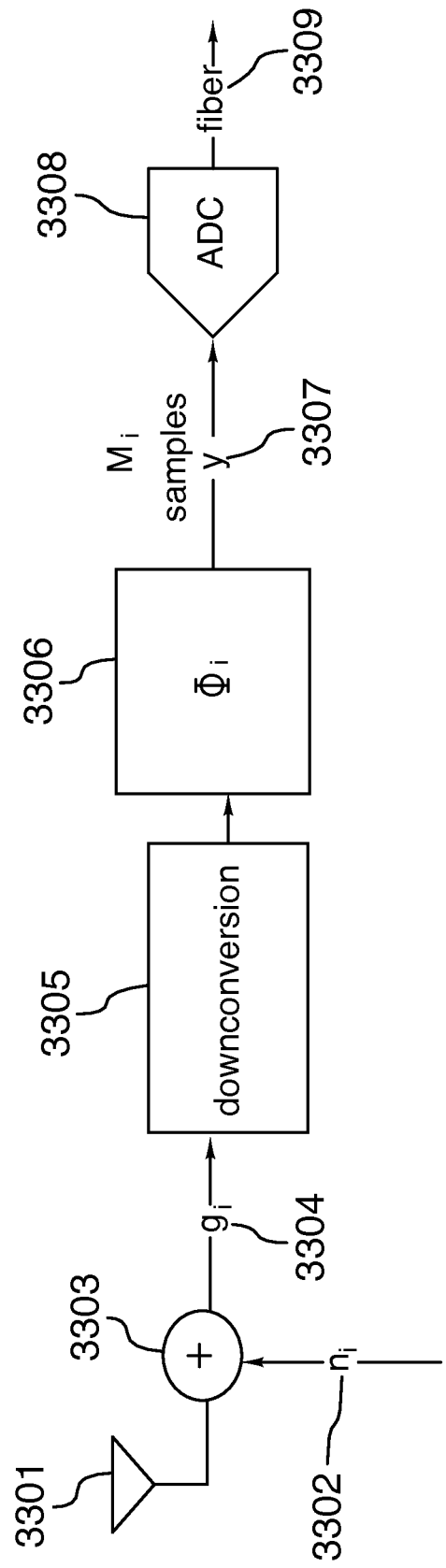
FIG. 33 is a block diagram of a remote sampler of a sensor-based wireless communication system using compressive sampling in accordance with various aspects set forth herein.

FIG. 33 is a block diagram of a remote sampler utilizing continuous time sampling concepts described herein. Antenna 3301 receives a sparse signal and passes the signal to Downconverter 3305. Due to antenna characteristics, noise 3302 will be part of Received signal 3304, and its addition is indicated by adder 3303 (although this is not an actual structure, the addition of noise 3302 is indicated by an adder to show the nature of Received signal 3304). The signal is downconverted at 3305. At 3306, the signal is correlated using a configuration received by the remote sampler from a remote central processor (not shown). Samples 3307 are then sent to Analog-to-Digital converter 3308. The converted samples are then sent along fiber optic 3309 to the solver (not shown).

An example of a low cost radio is given in Kaukovuori [KJR+06], another is given in Enz [ESY05].

Using fiber to connect a remote antenna to a base station was proposed and tested by Chu [CG91].

Current Intel processors like the QX9775 execute at over 1 GHz clock speed, at over 1 GHz bus speed and with over 1 MB cache. According to Moore's law, transistor densities will reach 8× their current value by 2015. Based on the typical clock-rate-times gate-count reasoning, we can expect roughly 10× the processing power will be available in single processors in 2015. Thus, in 1 ms, 10 million CISC instructions can be executed. One microprocessor will direct the physical layer adaptation of 10 sensors in real time. http://compare.intel.com/pcc/

The limits on the MIMO multiplexing/diversity tradeoff were derived by Zheng and Tse, 2L. Zheng and D. Tse, "Diversity and Multiplexing: A Fundamental Tradeoff in Multiple-Antenna Channels, IEEE Transactions on Info. Theory, May 2003, pp. 1073-1096".

The present-day conception of dirty paper coding is discussed in, for example, Ng, "C. Ng, and A. Goldsmith, Transmitter Cooperation in Ad-Hoc Wireless Networks: Does Dirty-Paper Coding Beat Relaying?, IEEE ITW 2004, pp. 277-282."

Teaching selfish users to cooperate is discussed, for example, in Hales, "D. Hales, From Selfish Nodes to Cooperative Networks Emergent Link-based incentives in Peer-to-Peer Networks, IEEE Peer-to-Peer Computing, 2004".

The concept of multiple nodes receiving cleverly-redundant transmission is discussed in Kokalj-Filipovic, "A. Kokalj-Filipovic, P. Spasojevic, R. Yates and E. Soljanin, Decentralized Fountain Codes for Minimum-Delay Data Collection, CISS 2008, pp. 545-550".

From these tables and figures, we conclude that, yes, it has been possible to design a Presence signal and detect at the remote sampler while satisfying qualitative design rules. In particular, two combinations Ψ and Φ have been shown to make detection of the Presence signal possible with very little signal processing, and no decision-making, at the remote sampler. Recall, the Presence signal is a sum of columns from the Ψ matrix. The probability of detecting the Presence signal with S=1 or S=2 nonzero entries in x is sufficiently high for SNRs in the range of 0 to 10 dB. This is achieved under the constraint that the remote sampler transmits to the base station fewer samples than would be required for conventional conversion of the observed signal when the conventional assumption has been made that the signal fully exercises an N-dimensional basis. This gain has been brought about by purposefully designing the transmitted signal to be sparse, the remote sampler to be simple, and the base station to be intelligent and equipped with a separately designed (non-co-located with the remote samplers) downlink connection to mobile stations.

Appendices A, B, C, D, E, F, and G, which are attached hereto and incorporated herein by reference, describe technical considerations with regard to designing a compressive sampling system. In particular, mutual information in remote samplers is discussed in great detail. Additionally, the problem of noise in sparse signal sampling is addressed. Appendices C and D present computer programs designed to address these issues. Appendix G is the provisional application filed Apr. 15, 2009.

REFERENCES

[AAN08] K. Adachi, F. Adachi, and M. Nakagawa. Cellular mimo channel capacities of mc-cdma and ofdm. IEEE, 2008.

[BB99] S. Benedetto and E. Biglieri. Principles of Digital Trans-mission with Wireless Applications. Kluwer, N.Y., 1999.

[Cas04] J. P. Castro. All IP in 3G CDMA Networks. John Wiley & Sons, Ltd., Chichester, England, 2004.

[CG91] T. S. Chu and M. J. Gans. Fiber optic microcellular radio. IEEE, pages 339-344, 1991.

[CR02] S. Cotter and B. Rao. Sparse channel estimation via matching pursuit with application to equalization. IEEE Trans. on Communications, pages 374-377, March 2002.

[CW08] E. Candes and M. Wakin. An introduction to compressive sampling. IEEE Signal Proc. Mag., pages 21-30, March 2008.

[ESY05] C. Enz, N. Scolari, and U. Yodprasit. Ultra low-power radio design for wireless sensor networks. IEEE Intl. Workshop on RF Integration Tech., pages 1-17, December 2005.

[JR08] Y. Jin and B. Rao. Performance limits of matching pursuit algorithms. IEEE Intl. Sym. Info. Theory, pages 2444-2448, July 2008.

[KJR+06] J. Kaukovuori, J. A. M. Jarvinen, J. Ryynanen, J. Jussila, K. Kivekas, and K. A. I. Halonen. Direct-conversion re-ceiver for ubiquitous communications. IEEE, pages 103-106, 2006.

[LKL+08] M. Lee, G. Ko, S. Lim, M. Song, and C. Kim. Dynamic spectrum access techniques: Tpc-resilient initial access in open spectrum bands. Intl. Conf. on Cognitive Radio Oriented Wireless Networks and Comm., pages 1-6, May 2008.

[LY08] D. Luenberger and Y. Ye. Linear and Nonlinear Programming. Springer, third edition, 2008.

[Pro83] John G. Proakis. Digital Communications. McGraw-Hill, New York, N.Y., first edition, 1983.

[TGS05] J. A. Tropp, A. C. Gilbert, and M. J. Strauss. Simultaneous sparse approximation via greedy pursuit. IEEE ICASSP, pages V721-V724, 2005.

In various embodiments disclosed herein, multiple user equipments (UEs) communicate over the uplink (UL) with the central brain (CB) via a collection of remote samplers (RSs). The downlink (DL) is provided by a base station tower.

The UE transmissions appear at the receiving antenna of any given RS as a sum of the respective individual waveforms. The sum present on the RS antenna is denoted "g." The RSs use a sampling technique that captures M samples at each RS (M may be different at different RSs).

In a conventional system, for example, N CDMA chips may be sent per transmit waveform. If the receiver has chip-lock, then N samples can be retained by the CDMA receiver before despreading. In a second example, if a narrowband transmitter, such as GSM is sending symbols using 8-PSK or GMSK modulation and a GSM receiver has accurate symbol timing, then 1 sample per symbol is required to identify the transmitted symbol. In the Remote Sampler System, given that a UE has transmitted N symbols, the number of samples passed from a given RS to the CB is M, where M is less than N when the UE is expected to transmit an S-sparse combination of the columns from the $\psi$ matrix in use at the UE, where S is much less than N. The M-vector containing these samples is denoted y.

Several front-end configurations are used in radio design, and provide a guide for design of the RS front end. Increasing the amount of supply current available in the front end can increase the dynamic range of the particular front end design in use. The components of the analog front end are the LNA (low noise amplifier), PLL (phase locked loop), mixer, attenuator, IF filters and ADC (Analog to Digital Converter). The influence of circuit power on dynamic range is made use of in this disclosure to improve signal detection.

Generally, as the PLL is allowed to consume more current the power in the phase noise component of the generated signal declines. This causes the signal to noise ratio (SNR) of the received signal to reach a maximum limit. By increasing the amount of current supplied to the PLL, the maximum achievable SNR can be increased.

There may be some instances in which two UE signals are present of different received energy levels. Since the analog front end has finite dynamic range (DR), the weaker signal may be present in the remote sampler after A to D conversion (ADC) at a level only comparable to the receiver circuit noise level. Suppose that the weaker signal comes from UE2 and the sparse signal from UE2 is denoted x2. The CB may, have a poor success rate in detecting x2. To alleviate this, the dynamic range of the ADC is increased based on a command from the CB. Thus, the weaker signal is now not overwhelmed by the receiver circuit noise. When y is passed to the CB, the CB will have better success detecting x2.

The CB can adjust M, $\Phi$, DR, sample timing, carrier offset and any other circuit parameter of the RS by a command sent from the CB to the RS along the connecting fiber. By sometimes increasing M and DR to accurately view the antenna signal g, the CB can determine the steady state values for M and DR (and other parameters). The CB then instructs the RS on what value to use for M and DR (and other parameters). If the CB calculates that detection of the received signal is limited by additive thermal noise, the CB may send a command to increase current drain in a way which reduces the NF.

An object of the disclosed system is to minimize current drain in a given RS when UEs in the area are not sending data. UE access to the system is broken in to two phases: i) Presence Signaling and ii) Payload Transmission. During the Presence Signaling Phase, the UE will send sparse signals. RSs which are not supporting one or more UEs in Payload Transmission mode, will be sampling with M<N. Many different receiver configurations are possible, and some configurations are more optimal for low-duty cycle, narrow-bandwidth operation while others are better for high-bandwidth, high dynamic range operation. In the present disclosure, the RS front end circuitry may configure some components (LNA, mixer, PLL, ADC) for one regime or the other as commanded by the CB according the UL traffic load that the CB estimates is offered in the vicinity of a given RS.

Because RS current drain will be tailored by the CB to suit UE demand for transmission of UL data, the status of RS battery level, for those RSs not powered by 110 V line power, will vary from one RS to the next because UE demand for service is not geographically uniform. The CB can maintain estimates of the expected battery lifetime of each RS and plan to replenish the batteries of those RSs in need. The CB may adjust current drain in real time operation to gather more samples, or samples corresponding to a higher DR or lower NF, from a sampler, "RS_high", with more battery power, if an RS, "RS_low", which is closest to a cluster of active UEs has low battery power. The CB can use the resulting samples from both RS_high and RS_low to determine the transmitted data.

Having shown and described exemplary embodiments, further adaptations of the methods, devices and systems described herein may be accomplished by appropriate modifications by one of ordinary skill in the art without departing from the scope of the present disclosure. Several of such potential modifications have been mentioned, and others will be apparent to those skilled in the art. For instance, the exemplars, embodiments, and the like discussed above are illustrative and are not necessarily required. Accordingly, the scope of the present disclosure should be considered in terms of the following claims and is understood not to be limited to the details of structure, operation and function shown and described in the specification and drawings.

As set forth above, the described disclosure includes the aspects set forth below.

What is claimed is:

1. A method of processing data in a communication system, comprising:
   using a sampler to receive, over a wireless channel, a sum signal comprising first and second user equipment signal transmissions based on an S-sparse combination of a set of vectors; and
   adjusting a dynamic range of said sampler to optimize detection of said first user equipment signal transmission in response to receiving an instruction from a remote central processor.

2. The method of claim 1, further comprising:
   adjusting the dynamic range of said sampler to optimize detection of both said first and second user equipment signal transmissions.

3. The method of claim 1, wherein the dynamic range of said sampler is adjusted by adjusting a current provided to components in an analog front-end of said sampler.

4. The method of claim 3, wherein the components in the analog front-end of said sampler comprise a low noise amplifier (LNA), a phase locked loop (PLL), a mixer, an attenuator, and an intermediate frequency (IF) filter.

5. A method of processing data in a communication system, comprising:
   using a sampler to receive, over a wireless channel, a sum signal transmission comprising first and second user equipment signal transmissions based on an S-sparse combination of a set of vectors; and
   adjusting a front-end noise figure of said sampler to optimize detection of said first user equipment signal transmission by adjusting a current provided to predetermined components in an analog front-end of said sampler.

6. The method of claim 5, further comprising:
   adjusting the front-end noise figure of said sampler to optimize detection of both said first and second user equipment signal transmissions.

7. The method of claim 5, wherein the current provided to said predetermined components of said analog front-end is adjusted in response to receiving an instruction from a remote central processor.

8. A sampler, comprising:
   a first receiver operable to receive, over a wireless random access channel, a first user equipment signal transmission; and
   a second receiver operable to receive, over a data payload channel, a second user equipment signal transmission,
   wherein said first user equipment signal transmission is based on an S-sparse combination of a set of vectors.

9. The method of claim 5, wherein the components in the analog front-end of said sampler comprise a low noise amplifier (LNA), a phase locked loop (PLL), a mixer, an attenuator, and an intermediate frequency (IF) filter.

10. The sampler of claim 8, wherein said second user equipment signal is based on an S-sparse combination of a set of vectors.

11. A method of processing data in a communication system, comprising:
    using a receiver to receive, over a wireless channel, a user equipment signal transmission based on an S-sparse combination of a set of vectors; and
    adjusting power consumption of said receiver, wherein said receiver has a first power consumption level when said user equipment signal transmission comprises a presence signal transmission and a second power consumption level when said user equipment signal transmission comprises a payload signal transmission.

12. The method of claim 11, wherein said first power consumption level is lower than said second power consumption level.

13. The method of claim 11, wherein the power consumption level of said receiver is adjusted by adjusting a current provided to components in an analog front-end of said receiver.

14. The method of claim 11, wherein said power consumption of said receiver is adjusted in response to receiving an instruction from a remote central processor.

15. A method for processing data in a communication system, comprising:
    using a remote central processor to monitor power consumption of a plurality of samplers;
    using said remote central processor to monitor operation of a plurality of user equipments and to correlate locations of individual user equipments with locations of individual samplers; and
    using said remote central processor to optimize power consumption of said plurality of samplers by associating predetermined individual samplers with predetermined individual user equipments.

16. The method of claim 15, wherein a user equipment in said plurality of user equipment is geographically closer to a first sampler than a second sampler and wherein said user equipment is associated with said second sampler to optimize power consumption of said plurality of samplers.

17. The method of claim 16, wherein the association of said individual user equipment with said second sampler is in response to an instruction received by said second sampler from a remote central processor.

18. The method of claim 15, wherein individual samplers in said plurality of samplers each comprise a battery and wherein said remote central processor is operable to generate data corresponding to the projected remaining battery life for the battery in each of said individual samplers.

* * * * *